(12) United States Patent
Schober et al.

(10) Patent No.: US 10,439,624 B2
(45) Date of Patent: Oct. 8, 2019

(54) PHASE FREQUENCY DETECTOR AND ACCURATE LOW JITTER HIGH FREQUENCY WIDE-BAND PHASE LOCK LOOP

(71) Applicant: Circuit Seed, LLC, Newport Beach, CA (US)

(72) Inventors: Susan Marya Schober, Corona Del Mar, CA (US); Robert C. Schober, Huntington Beach, CA (US); Herbert M Shapiro, Laguna Niguel, CA (US)

(73) Assignee: Circuit Seed, LLC, Newport Beach, CA (US)

( * ) Notice: Subject to any disclaimer, the term of this patent is extended or adjusted under 35 U.S.C. 154(b) by 0 days.

(21) Appl. No.: 15/545,200

(22) PCT Filed: Jan. 22, 2016

(86) PCT No.: PCT/US2016/014639
§ 371 (c)(1),
(2) Date: Jul. 20, 2017

(87) PCT Pub. No.: WO2016/118936
PCT Pub. Date: Jul. 28, 2016

(65) Prior Publication Data
US 2017/0373697 A1    Dec. 28, 2017

Related U.S. Application Data

(60) Provisional application No. 62/107,409, filed on Jan. 24, 2015.

(51) Int. Cl.
*H03L 7/099* (2006.01)
*H03L 7/24* (2006.01)
(Continued)

(52) U.S. Cl.
CPC ............ *H03L 7/0995* (2013.01); *H03B 5/12* (2013.01); *H03K 3/0315* (2013.01);
(Continued)

(58) Field of Classification Search
CPC ....... H03L 7/0995; H03L 7/04; H03L 7/0891; H03L 7/091; H03L 7/24; H03L 2207/06;
(Continued)

(56) References Cited

U.S. PATENT DOCUMENTS 3,986,134 A    10/1976  Yokoyama
4,100,502 A     7/1978  Yamashiro
(Continued)

FOREIGN PATENT DOCUMENTS

EP           1079294      9/2004
KR         1020120043522   5/2012
WO         WO2007081634   7/2007

OTHER PUBLICATIONS

PCT Search Report and Written Opinion dated Oct. 20, 2016 for PCT Application No. PCT/US216/044792, 13 pages.
(Continued)

*Primary Examiner* — Daniel C Puentes
(74) *Attorney, Agent, or Firm* — Lee & Hayes, P.C.

(57) ABSTRACT

A novel phase locked loop design utilizing novel phase-frequency detector, charge pump, loop filter and voltage controlled oscillator is disclosed. The phase-frequency detector includes a dual reset D-flip flop for use in multi-GHz phase locked loops. Traditional dead zone issues associated with phase frequency detector are improved/addressed by use with a charge transfer-based PLL charge pump.

12 Claims, 39 Drawing Sheets

(51) Int. Cl.
  *H03K 3/03* (2006.01)
  *H03B 5/12* (2006.01)
  *H03K 3/354* (2006.01)
  *H03L 7/04* (2006.01)
  *H03L 7/089* (2006.01)
  *H03L 7/091* (2006.01)

(52) U.S. Cl.
  CPC ............ *H03K 3/0322* (2013.01); *H03K 3/354* (2013.01); *H03L 7/04* (2013.01); *H03L 7/0891* (2013.01); *H03L 7/091* (2013.01); *H03L 7/24* (2013.01); *H03L 2207/06* (2013.01); *H03L 2207/10* (2013.01)

(58) Field of Classification Search
  CPC .... H03L 2207/10; H03B 5/12; H03K 3/0315; H03K 3/354
  See application file for complete search history.

(56) References Cited

U.S. PATENT DOCUMENTS

| | | | |
|---|---|---|---|
| 4,309,665 | A | 1/1982 | Yamashiro |
| 4,607,274 | A | 8/1986 | Yoshitake |
| 4,646,152 | A | 2/1987 | Eichelberger et al. |
| 4,910,709 | A | 3/1990 | Dhong et al. |
| 4,927,779 | A | 5/1990 | Dhong et al. |
| 5,349,311 | A | 9/1994 | Mentzer |
| 5,463,353 | A | 10/1995 | Countryman et al. |
| 5,528,056 | A | 6/1996 | Shimada et al. |
| 6,057,673 | A | 5/2000 | Okayama |
| 6,081,218 | A | 6/2000 | Ju et al. |
| 6,104,253 | A | 8/2000 | Hall et al. |
| 6,784,824 | B1 | 8/2004 | Quinn |
| 6,933,750 | B2 | 8/2005 | Takahashi et al. |
| 7,057,302 | B2 | 6/2006 | Matsuzawa et al. |
| 7,683,725 | B2 | 3/2010 | Kim et al. |
| 2002/0016030 | A1 | 2/2002 | Misewich et al. |
| 2003/0210097 | A1 | 11/2003 | Wilson et al. |
| 2003/0214361 | A1 | 11/2003 | Nishikido |
| 2004/0102170 | A1 | 5/2004 | Jensen et al. |
| 2005/0168242 | A1 | 8/2005 | Won |
| 2006/0001413 | A1 | 1/2006 | Marinca |
| 2006/0139195 | A1 | 6/2006 | Casper et al. |
| 2007/0098041 | A1 | 5/2007 | Seo |
| 2008/0258959 | A1 | 10/2008 | Trifonov et al. |
| 2009/0160487 | A1 | 6/2009 | Hu et al. |
| 2009/0311837 | A1 | 12/2009 | Kapoor |
| 2010/0176889 | A1 | 7/2010 | Nix et al. |
| 2010/0253298 | A1 | 10/2010 | Nonis et al. |
| 2011/0309888 | A1 | 12/2011 | Bulzacchelli et al. |
| 2012/0098579 | A1* | 4/2012 | Schober ................ H03L 7/0895 327/157 |
| 2013/0027107 | A1 | 1/2013 | Nohara |
| 2013/0177175 | A1 | 7/2013 | Ting |
| 2013/0207725 | A1 | 8/2013 | Afshari et al. |
| 2013/0287071 | A1 | 10/2013 | Chen et al. |
| 2014/0062550 | A1 | 3/2014 | Lee et al. |
| 2014/0132435 | A1 | 5/2014 | Dempsey |
| 2015/0030102 | A1 | 1/2015 | Hormis et al. |
| 2015/0070091 | A1 | 3/2015 | Schober et al. |
| 2015/0180455 | A1 | 6/2015 | Beccue |
| 2015/0213873 | A1* | 7/2015 | Joo ........................ H03L 7/087 365/154 |
| 2017/0040941 | A1 | 2/2017 | Chatwin |
| 2018/0019757 | A1 | 1/2018 | Schober et al. |
| 2018/0219514 | A1 | 8/2018 | Schober et al. |

OTHER PUBLICATIONS

PCT Search Report and Written Opinion dated Nov. 10, 2016 for PCT Application No. PCT/US2016/044770, 15 pages.
PCT Search Report and Written Opinion dated Nov. 8, 2016 for PCT Application No. PCT/US2016/044787, 16 pages.
PCT Search Report and Written Opinion dated Apr. 3, 2017 for PCT Application No. PCT/US16/67529, 14 pages.
PCT Search Report and Written Opinion dated May 13, 2016 for PCT Application No. PCT/US16/14639, 11 pages.
PCT Search Report and Written Opinion dated Oct. 23, 2015 for PCT Applicatoin No. PCT/US2015/42696, 12 pages.
Office Action for U.S. Appl. No. 15/545,893, dated Sep. 19, 2018, Susan Marya Schober, "Passive Phased Injection Locked Circuit", 10 pages.
PCT Search Report and Written Opinion dated Aug. 21, 2015 for PCT Application No. PCT 2015 32303, 7 pages.
Razavi, B., Design of Analog CMOS Integrated Circuits, 2001, McGraw-Hill Higher Education, New York, NY, 400 pages.
Razavi, B., Fundamentals of Microelectronics, Wiley, 2006, 300 pages.

* cited by examiner

Symmetric 4x3 RO
Layout Plan Example

Traditional Method Logic

C²L N-Channel Logic

$$Y(P)=(An+Cn)*(A+D)*(B+Dn)$$

C²L P-Channel Logic

C²L Logic a) Traditional Method Schematic b) C²L Method Schematic a) Traditional Method String Diagram b) C²L Method String Diagram b) C²L Method Stick Diagram a) Traditional Method Stick Diagram

US 10,439,624 B2

PHASE FREQUENCY DETECTOR AND ACCURATE LOW JITTER HIGH FREQUENCY WIDE-BAND PHASE LOCK LOOP

CROSS-REFERENCE TO RELATED APPLICATIONS

The present application is a 35 U.S.C. § 371 National Stage Entry of, and claims priority to International Application No. PCT/US2016/014639, filed Jan. 22, 2016, entitled "PHASE FREQUENCY DETECTOR AND ACCURATE LOW JITTER HIGH FREQUENCY WIDE-BAND PHASE LOCK LOOP," which claims priority to U.S. Provisional Application No. 62/107,409, entitled "A DUAL RESET FLIP-FLOP PHASE-FREQUENCY DETECTOR FOR PHASE LOCKED LOOPS," filed on Jan. 24, 2015. The entire contents of each of the above applications are incorporated herein by reference.

STATEMENT REGARDING FEDERALLY SPONSORED RESEARCH OR DEVELOPMENT

N/A

NAMES OF THE PARTIES TO A JOINT RESEARCH AGREEMENT

N/A

REFERENCE TO A "SEQUENCE LISTING"

N/A

BACKGROUND OF THE INVENTION

Field of the Invention

The present invention generally relates to a phase locked loop. More specifically, it relates to a phase locked loop utilizing a phase-frequency detector, loop filter and a voltage controlled oscillator.

The present invention further relates to a phase-frequency detector. More specifically, it further relates to a phase-frequency detector utilizing no-added delay dual reset D flip-flops.

The present invention yet further relates to voltage controlled oscillator. More specifically, it relates to a voltage controlled oscillator that utilizes two or more identical inverter-based staged ring oscillators with phase injection-locking by capacitive coupling.

The present invention yet further relates to a loop filter. More specifically, capacitance of the loop filter is adapted to transfer charge thereto and therefrom to effectively eliminate needs for current mirrors in a phase-locked loop.

DESCRIPTION OF RELATED ART

State-of-the-art phase locked loop (PLL) charge pumps such as the single-ended examples shown in FIGS. 3b and 3c, employ bulky current mirrors (i.e. $I_N$ and $I_P$) and relatively large transistor switches (i.e. 51, 52, 53 and 54) to flow substantial amounts of current linearly to and from a loop filter to alter $V_C$. Although this is effective, these charge pumps (CPs) of FIGS. 3b and 3c have significant design concerns including: 1) relatively large active area, 2) wasted static power due to current mirrors and biasing always working even during PLL phase lock, 3) the large transistor switches take a relatively long time to open and close, hence there is an unwanted control loop delay before the VCO frequency is altered, 4) extra matching circuitry for the CP Up/Down output signal transitions is necessary for equal charge up and charge down, 5) analog process extensions (i.e. current sources, large transistors, amplifiers) are sensitive to process variation, 6) $V_C$ output errors easily occur due to undesirable leakage current slipping through the large transistor switches, thus affecting the VCO frequency while in phase lock, 7) limited headroom due to stacked transistors restricts use at lower supply voltages, and 8) scalability to deep sub-µm technologies is severely restricted due to the large current mirror and switch transistors required to flow considerable currents and typically requires re-design when moving to a new process node.

One of the most pertinent challenges in state-of-the-art phase frequency detector (PFD) designs is that the fast propagation delay, $\tau_p$, of the digital flip-flops does not match the slower analog switching times, $\tau_s$, in the state-of-the-art CPs in a PLL. To counteract this "dead zone" issue, traditional approaches point to simply adding carefully timed supplementary delay circuitry to the PFD reset path in order to allow for the Up/Down error signals to be extended, permitting the necessary extra time for the CP to react so that it may have the desired effect on the control voltage, $V_C$. The concern that results with this widely-used method is that there is an undesirable added delay, $\tau_d$, introduced into the PLL control loop, which has the ability to contribute significant noise, seen as jitter, in the PLL. The increased overall delay in the feedback loop is a source of instability in the PLL. This unsteadiness is a direct result of the PFD output signals causing $V_C$ dithering via the CP. The outcome is that the VCO's frequency, $f_{VCO}$, changes in either direction as the PLL continually attempts to acquire phase-frequency lock, but fails to do so, therefore undesirably increasing the phase noise of the VCO. Ideally in a PLL, the PFD and CP would have similar switching times allowing for quick and symmetrical corrections of errors in the control loop in real time.

Furthermore, state-of-the-art PFD designs, such as is shown in FIG. 11b, typically are composed of a pair of DFFs with their D=1 and Resets generated by a logic AND gate of both Q outputs, followed by carefully timed added delay circuitry (e.g. buffers) to compensate for the slow switching time, $\tau_{s_{sub}}$, of current-based CPs, shown in FIG. 12b. This allows the critical Reset-to-Q propagation delay, $\tau_p$, of the DFFs to be slowed down by $\tau_d$ to match the CP switching time. While there are a variety of circuits and latches that could be used in a PFD, the use of edge-triggered DFFs extends the phase detection range to span more than 1 period. This is essential for frequency lock over widely different frequencies. The main challenge in a state-of-the-art PFD design is in adding the correct amount of delay compensation to accommodate a traditional CP resulting in minimal dead zone.

To construct a flip-flop for a PFD, a variety of logic gates may be used. They are essentially a combination of (one, the other, or both) tri-state inverters or transmission-gate selector gates. The Master Latch selects either the D input or its inverted output and the Slave Latch selects either the Master Latch output or its inverted output, where each are selected with opposite phases of the clock. An example of a typical state-of-the-art D-flip flops (DFF) used in PFD designs is shown in FIG. 13. This particular DFF has a positive-edge triggered true and complement clock input, Clk, and a single asynchronous reset, R. The output of the DFF is Q and its complement is $\overline{Q}$.

The propagation delay of this type of DFF is based on the most critical path, in this case Reset-to-Q as opposed to Clk-to-Q, unlike normal DFF design priorities which are optimized for minimal clock delays. This reset delay, for the aforementioned reasons, is generally slowed down to work with a typical CP in the PLL. Beyond the negligible leakage current, the power of a DFF, and subsequently a PFD of this type, is wholly dynamic due to the switching current incurred in each DFF clock cycle. The PFD DFFs' contribution to power in a PLL is by and large the lowest overall. Furthermore, the area of this digital circuit is regularly the smallest of all the blocks in the PLL.

BRIEF SUMMARY OF THE INVENTION

The present invention generally relates to a phase locked loop. More specifically, it relates to a phase locked loop utilizing a phase-frequency detector, loop filter and a voltage controlled oscillator.

The present invention further relates to a phase-frequency detector. More specifically, it further relates to a phase-frequency detector utilizing no-added delay dual reset D flip-flops.

The present invention yet further relates to voltage controlled oscillator. More specifically, it relates to a voltage controlled oscillator that utilizes two or more identical inverter-based staged ring oscillators with phase injection-locking by capacitive coupling.

The present invention yet further relates to a loop filter. More specifically, capacitance of the loop filter is adapted to transfer charge thereto and therefrom to effectively eliminate needs for current mirrors in a phase-locked loop.

DETAILED DESCRIPTION OF THE INVENTION

The phase-locked loop (PLL) is a ubiquitous control system used for precise frequency and phase generation, clock synchronization, and signal recovery. PLLs are perhaps the most important and ubiquitous circuit block in modern electronics as they can be found in every computer processer, transceiver, and clocked system, including laboratory test equipment. Therefore, PLL cost, area, power, and performance—and ultimately scalability—is continuously of main concern for integrated circuit (IC) designers and manufacturers which will employ this circuit-based system in their next-generation devices.

For multi-GHz wireline and wireless IC applications there are two primary PLL design approaches: 1) analog and 2) digital. Generally, analog PLLs, such as the charge pump PLL block diagram shown in FIG. 1, have a larger IC footprint and are typically more power hungry as compared to their digital phase locked-loop counterparts. On the other hand, digital PLLs generally possess more complicated circuitry, are limited to frequencies significantly below 10 GHz, and have a tendency to suffer from digital noise due to quantizing issues. Since PLLs in general are extremely useful in analog/radio frequency (RF), mixed-signal, and digital System on a Chip (SoC) applications for both wireless and wireline systems, much effort from both the industry and research sectors has been focused on finding new scalable low noise, high performance alternatives in Complementary metal-oxide-semiconductor (CMOS).

In recent years, analog PLLs have incrementally adopted digital circuit elements to their constituent blocks (e.g. dividers, phase detectors, and oscillators) which perform analog functions with less area and power. To date, a digital-like, portable circuit component for every block in the analog PLL has been created except for the charge pump circuitry; this is due to the analog process extensions (e.g. current mirrors and switches which require large transistors and voltage swings) that have been necessary to design this block using state-of-the-art methods. This has been an important bottleneck in making analog PLLs scalable to and between ultra-deep sub-μm CMOS technologies. The first section of this work is dedicated to applying the charge-mode approach, specifically charge-transfer, to create a simple, yet novel architecture for the CP which is ultra-low power and scalable to the newest CMOS process nodes.

Charge Pump based PLL with Charge Transfer

Figure 1:
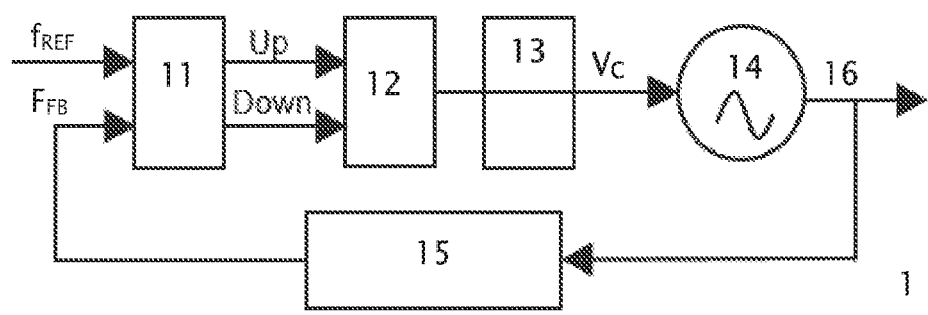
FIG. 1 shows a block diagram of a prior art charge pump phase locked loop.

Referring to FIG. 1, the main purpose of a charge pump based PLL 1 is to control the frequency 16 of the voltage controlled oscillator 14. The inputs to the charge pump (CP) 12 are Up/Down error signals generated by a digital phase-frequency detector 11. The output of the CP 12 is a control voltage, $V_C$, stored as charge on the effective capacitance of the loop filter (LF) 13, CL. Raising or lowering VC will result in an increase or decrease of the VCO frequency of operation, $f_{VCO}$ 16.

A typical closed PLL control loop operation would begin with the VCO as shown in FIG. 1, producing frequency, $f_{VCO}$, at phase, $\phi_{VCO}$. This output frequency is generally divided down by an integer or fractional value to a lower "feedback" frequency, $f_{FB}$, by the divider block 15. The stable reference frequency, $f_{REF}$, and its phase, $\phi_{REF}$, is then compared to the feedback frequency, $f_{FB}$, and phase, $\phi_{FB}$ in a phase frequency detector (PFD) 11. If there is a difference in frequency or phase between the reference and feedback signals, the PFD 11 produces an Up or Down error signal for the duration of the frequency or phase difference. The PFD 11 detects phase difference in the reference and feedback signals in less than 1 degree.

Figure 2B:
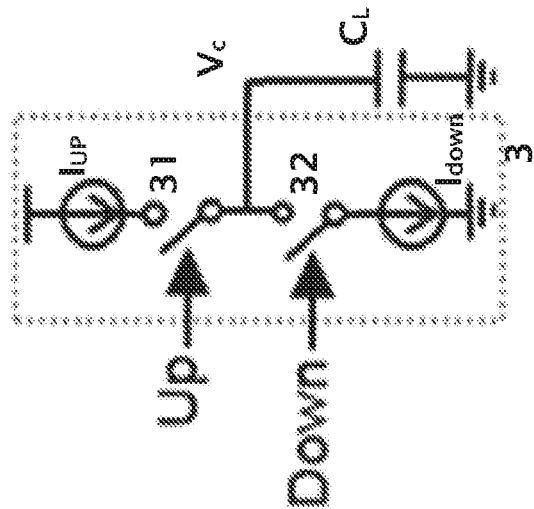
FIG. 2b shows a switch view diagram of a prior art charge pump.

In this work, an Up=logic 1 error signal is produced by the PFD 11 when the phase of feedback phase $\phi_{FB}$ lags behind reference phase $\phi_{REF}$ and a Down=logic 0 error signal is given when feedback phase $\phi_{FB}$ leads in front of $\phi_{REF}$. When the PLL 1 is in phase lock (i.e. $f_{FB}=f_{REF}$ and $\phi_{FB}=\phi_{REF}$), no error signal is produced (i.e. Up=Down=logic 0) and the loop 1 is essentially open with the ideal CP design 3 shown in FIG. 2b. The values of the PFD's Up/Down error signals determine the action of the CP 3: Up=logic 1 causes a transistor switch 31 of the CP 3 to close allowing charge to be placed on the LF's CL, effectively raising $V_c$ and consequently $f_{VCO}$; Down=logic 1 causes the opposite behavior in the CP 3 to occur by closing the other switch 32 and taking charge away from $C_L$, thus lowering $V_C$ and $f_{VCO}$.

Figure 3:
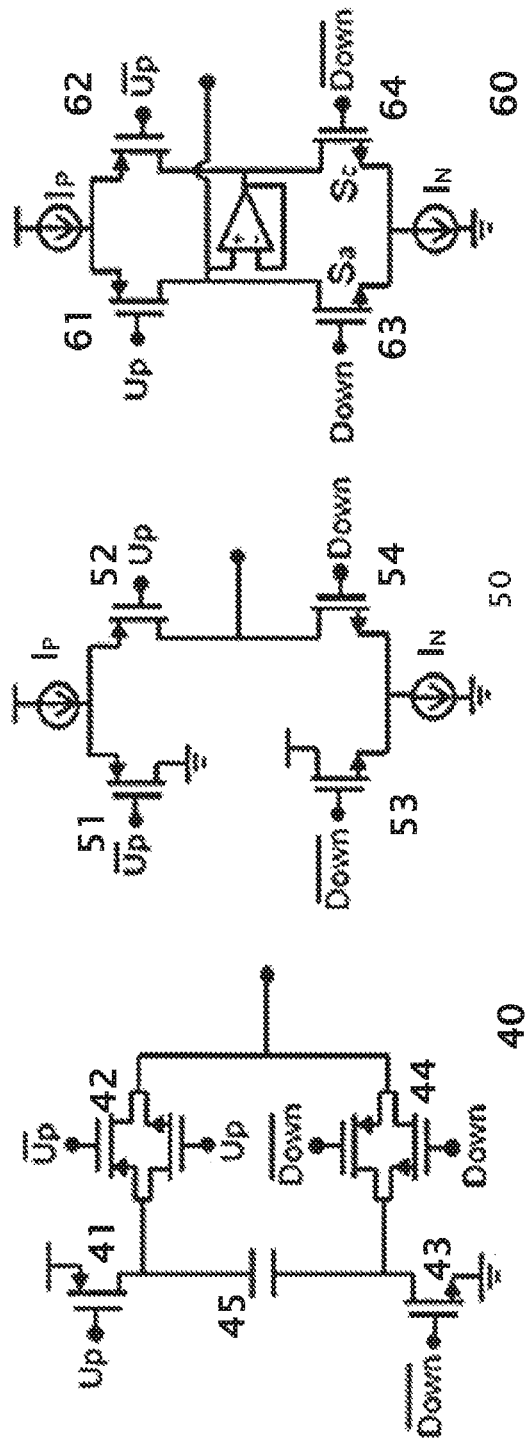
FIG. 3a shows a transistor-level schematic of a charge pump of the present invention.
FIGS. 3b and 3c show transistor-level schematics of prior art charge pumps.

State-of-the-art PLL charge pumps (CP) 50 and 60 shown in FIGS. 3b and 3c employs bulky current mirrors (i.e. $I_N$ and $I_P$ as shown therein) and relatively large transistor switches 51, 52, 53 and 54, and 61, 62, 63 and 64 to flow substantial amounts of current linearly to and from a Loop Filter (LF) to alter $V_C$. Although this is effective, these CPs 50 and 60 have significant design concerns including: 1) relatively large active area, 2) wasted static power due to current mirrors and biasing always working even during PLL phase lock, 3) the large transistor switches take a relatively long time to open and close, hence there is an unwanted control loop delay before the $V_{CO}$ frequency is altered, 4) extra matching circuitry for the CP Up/Down output signal transitions is necessary for equal charge up and charge down, 5) analog process extensions (i.e. current sources, large transistors, amplifiers) are sensitive to process variation, 6) $V_C$ output errors easily occur due to undesirable leakage current slipping through the large transistor switches, thus affecting the VCO frequency while in phase lock, 7) limited headroom due to stacked transistors restricts use at lower supply voltages, and 8) scalability to deep sub-μm technologies is severely restricted due to the large current mirror and switch transistors required to flow considerable currents and typically requires re-design when moving to a new process node.

Figure 2A:
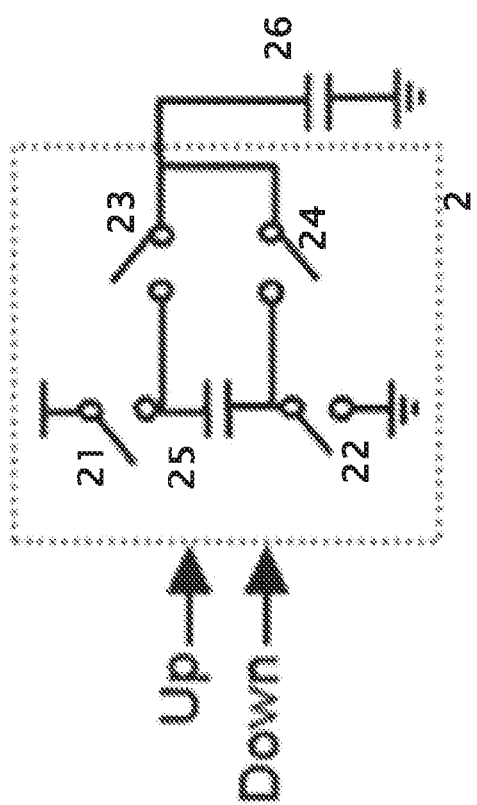
FIG. 2a shows a block diagram of a charge pump of the present invention.

The proposed PLL charge pump shown in the switch view in FIG. 2a and transistor level schematic in FIG. 3a is a new single-ended, capacitive charge transfer-based design that uses four (4) minimum-sized transistor switches 21, 22, 23 and 24, and 41, 42, 43 and 44, and a relatively small metal interconnect capacitor 25 and 45 that is sized to be dominant over parasitics. There are no current mirrors or other analog process extensions as in the state-of-the-art designs. This CP circuit 2 or 40 uses the same inputs (i.e. Up/Down logic error signals from the PFD) and has a similar overall general result as the state-of-the-art CPs 3, 50 and 60 in that the VCO frequency is successfully controlled, yet there are a few marked differences including the architecture, how the charge is transferred and held, the output voltage behavior, and total power consumption. Additionally, the switched capacitor 25 or 45 acts in itself as a second order filter for the PLL control loop.

PLL Charge Pump Operation

As with any PLL charge pump, there are 3 explicit switching modes of operation, namely: 1) Idle, 2) Pump Up, and 3) Pump Down. The next 3 segments describe each of these modes in detail for the charge pump of the present invention in the PLL control loop while highlighting the unique output voltage behavior and the amount of energy transferred for each mode, which is necessary to find the total dynamic power consumed while the CP charges and discharges in the various modes.

1). Idle Mode

Figure 4:
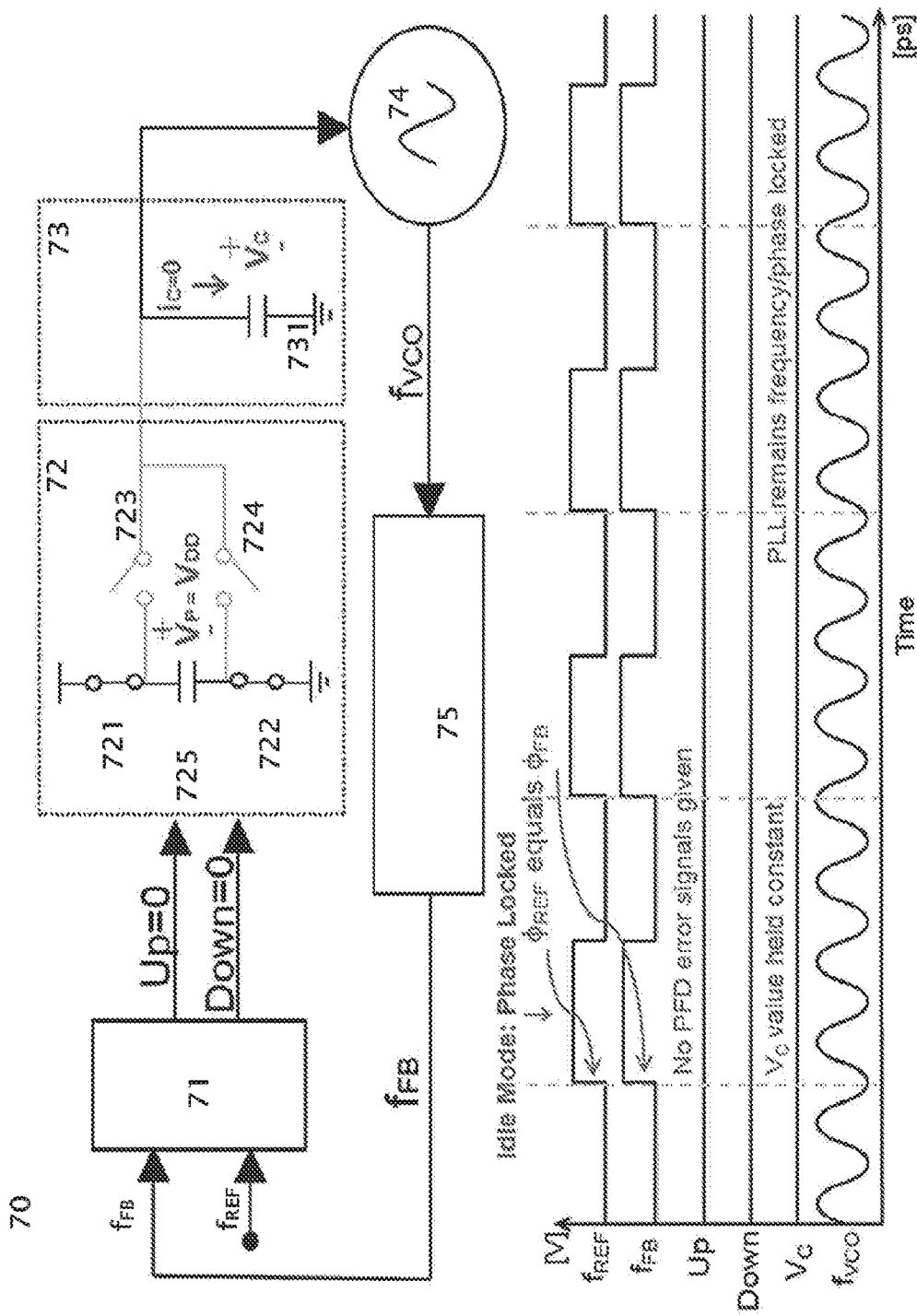
FIG. 4 shows a switch view and general transient wave forms of the phase locked loop charge pump of the present invention in idle mode.

FIG. 4 illustrates the switch view of the Charge Pump (CP) 72 in Idle mode with a general transient waveform. The Idle mode is always characterized by the Up and Down error signals being low (i.e. Up=Down=logic 0). There are two different times in which the Idle mode occurs in the PLL control loop, each with a specific purpose: 1) during phase lock to hold the $V_C$ value constant (i.e. $\phi_{FB}$ equals $\phi_{REF}$) and 2) for the recharging of CP in between Pump Up and Pump Down modes (i.e., $\phi_{FB}$ does not equal $\phi_{REF}$).

At the start of the Idle mode, switches 721 and 722 are closed while 723 and 724 are open; meanwhile this action causes CP 72, to charge to $V_{DD}$. After CP 72 charges to the supply voltage, $V_{DD}$, the capacitor 725 holds its charge, $Q_P$, in an open loop fashion until the CP 72 is instructed by the PFD 71 to change modes to either Pump Up or Pump Down. $V_C$, will not change during Idle mode and, therefore, retains the voltage value, $V_{C0}$, it held at the moment prior to starting Idle mode, namely:

$$V_C = V_{C0} \qquad [\text{EQ. 1}]$$

Due to the switched capacitor structure of the CP circuit, there are relatively little to no errors in the $V_C$ value, ultimately reducing unwanted PLL phase errors compared to the state-of-the-art. There is no static power being dissipated due to biasing in the proposed CP (no current-mode current mirrors) and we must look at the switching dynamic power to find the total power consumed while the CP sits quietly in the Idle mode. In order to do this, the energy at the start and end of the Idle mode needs to be analyzed. The energy utilized by the proposed CP 72 at the start of the Idle mode when $C_P$ charges to $V_{DD}$ is:

$$E_{CP_{IDLE0}} = C_P V_{DD}^2 = Q_P V_{DD} \qquad [\text{EQ. 2}]$$

It must be noted that the CP 72 charges only once at the very beginning of the Idle mode; this could be a full recharging or a partial recharging in EQ. 2 depending on the amount of charge required to bring the voltage across $C_p$ 725, $V_P$, to $V_{DD}$. The energy consumed by the proposed CP 72 during the Idle mode after charging to $V_{DD}$ is:

$$E_{CP_{IDLE1}} \cong 0 \qquad [\text{EQ. 3}]$$

due to no changes in the switches 721 and 722 of the CP 72 with the reasonable assumption that the leakage current flowing through the stacked switches 721 and 722 is negligible. Therefore, the total power dissipation of the proposed CP 72 for a complete Idle mode cycle may be found via the dynamic power equation:

$$P_{CP_{IDLE}} = \alpha f_{REF} \Delta E_{CP_{IDLE}} = \alpha f_{REF}(E_{CP_{IDLE0}} - E_{CP_{IDLE1}}) \approx \alpha f_{REF} Q_P V_{DD} \qquad [\text{EQ. 4}]$$

where α is the activity factor (0≤α≤1) for the proposed CP 72 working in 1 or more specific modes at the PLL reference frequency, $f_{REF}$.

2). Pump Up Mode

Figure 5:
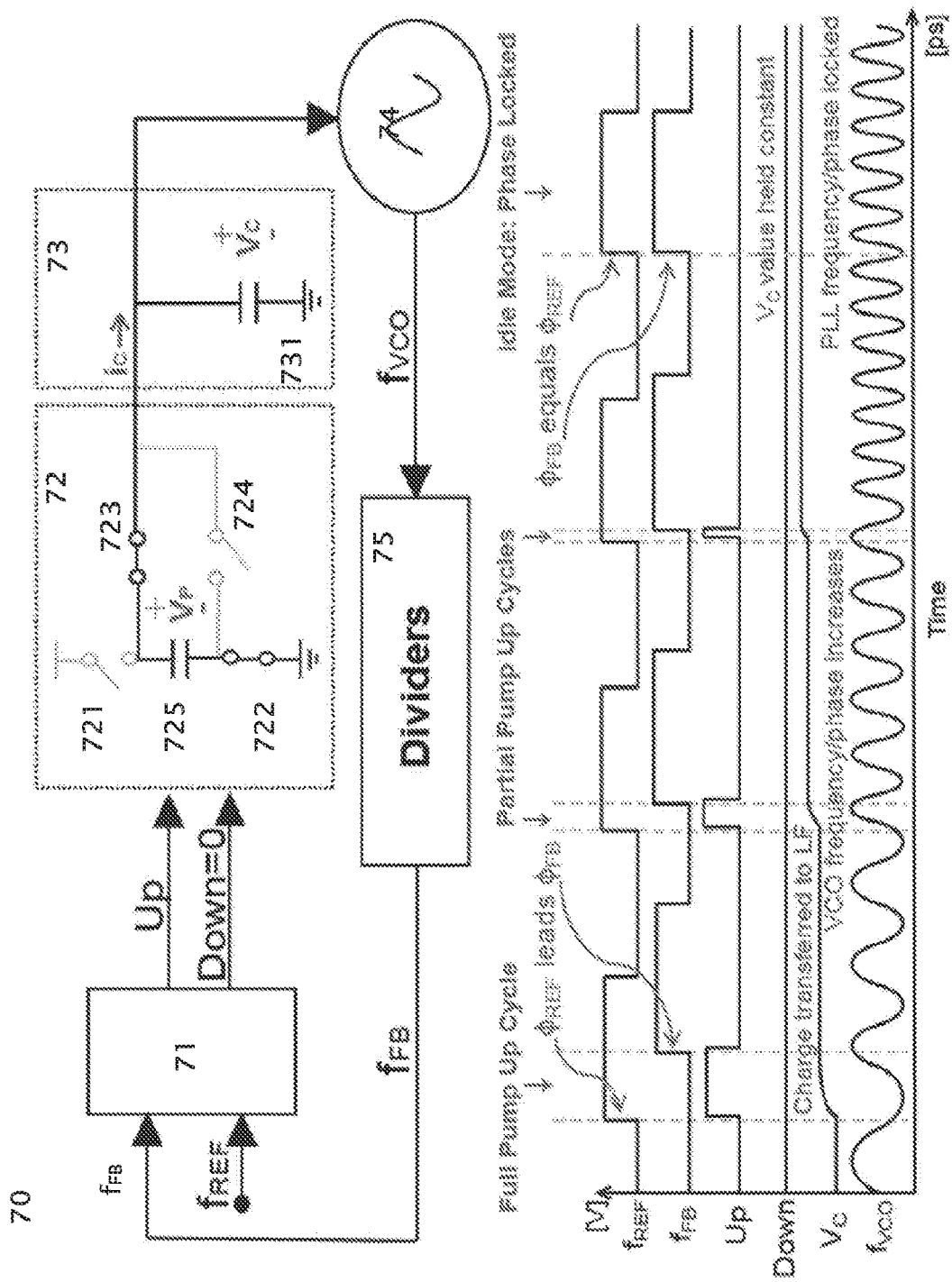
FIG. 5 shows a switch view and general transient wave forms of the phase locked loop charge pump of the present invention in pump up mode.

FIG. 5 depicts the Pump Up mode for the proposed CP 72 with a general transient waveform example. In this case, the Pump Up mode is activated by a lagging phase difference between $\phi_{FB}$ and $\phi_{REF}$; this causes the PFD 71 to produce a logic 1 Up error signal for the duration of the phase difference between $f_{FB}$ and $f_{REF}$. The CP 72 responds by transitioning out of Idle mode with an opening of the switch 721 and closing of switch 723 which allows the charge, $Q_P$, stored on CP 725 to transfer to $C_L$ 725, thus raising the voltage on $V_C$. The result for one Pump Up cycle is an increasing of $\phi_{VCO}$ and $\phi_{FB}$ in order to match $\phi_{REF}$. At the end of every Pump Up cycle the CP 72 returns to Idle mode to fully recharge $C_P$ 725. As the PLL 70 approaches phase lock, partial Pump Up cycles take place incrementally raising $V_C$ which allows for accuracy in obtaining the correct frequency on the VCO 74.

The exponential capacitive behavior of the CP output, $V_C$, for a single Pump Up charge sharing event may be modeled by the following first order equation:

$$V_C = V_{C0} + \frac{C_P}{C_P + C_L} V_{DD}(1 - e^{-t/\tau_{UP}}) \qquad [\text{EQ. 5}]$$

where $\tau_{UP}$ is equal to the RC time constant for the switch 722-capacitor 725-switch 723 path which the charge must flow through to arrive at $C_L$ in the Pump Up mode. The time, t, is the exact time in which Up is high, whether a partial or full cycle. As the PLL 70 gets close to acquiring phase lock, a partial Pump Up cycle occurs where the charge transfer event will get cut off midway ($t \ll \tau_{UP}$) and the exponential portion of Eq. 5 may be linearly approximated to $(1-t/\tau_{UP})$ as is shown in Eq. 6 when the PLL is near phase lock:

$$V_C \approx V_{C0} + \frac{C_P}{C_P - C_L} V_{DD}(1 - (1 - t/\tau_{UP})) = \qquad [\text{EQ. 6}]$$
$$V_{C0} + \frac{C_P}{C_P + C_L} V_{DD}(t/\tau_{UP})$$

This linear EQ. 6 results is precise phase lock at a high resolution for the proposed charge pump. The output step size is simply based on the ratio of capacitance $C_P$ 725 to the LF's 73 $C_L$ 731. For example, to increase the output step size, increasing $C_P$ 725 would suffice. The change in energy of the charge pump system during a Pump Up mode charge sharing event is:

$$\Delta E_{CP_{UP}} = \qquad [\text{EQ. 7}]$$
$$E_{CP_{UP_0}} - E_{CP_{UP_1}} = \frac{1}{2} Q_P V_{DD} + \frac{1}{2} Q_L V_{C0} - \frac{1}{2} \frac{(Q_P + Q_L)^2}{C_P + C_L}$$

where $Q_P$ and $Q_L$ are the initial charges held by the capacitor, $C_P$ 725 and capacitor, $C_L$ 731 at the start of the Pump Up mode. Using EQ. 7, we can now calculate the power dissipated for the Pump Up cycle at the PLL 70 reference frequency $f_{REF}$ by using the following dynamic power equation:

$$P_{CP_{UP}} = \quad [EQ. 8]$$

$$\alpha f_{REF} \Delta E_{CP_{UP}} = \alpha f_{REF} \left( \frac{1}{2} Q_P V_{DD} + \frac{1}{2} Q_L V_{C0} - \frac{1}{2} \frac{(Q_P + Q_L)^2}{C_P + C_L} \right)$$

3). Pump Down Mode

Figure 6:
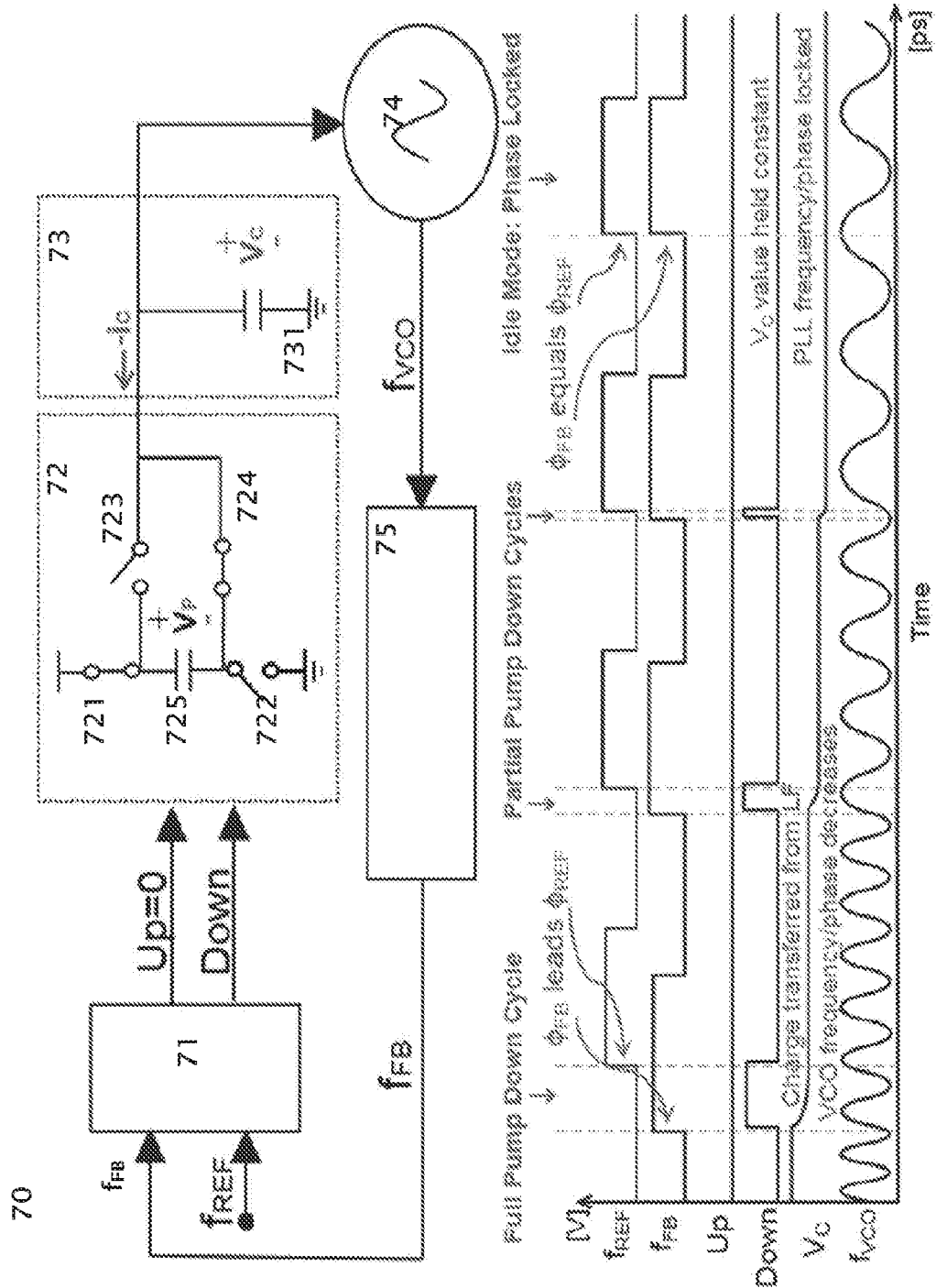
FIG. 6 shows a switch view and general transient wave forms of the phase locked loop charge pump of the present invention in pump down mode.

FIG. 6 illustrates the Pump Down mode for the proposed CP 72 with a simple transient waveform example. The Pump Down mode occurs when the phase error swings in the opposite direction and $\phi_{FB}$ leads $\phi_{REF}$, causing the PFD 72 to produce a logic 1 Down error signal for the duration of the difference between $f_{FB}$ and $f_{REF}$. Similar to the Pump Up mode, the CP 72 responds by moving out of the Idle mode, but instead opens the switch 722 and closes the switch 724 which allows the pulling of the stored charge, $Q_P$, away from the capacitor 731 of the loop filter 73, thus lowering the voltage on $V_C$. This action decreases $f_{VCO}$ and, consequently, $f_{FB}$, in the closed PLL control loop. At the end of every Pump Down cycle, the CP 72 recharges CP 72 in the Idle mode.

Analogous to the Pump Up cycle, the Pump Down CP output can be modeled by the first order equation:

$$V_C = V_{C0} - \frac{C_P}{C_P + C_L} V_{DD} (1 - e^{-t/\tau_{DN}}) \quad [EQ. 9]$$

where $\tau_{DN}$ is equal to the RC time constant for the switch 724-capacitor 725-switch 721 path that the charge must flow through to leave the capacitor 731 of the LF 73. The time, t, is the full or partial cycle time that the Down error signal is high. As the PLL 70 draws near to phase lock, partial Pump Down cycles occur, where the charge transfer event will get cut off midway ($t \ll \tau_{DN}$). In this case EQ. 9 may be linearly approximated to:

$$V_C \approx V_{C0} - \frac{C_P}{C_P + C_L} V_{DD} (1 - (1 - t/\tau_{DN})) = \quad [EQ. 10]$$

$$V_{C0} - \frac{C_P}{C_P + C_L} V_{DD} (t/\tau_{DN})$$

The output Down step size of the CP 72 may be adjusted via the ratio of the capacitor $C_P$ 725 to the capacitor, $C_L$ 731 of the LF 73 and is equivalent to the Up step size due to CP 72 being utilized for both transitions, thus eliminating the need for extra matching circuitry compared to the state-of-the-art. The CP energy used during a Pump Down cycle is:

$$\Delta E_{CP_{DN}} = E_{CP_{DN0}} - E_{CP_{DN1}} = \frac{1}{2} \frac{C_P}{C_P + C_L} Q_P V_{DD} + \frac{1}{2} Q_L V_{C0} \quad [EQ. 11]$$

Finally, the power dissipated for the Pump Down mode is:

$$P_{CP_{DN}} = \quad [EQ. 12]$$

$$\alpha f_{REF} \Delta E_{CP_{DN}} = \alpha f_{REF} \left( \frac{1}{2} \frac{C_P}{C_P + C_L} Q_P V_{DD} + \frac{1}{2} Q_L V_{C0} \right)$$

Power Consumption of the PLL Charge Pump of the Present Invention:

The total dynamic power of the proposed CP 72 may be found by adding EQs. 4, 8, and 12 or via CP's stored energy over time:

$$P_{CP_{dyn}} = P_{CP_{IDLE}} + P_{CP_{UP}} + P_{CP_{DOWN}} \cong \left( \alpha f_{REF} \frac{C_P V_{DD}^2}{2} \right) = \quad [EQ. 13]$$

$$\left( \alpha f_{REF} \frac{Q_P V_{DD}}{2} \right)$$

Therefore, the total power of the proposed CP 72 with negligible leakage of the stacked transistor switches is simply:

$$P_{CP} = \quad [EQ. 14]$$

$$P_{CP_{dyn}} + P_{CP_{leak}} = \left( \alpha f_{REF} \frac{C_P V_{DD}^2}{2} \right) + (I_{leak} V_{DD}) \cong \alpha f_{REF} E_{CP}$$

Experimental Results for the Proposed PLL Charge Pump

This section presents simulation and experimental results for the proposed charge-mode PLL CP 72. The proposed CP 72 was simulated in a 1-10 GHz ring VCO-based analog PLL with a varying supply voltage of 0.5-1.2V. The technology used was a TSMC digital 40 nm CMOS process. The six transistors of the CP had a width of WN=120 nm or WP=240 nm and a length of L=40 nm. The CP capacitor, $C_P$ 725, was 100 fF, while the LF capacitance, $C_L$ 731, was 1 pF, resulting in a 1:10 output step size ratio. The PFD 71 utilized was a dual-reset DFF from the reference, "A dual reset D flip-flop phase-frequency detector for phase locked loops," by S. Schober et al., IWS 2015, Proceedings of the XXI Iberchip Workshop, February 2015, with no added delay due to the comparable switching time between the minimum-sized switches of the PFD DFFs and the CP.

Figure 7:
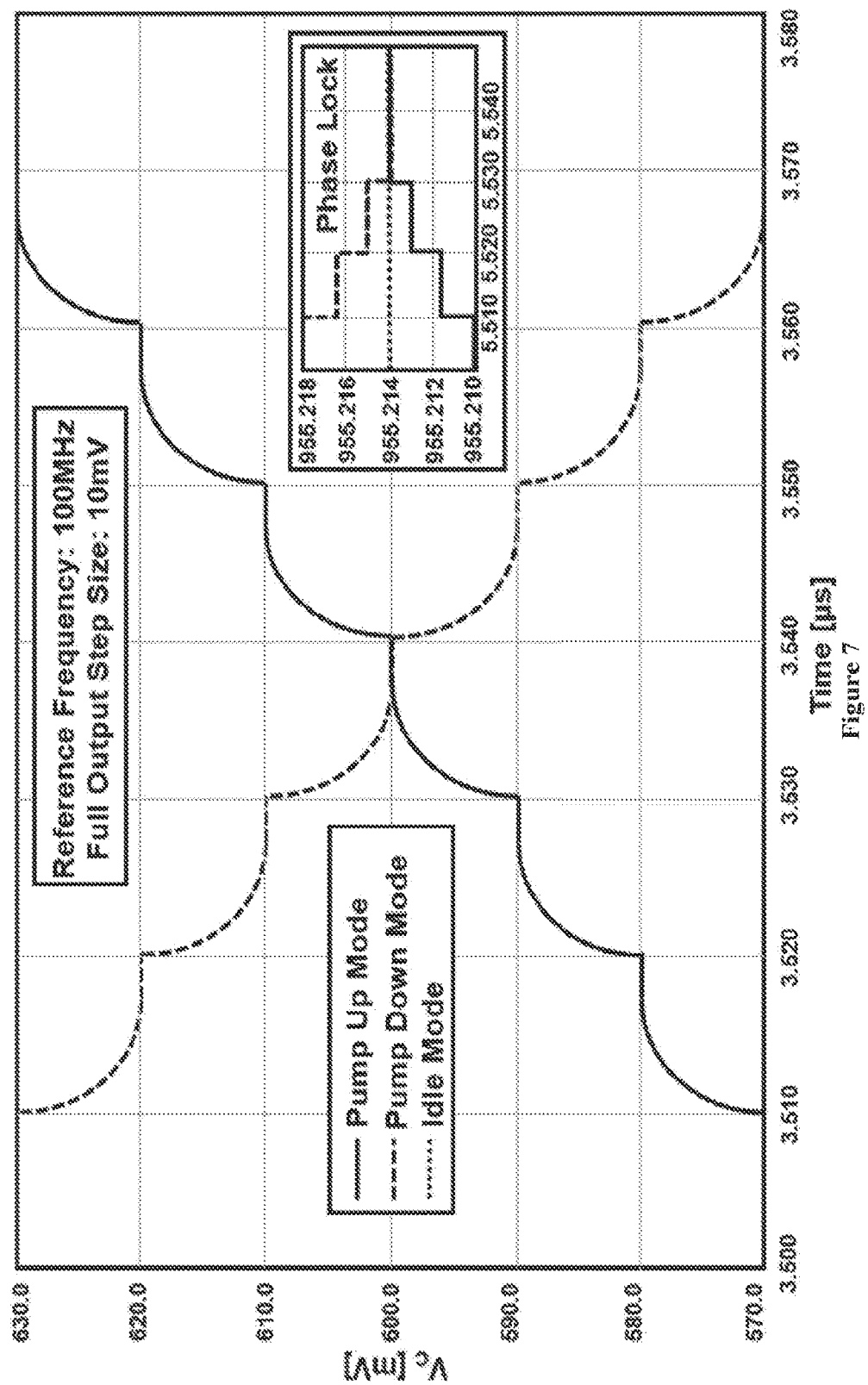
FIG. 7 shows a simulated plot of output step and phase lock behavior of the phase locked loop charge pump of the present invention.

FIG. 7 is a graph, showing the simulated output for the Up and Down modes; the inset illustrates the high resolution, linear behavior of the CP output as phase lock is approached and acquired.

Figure 8:
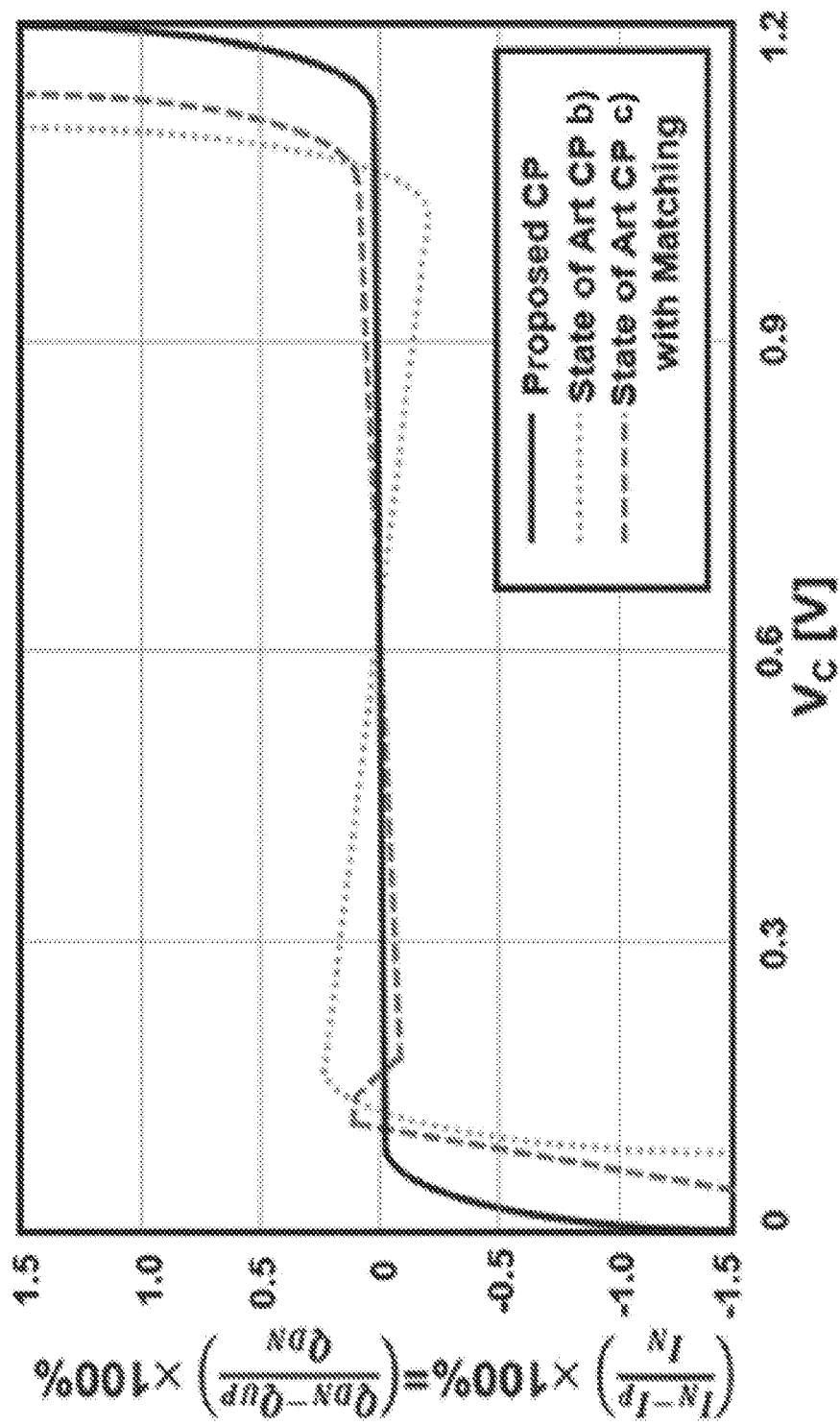
FIG. 8 shows simulated systematic percentage error between the phase locked loop charge pump of the present invention and the prior art charge pumps shown in FIGS. 3b and 3c.

FIG. 8 depicts the % error mismatch simulation comparison results for the proposed CP and the state-of-the-art CPs in FIGS. 3b to 3c utilizing the same PLL; the proposed CP output has less than a 0.05% error for $0.05V \leq V_C \leq 1.15V$. Simulation results shown were taken at $f_{OUT}$=5 GHz and $f_{REF}$=100 MHz with a 1.2V supply and a divider of N=50. The average power of the CP was 253 pW in simulation, while (b) and (c) had a static power of 1.12 mW and 1.53 mW, respectively, resulting in a 106 improvement in power consumption over the state-of-the-art.

Figure 9:
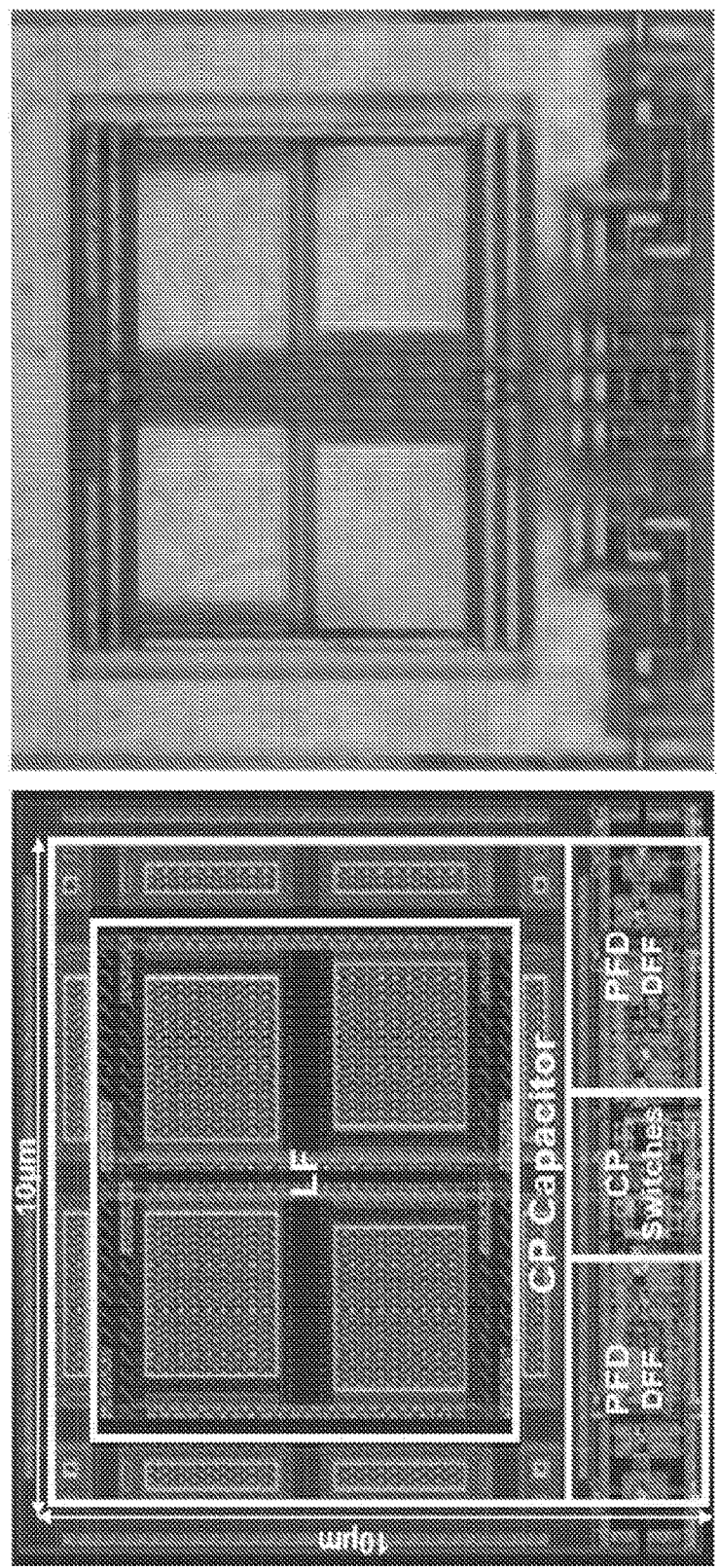
FIG. 9 shows a layout and die micrograph of the phase locked loop charge pump of the present invention with PLL, loop filter capacitor and phase frequency detector of the present invention.

The 1-10 GHz PLL was fabricated with the proposed CP in all-digital 40 nm TSMC CMOS and physically tested. FIG. 9 displays the layout and die micrograph of the proposed CP, with the PLL LF capacitor and PFD. The measured performance results of the proposed CP with a comparison to state-of-the-art CPs is shown in Table 1.

TABLE 1

|  | Present invention | Ref. 1 | Ref. 2 | Ref. 3 | Ref. 4 | Ref. 5 |
|---|---|---|---|---|---|---|
| Supply [V] | 0.5-1.2 | 1.2 | 1.2 | 3.3 | 1.8 | 1.5 |
| $f_{VCO}$ [GHz] | 1-10 | 1-10 | 1-10 | 0.35-0.61 | — | 4.8-5 |
| $F_{REF}$ [MHz] | 50-400 | 50-400 | 50-400 | 29 | 50-500 | 11 |
| CP Power [W] | 250 p | 1.12 m | 1.53 m | 1.5 m | 940μ | 2.2 m |
| CP $V_C$ range [V] | 0.0-1.2 | 0.1-1.1 | 0.1-1.1 | 0.07-1.05 | 0.1-0.9 | 0.1-1.4 |
| CP area [mm²] | 0.0004 | 0.0045 | 0.0065 | 0.015 | 0.015 | 0.16 |
| RMS jitter [ps] | 0.80 ± 0.05 | 2.3 | 1.5 | 7.1 | — | — |
| Ref. spurs [dBc] | <−70 | <−60 | <−65 | — | — | <−70 |
| Phase error [°] | 0.1-0.3 | 2.3 | 0.9 | — | 1-5 | — |
| Technology [m] | 40 n | 40 n | 40 n | 0.35μ | 0.18μ | 0.24μ | where:
Ref. 1 is based on simulated results from state-of-art CP example shown in FIG. 3b;
Ref. 2 is estimated value from state-of-art CP example shown in FIG. 3c;
Ref. 3: X. Shi, K. Imfeld, S. Tanner, M. Ansorge, and P-A. Farine. "A low-jitter and low-power CMOS PLL for clock multiplication." ESSCIRC'06, Proceedings of the 32nd European Solid-State Circuits Conference, pp. 174-177, 2006;
Ref. 4: C. Charles and D. Allstot. "A buffered charge pump with zero charge sharing," ISCAS'08, IEEE International Symposium on Circuits and Systems, pp. 2633-2636, 2008; and
Ref: 5: H. Rategh, H. Samavati, and T. Lee. "A CMOS frequency synthesizer with an injection-locked frequency divider for a 5-GHz wireless LAN receiver," IEEE Journal of Solid-State Circuits, vol. 35, pp. 780-787, May 2000.

Figure 10:
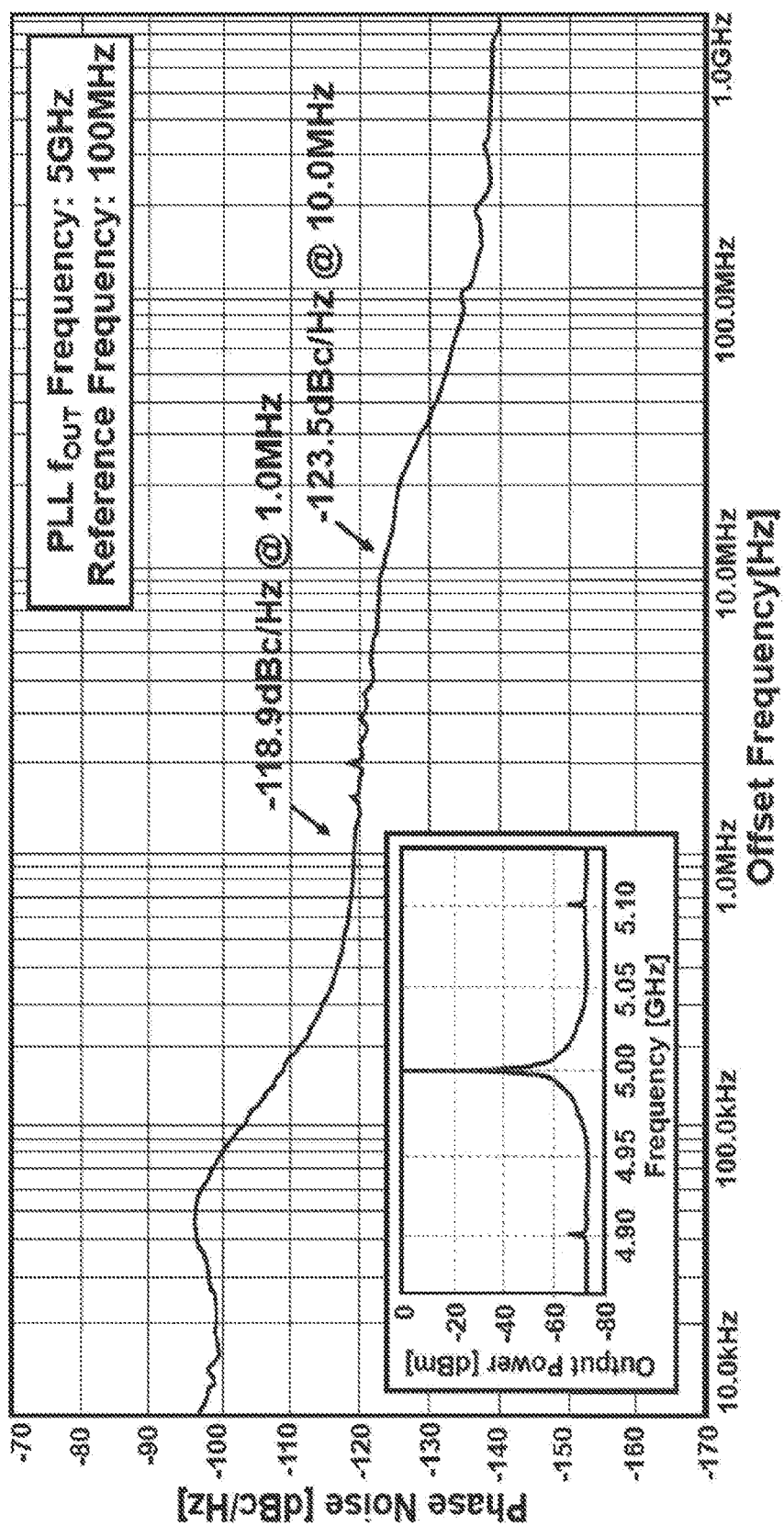
FIG. 10 shows a snapshot of the phase noise and spectrum characteristics of the physically tested phase locked loop with the charge pump of the present invention.

FIG. 10 illustrates a snapshot of the phase noise and spectrum characteristics of the physically tested PLL with the proposed CP. The unique, low power switched capacitor design of the proposed CP is responsible for the desirable minimal charge injection into the VCO control line. The power of the spurious sidebands of the PLL thereby is greatly reduced allowing for the reference spurs to be less than −70 dBc.

The CP design of the present invention overcomes the aforementioned state-of-the-art CP design concerns efficiently by eliminating current mirrors and adopting a switched capacitor approach to transferring charge to and from the LF's capacitance. The result is a dramatic reduction of power and active area. Furthermore, the proposed CP in accordance with the present invention is scalable to and between smaller process nodes and able to be used at very low voltages (<1V). The proposed CP of the present invention possesses no analog process extensions that are parametrically sensitive to process variation, allowing for a matched Up and Down output step when acquiring phase lock. The use of the proposed CP allows for a low jitter, low phase-noise analog PLL with reduced reference spurs.

PLL PFD Designed with Charge/Discharge Path Optimization:

Many types of PLLs, both digital and analog, employ a phase detection block for determining differences (i.e. errors) between the divided-down feedback oscillator frequency, $f_{FB}$, and a stable reference frequency, $f_{REF}$. An example of a PLL that utilizes a phase-frequency detector circuit 11 is the analog charge pump PLL 1 previously shown in FIG. 1. Although over the past 30 years, there have been many varieties of phase and/or frequency detectors for PLLs in ICs, such as analog multipliers or digital combinational circuits like an XOR gate, which could be applied to the block 11 in FIG. 1, the state-of-the-art PFD generally is a sequential flip-flop based circuit operating in 1 of 3 states (i.e. Up, Down, or Idle modes) while in a PLL. The ubiquitous use of this type of detector in a PLL is due to the advantageous combination of low power, stability, speed, noise, and area tradeoffs possessed by a flip-flop based PFD as compared to its counterparts.

State-of-the-Art PLL PFDs

One of the most pertinent challenges in state-of-the-art PFD designs is that the fast propagation delay, $\tau_p$, of the digital flip-flops does not match the slower analog switching times, $\tau_s$, in the state-of-the-art CPs in a PLL shown in the reference, Razavi, Behzad, "Challenges in the design of high-speed clock and data recovery circuits," IEEE Communications Magazine vol. 40, pp. 94-101, August 2002. To counteract this "dead zone" issue, traditional approaches point to simply adding carefully timed supplementary delay circuitry to the PFD reset path in order to allow for the Up/Down error signals to be extended, permitting the necessary extra time for the CP to react so that it may have the desired effect on the control voltage, $V_C$. The concern that results with this widely-used method is that there is an undesirable added delay, $\tau_d$, introduced into the PLL control loop, which has the ability to contribute significant noise, seen as jitter, in the PLL. The increased overall delay in the feedback loop is a source of instability in the PLL. This unsteadiness is a direct result of the PFD output signals causing $V_C$ dithering via the CP. The outcome is that the VCO's frequency, $f_{VCO}$, changes in either direction as the PLL continually attempts to acquire phase-frequency lock, but fails to do so, therefore undesirably increasing the phase noise of the VCO. Ideally in a PLL, the PFD and CP would have similar switching times allowing for quick and symmetrical corrections of errors in the control loop in real time.

Recently, a promising new type of fast-switching, accurate charge-transfer based PLL charge pump, which was covered in the previous section, has been introduced facilitating the need for an improved PFD design that works seamlessly with this advanced block in the PLL. Specifically, this CP does not require a PFD with the traditional delay compensation to account for the inability of the relatively large CP analog transistor switches to open and close quickly. Rather, this digital-like CP requires a PFD with minimal dual Reset-to-Q switching times on the same logic speed scale; this allows for high resolution of phase error correction in the PLL resulting in extremely low levels of added noise (i.e. dither around phase lock) as compared to the state of the art designs. Therefore, this work aims to introduce a no-added delay dual reset D flip-flop (DFF) based PFD design that when used in conjunction with a charge-transfer based CP in a multi-GHz PLL, results in very low jitter characteristics and reduced reference spurs in the PLL's frequency spectrum.

Figure 11B:
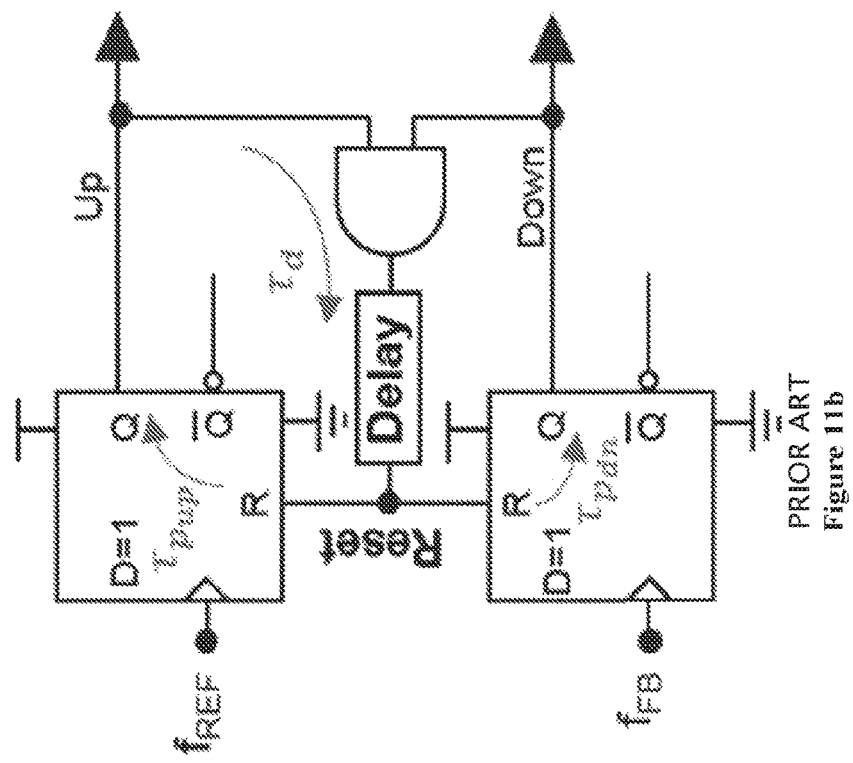
FIG. 11b shows a prior art D-flip flop based phase frequency detector.
Figure 12A:
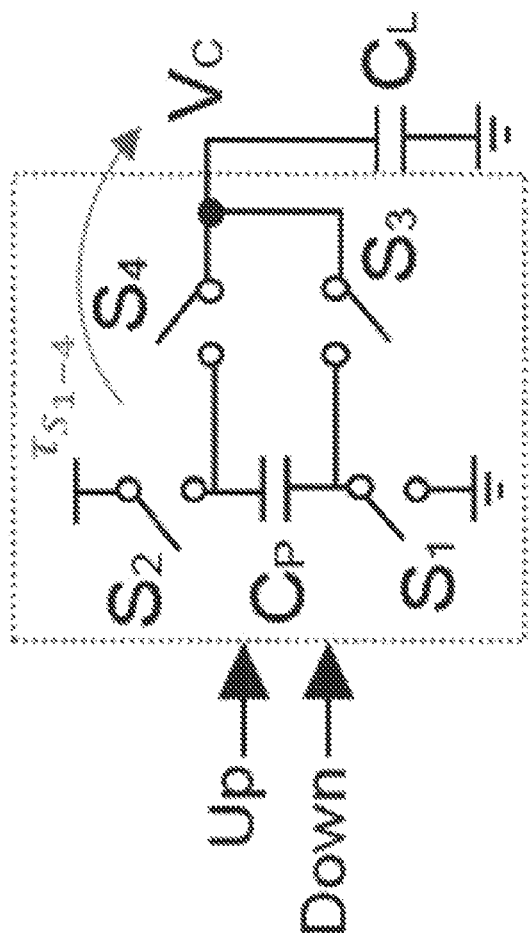
FIG. 12a shows a switch view diagram of the charge-based charge pump of the present invention.
Figure 12B:
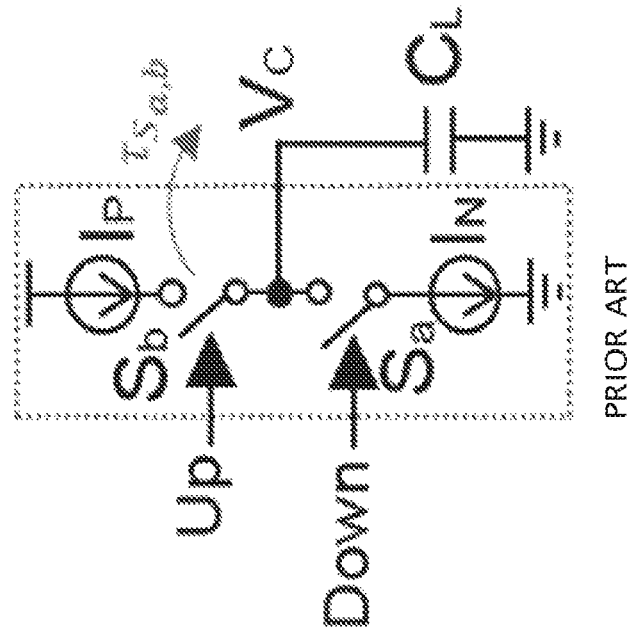
FIG. 12b shows a switch view diagram of a prior art charge based charge pump.

State-of-the-art PFD designs, such as is shown in FIG. 11b, typically are composed of a pair of DFFs with their D=1 and Resets generated by a logic AND gate of both Q outputs, followed by carefully timed added delay circuitry (e.g. buffers) to compensate for the slow switching time, $\tau_{s_{a,b}}$, of current-based CPs, shown in FIG. 12b. This allows the critical Reset-to-Q propagation delay, of the DFFs to be slowed down by $\tau_d$ to match the CP switching time. While there are a variety of circuits and latches that could be used in a PFD, the use of edge-triggered DFFs extends the phase detection range to span more than 1 period. This is essential for frequency lock over widely different frequencies.

The main challenge in a state-of-the-art PFD design is in adding the correct amount of delay compensation to accommodate a traditional CP resulting in minimal dead zone, which is directly responsible for phase noise and spurious tones. For instance, if there was no buffering of the PFD reset path to add the appropriate delay, nonlinearities between the PFD and CP would readily be introduced, thus resulting in an incorrect amount of charge delivered to the loop filter. This is due to the differences in timing of the PFD propagation delay and the CP switches. Invariably these charge differences cause a distortion in the CP current spectrum and adversely raise the in-band noise floor of the PLL. In a PLL that uses these components, it is then absolutely critical to match the timing of the PFD Up/Down error outputs to the CP switches such that:

$$\tau_{P_{UP}} + \tau_d = \tau_{P_{dn}} = \tau_{s_u} = \tau_{s_b} \qquad [\text{EQ. 15}]$$

A consequence of adding this delay is the unwanted generation of a brief Up/Down 1/1 state for the length of this dead zone in every cycle, even during phase lock, which unfortunately causes fluctuations in the CP producing PLL jitter.

Additionally, at the circuit level, an ideal PFD will exhibit the following list of desirable attributes when placed in a PLL: 1) Reset-to-Q propagation delays are equal to the CP switch time, 2) balanced Up/Down error signal outputs for given phase error, 3) no digital glitch errors while in Idle mode, 4) wide frequency operating range, 5) compact area, 6) low power operation, 7) ability to be used with supply voltages <1V, and 8) scalability to and between process nodes for ease of future reuse thus reducing design time. At the heart of PFD design are the flip-flop circuits utilized to meet these demands head on.

State-of-the-Art PLL D Flip-Flops for PFDs

Figure 13:
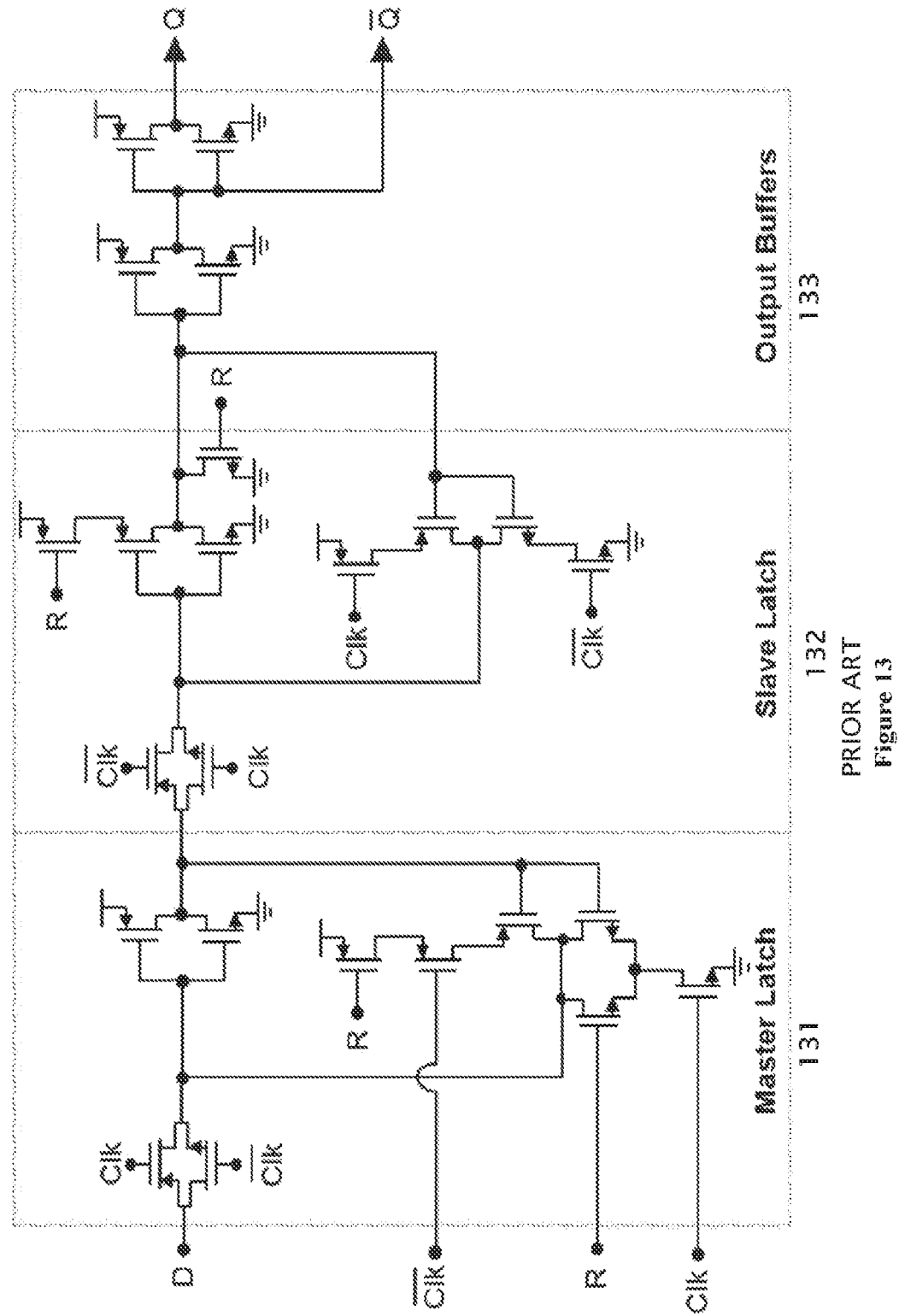
FIG. 13 shows a schematic view of an example of D-flip flops used in a prior art phase frequency detector.

An example of a typical state-of-the-art DFF used in PFD designs is shown in FIG. 13. To construct a flip-flop, a variety of logic gates may be used. They are essentially a combination of (one, the other, or both) tri-state inverters or transmission-gate selector gates. The Master Latch 131 selects either the D input or its inverted output and the Slave Latch 132 selects either the Master Latch 131 output or its inverted output, where each are selected with opposite phases of the clock. This particular DFF has a positive-edge triggered true and complement clock input, Clk, and a single asynchronous reset, R. The output of the DFF is Q and its complement is $\overline{Q}$.

The propagation delay of this type of DFF is based on the most critical path, in this case Reset-to-Q as opposed to Clk-to-Q, unlike normal DFF design priorities which are optimized for minimal clock delays. This reset delay, for the aforementioned reasons, is generally slowed down to work with a typical CP in the PLL. Beyond the negligible leakage current, the power of a DFF, and subsequently a PFD of this type, is wholly dynamic due to the switching current incurred in each DFF clock cycle. The PFD DFFs' contribution to power in a PLL is by and large the lowest overall. Furthermore, the area of this digital circuit is regularly the smallest of all the blocks in the PLL. With the new compact charge-based CPs, shown in FIG. 12a, which switch fast and consume power in the pW range, there is much to be gained by optimizing a DFF for speed, power, and area in a PLL that employs a charge-based CP.

Optimized Dual Reset DFF for Proposed PFD

Figure 11A:
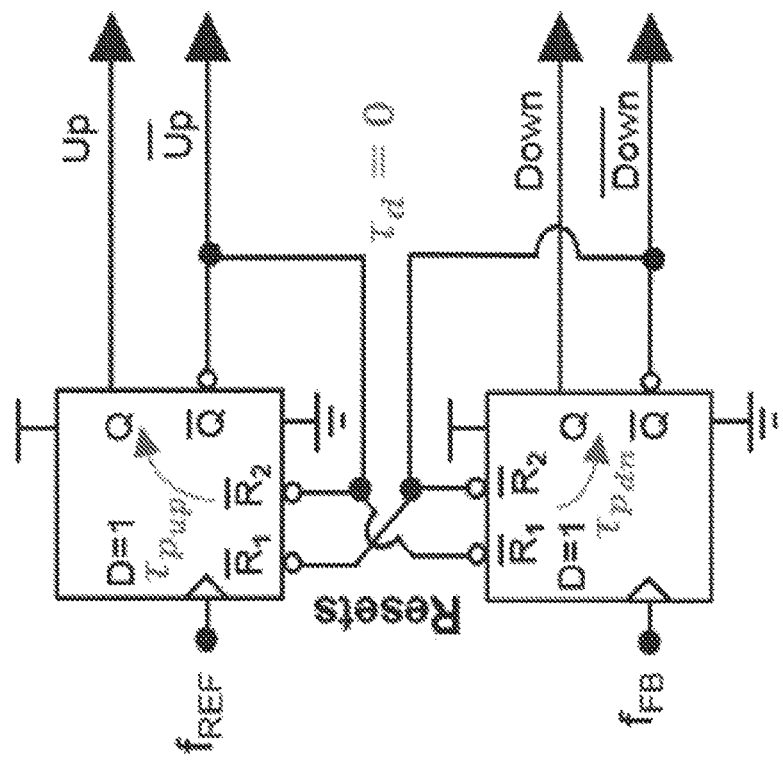
FIG. 11a shows a D-flip flop based phase frequency detector of the present invention.

The proposed PFD design is shown FIG. 11a and is made out of 2 unique dual reset DFFs to match the faster switching speed, $\tau_{s_{1-4}}$, of a charge-based CP design shown in FIG. 12a. In this PFD, the output of the DFFs, Q and $\overline{Q}$, directly supply the error signals, Up and Down, with their complements for use in the CP. There is no added delay in the Reset-to-Q path as typically seen in the state-of-the-art designs.

Figure 14:
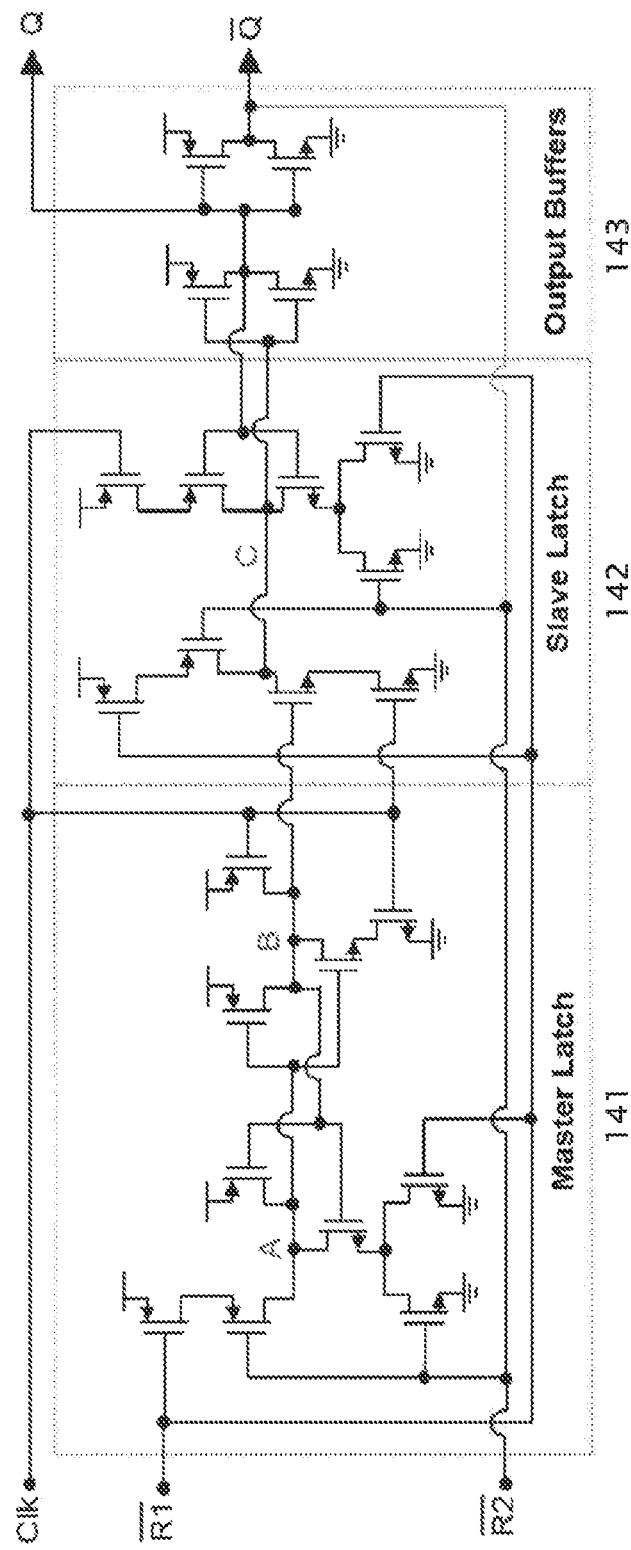
FIG. 14 shows schematic view of a phase frequency detector of the present invention.

The proposed DFF of FIG. 14 is an optimization of the DFF shown in FIG. 13 where D=1 and an additional reset input has been added to internalize the typical PFD AND gate into the Slave Latch 142. This DFF also consists of three sections: 1) Master Latch 141, 2) Slave Latch 142, and 3) Output Buffers 143. Both latches 141 and 142 are made entirely out of asymmetric complex gates for maximum performance. This charge/discharge path optimization approach is known as Complementary-Complex Logic (C2L). Here the p-channel devices are not a direct De-Morgan complement of the n-channel structure, but instead a logic function complement observed by using zeros for the pull-down and ones for the pull-up realization as visualized on a Karnaugh-Map as described in 1). V. Kantabutra et al., "A state assignment approach to asynchronous CMOS circuit design," IEEE Transactions on Computers, vol. 43, pp. 460-469, April 1994; and 2). C. Piguet, "Memory element of the master-slave flip-flop type, constructed by CMOS technology," U.S. Pat. No. 5,748,522. May 1998. This approach may use some "can't-happen," which are extremes of "don't-care," conditions differently between the n-channel pull-down trees and the p-channel pull-up trees yielding dissimilar looking tree structures. A "can't-happen" condition does not need to have the same logic state for both the pull-down and pull-up structures. Utilizing the Complementary Complex Logic approach as shown in U.S. Pat. Nos. 6,198,324 and 6,297,688 enables a more compact, fast, and lower power DFF design through reduction of interconnect parasitics and transistors in the critical path as realized by combining or sharing the active nodes instead of the normal metal interconnect in the circuit's physical layout.

Note that the proposed DFF in FIG. 14 uses a single phase clock, as opposed to FIG. 13, so that the delay difference between the internal Clk and $\overline{Clk}$ is not a consideration in the flip-flop response. The Slave Latch complex-gate structure in FIG. 14 combines a fast clock path with the optimized Reset-to-Q signal paths at node C for minimal delay. When Clk goes HIGH, node C is directly pulled LOW and when the last of both resets go LOW, node C is directly pulled HIGH. It only remains to get the Q signal and its complement out with nominal delay to form the UP or DOWN CP commands. Observe that $\overline{Q}$ needs to be buffered before being tied back to the flip-flop's $\overline{R_2}$ through an inversion of Q, otherwise the complex gate's output node C would be directly controlling its own gate inputs. The delay to perform this self-reset defines the minimum Up/Down phase detector output pulse width as a couple of fast inverter propagations. This smallest possible PFD output pulse width is on the same scale as the charge-based CP switching time, allowing for an excellent match in operational speeds between these two blocks, which is unlike traditional PFD-CP designs.

The 1st inverter delay starts to turn the switch ON and the 2nd pulls it back OFF in the Output Buffers 143. Note that the reset $\overline{R_2}$ is directly tied to the final buffered $\overline{Q}$ output for the case of the charge-based CP. If a state-of-the-art current-based CP was utilized, additional delay would normally be added before both resets. This direct connection for the charge-based CP is reflected in both FIGS. 11a and 14.

Proposed PFD Operation in a PLL

Figure 15:
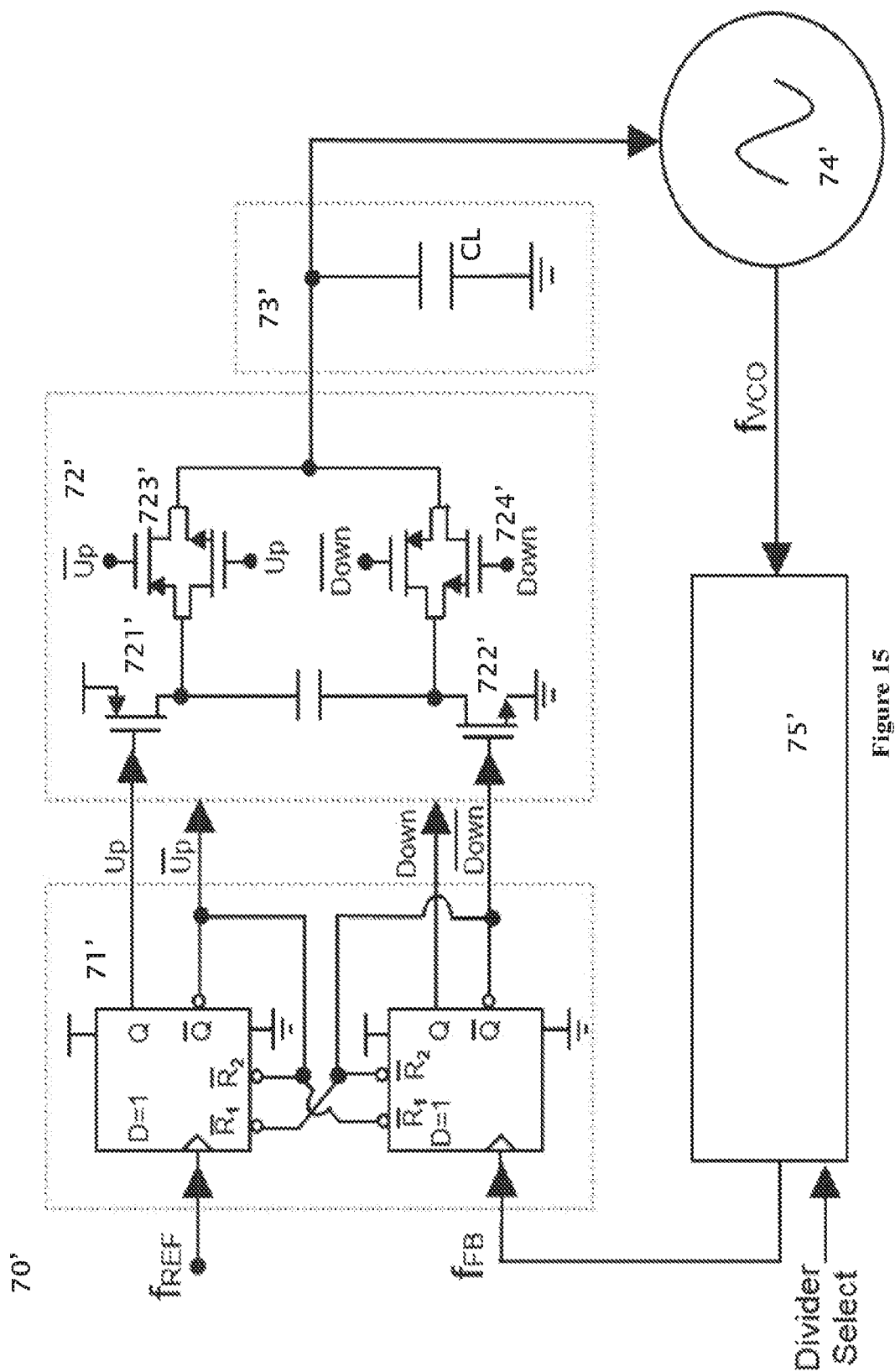
FIG. 15 shows a block diagram of a phase frequency detector of the present invention.

The implementation of the proposed PFD 71' in combination with the charge-based CP 72' in a PLL 70' is then relatively straightforward as shown in FIG. 15: cross-couple the resets, eliminate the AND gate and traditional delay circuitry found in state-of-the-art PFDs, and connect directly to the charge-based CP 72'. With the charge-based CP 72', the switches 721', 722', 723' and 724' are not the typical large slow opening/closing analog transistors required to flow large amounts of current from the current mirror, but rather minimum sized and relatively quick to open and close to transfer discrete amounts of charge from/to the LF 73' capacitance, CL (e.g. $\tau_{s_{1-4}} \ll \tau_{s_{ab}}$). For a PLL that uses a charge-based CP, there is no added delay requirements (e.g. $\tau_d=0$) for the PFD as the propagation delay of the switches of the CP are on the same order as the DFFs in the PFD. The timing issue therefore gets mitigated to the actual sizing of the transistors within the DFFs. Notably, the Reset-to-Q timing constraints now simply become:

$$\tau_{P_{up}} = \tau_{P_{down}} = \tau_{s_1} = \tau_{s_2} = \tau_{s_3} = \tau_{s_4} \quad [\text{EQ. 16}]$$

Figure 16:
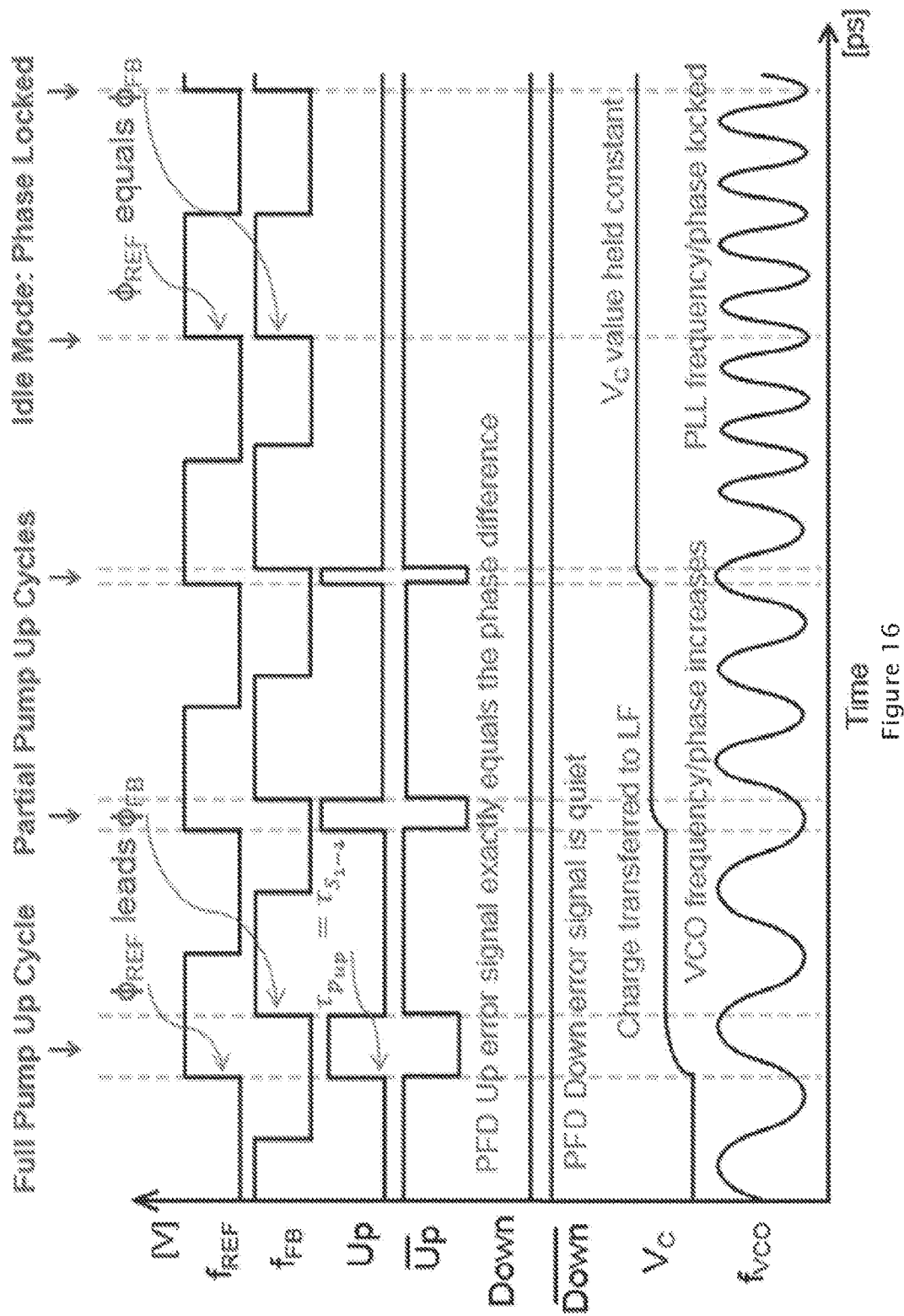
FIG. 16 shows an example of the phase frequency detector from in pump up mode to idle mode in the PLL of the present invention.
Figure 17:
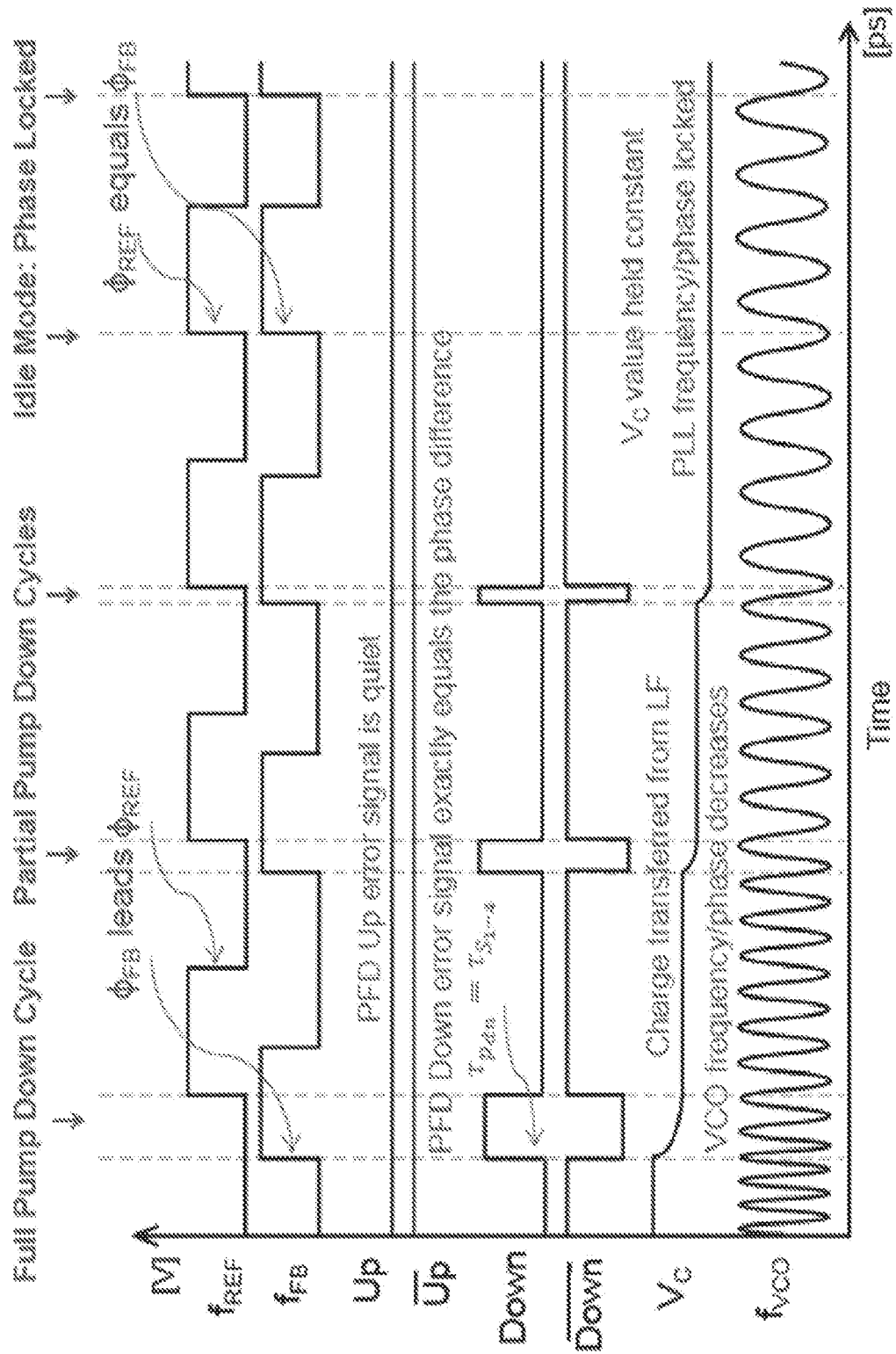
FIG. 17 shows an example of the phase frequency detector from in pump down mode to idle mode in the PLL of the present invention.

FIGS. 16 and 17 display the Up to Idle and Down to Idle waveform characteristics of the proposed PFD in a PLL, respectively. Both examples reflect the new timing constraints.

Figure 18:
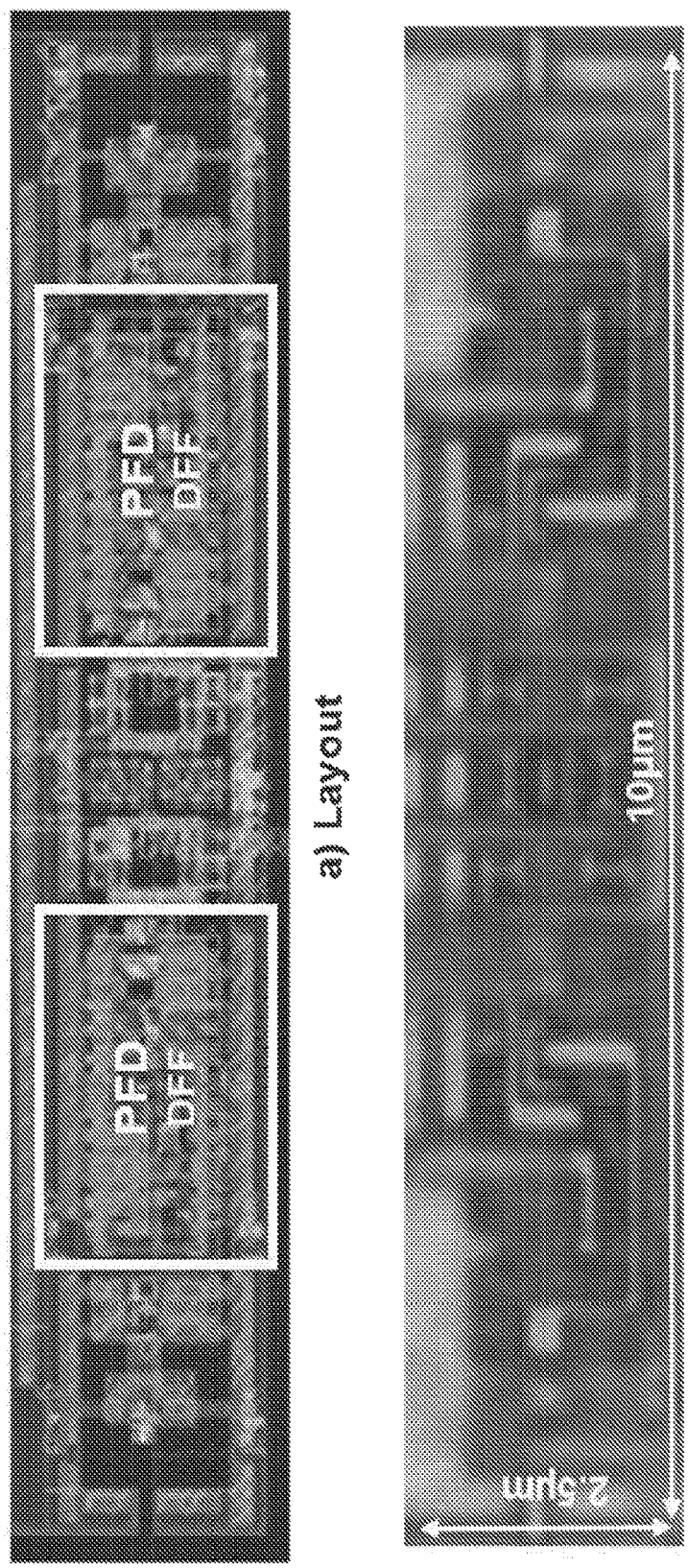
FIG. 18 shows a layout and die micrograph of the phase frequency detector and D-flip flops of the present invention.

The proposed PFD was implemented in a 1-10 GHz PLL with the charge-based CP and a ring-based VCO. This PLL was fabricated in an all-digital TSMC 40 nm process with a variable supply voltage of 0.5-1.2V. FIG. 18 shows the layout and die micrograph of the PFD, CP, and LF portion of the PLL; the PFD, which consists of two DFFs in its entirety, has a total active area of 16 μm². The PLL with the PFD was physically tested; the silicon measurements of the PFD are shown in Table 2.

TABLE 2

|  | Present Invention | Ref. 6 | Ref. 7 | Ref. 8 | Ref. 9 | Ref. 10 |
| --- | --- | --- | --- | --- | --- | --- |
| Supply (V) | 0.5-1.2 | 1.5 | 1.2 | 5.0 | 1.8 | 1.2 |
| Freq. Range (MHz) | 10-5000 | 10-100 | 50-3000 | 400-1200 | 200-1500 | 1-2000 |
| PFD Power (W) | 618.5 n | 1.0 m | 496μ | — | 1.4 m | 37.0μ |
| Dead Zone (ps) | 0.0 | 0.0 | 61.0 | 15.0 | — | — |
| PFD Area (μm²) | 16 | 300 | — | — | — | — |
| Technology (m) | 40 n | 0.24μ | 0.13μ | 0.8μ | 0.25μ | 0.13μ | where,

Ref. 6: H. Rategh and T. Lee, Multi-GHz frequency synthesis & division: frequency synthesizer design for 5 GHz wireless LAN systems. Springer, 2001;

Ref. 7: W. Chen, M. Inerowicz, and B. Jung, "Phase frequency detector with minimal blind zone for fast frequency acquisition," IEEE Transactions on Circuits and Systems II: Express Briefs, vol. 57, pp. 936-940, December 2010;

Ref. 8: W. Lee, J. Cho, and S. Lee. "A high speed and low power phase-frequency detector and charge-pump," ASP-DAC'99, Proceedings of the Asia and South Pacific Design Automation Conference, pp. 269-272, 1999;

Ref. 9: M. Mansuri, D. Liu, and C. Yang, "Fast frequency acquisition phase-frequency detectors for GSa/s phase-locked loops," ESSCIRC '01, Proceedings of the 27th European Solid-State Circuits Conference, pp. 333-336, 2001; and Ref. 10: J. Lan, F. Lai, Z. Gao, H. Ma, and J. Zhang, "A nonlinear phase frequency detector for fast-lock phase-locked loops," ASICON '09, IEEE 8th International Conference on ASIC, pp. 1117-1120, 2009.

Notably, the PFD consumes 618.5 nW with a 1.0V supply and a reference frequency of 100 MHz, where the VCO frequency was 5 GHz and a N=50 divider was used to produce the feedback frequency. Furthermore, due to the PFD-CP combination, there is Ops dead zone, a low 0.1-0.3° phase error, and 0.80±0.05 ps jitter for the entire operating range of the PLL.

FIG. 10 displays an example of the phase noise and spectrum characteristics with reference spurs <−70 dBc for this PLL.

Table 3 provides a snapshot of the PLL performance in which the proposed PFD was utilized; these results are compared to other PLLs which use DFF-based PFDs in their architecture.

TABLE 3

|  | Present Invention | Ref. 6 | Ref. 11 | Ref. 12 |
| --- | --- | --- | --- | --- |
| Supply (V) | 0.5-1.2 | 1.5 | 1.0 | 1.8 |
| $f_{VCO}$ (GHz) | 1.0-10.0 | 4.8-5 | 2.9-9.8 | 5.27-5.6 |
| $f_{REF}$ (MHz) | 50-400 | 11 | 29-980 | 10 |
| PLL Power (W) | 1.20 m | 21.6 m | 96.0 m | 19.8 m |
| PLL Area (mm²) | 0.0040 | 1.45 | 0.056 | 1.610 |
| RMS jitter (ps) | 0.80 ± 0.05 | — | 0.81 | — |
| Ref. Spurs (dBc) | <−70 | <−70 | −54.8 | <−70 |
| Phase Error (°) | 0.1-0.3 | — | — | — |
| Technology (m) | 40 n | 0.24μ | 90 n | 0.18μ | where:

Ref 11: A. Loke, R. Barnes, T. Wee, M. Oshima, C. Moore, R. Kennedy, and M. Gilsdorf, "A versatile 90-nm CMOS charge-pump PLL for SerDes transmitter clocking," IEEE Journal Solid-State Circuits, vol. 41, pp. 1894-1907, August 2006; and Ref: 12: W. Chiu, Y. Huang, and T. Lin, "A dynamic phase error compensation technique for fast-locking phase-locked loops," IEEE Journal Solid-State Circuits, vol. 45, pp. 1137-1149, July 2010.

This work has introduced a low power, fast, and compact dual reset D flip-flop based phase-frequency detector design for use in multi-GHz PLLs. The no-added delay PFD design is composed of complex-complementary logic DFFs which were optimized for use with a discrete charge-transferring charge pump by matching the Reset-to-Q Q propagation delay to the charge pump's switching time directly, resulting in zero dead zone between these two blocks. The desirable outcome of using this PFD-CP combination in a PLL is an overall decreased PLL control loop delay and an advantageous reduction in the phase noise and jitter in the PLL, providing a fast, accurate phase lock. Furthermore, the PFD is scalable to and between sub-μm process nodes and is able to be utilized at low supply voltages well below 1V.

Proposed Voltage Controlled Oscillator Designed with Charge Coupling:

A preferred embodiment of the present invention provides a novel tunable wide-operating range capacitively phase-coupled low noise, low power ring-based voltage controlled oscillator for use in multi-GHz phase-locked loops. The basic building blocks of the ring oscillator (RO) design are discussed along with a technique to expand the VCO to a variety of phases and frequencies without the use of physical inductors. Improved performance with minimal phase noise are achieved in this ring VCO design through distributed passive-element injection locking (IL) of the staged phases via a network of symmetrically placed metal interconnect capacitors. Using this method, a 0.8-to-28.2 GHz quadrature ring VCO was designed, fabricated, and physically tested with a PLL containing the charge pump and phase-frequency detector, in an all-digital 40 nm TSMC CMOS process.

State-of-the-Art Ring VCOs:

Ring oscillators based on digital logic building blocks are a popular choice for multiprotocol phase-locked loops operating in the 0.5-12 GHz range due to their minimal area, wide-tuning range, low power consumption, scalability to and between sub-μm technologies, and general lack of required analog process extensions. Compared to tuned, high-Q LC oscillators which target specific higher frequencies at the expense of an increased power and area trade-off, ROs have inferior phase noise performance which restricts their use to only non-critical applications. Specifically, the "resonator" Q of a ring oscillator is low because the energy stored in every cycle at each output node capacitance is immediately discarded, then restored at the worst possible time at the resonator edges instead of at the ideal peak voltage as in an LC oscillator. In general, from a broad perspective, this lack of energy efficiency accounts for the well-known overall poor phase noise performance exhibited by state-of-the-art ROs.

Other factors which affect phase noise in both single-ended and differential ring oscillators such as flicker (i.e. 1/f), shot, thermal, and white noise have been extensively studied over the last 20 years as stated in the references 1). A. Hajimiri, et al., "Jitter and phase noise in ring oscillators," IEEE J. Solid State Circuits, vol. 34; 2). A. Abidi et al., "Phase noise in inverter-based & differential CMOS ring oscillators," IEEE CICC'05, 2005, pp. 457-460; and 3). A. Homayoun and B. Razavi, "Relation between delay line phase noise and ring oscillator phase noise," IEEE J. Solid State Circuits, vol. 49, pp. 384-391, February 2014. As IC technology scales to deep sub-μm, numerous works have been dedicated to applying these principles and developing circuitry to improve the performance of ROs in PLLs which operate in the multi-GHz range. The importance of doing so lies in the inherent non-feasibility of fabricating LC oscillators at smaller feature sizes due to large area and cost as well as the lack of necessary analog extensions being readily available for ultra-deep sub-μm CMOS processes.

Among the various practices utilized to lower the phase noise of a ring oscillator operating in a phase-locked loop, two techniques which have been proven successful at smaller feature sizes stand out: 1) using additional injection locking circuitry and 2) exploiting creative, yet strict symmetry in the ring design and physical layout. For instance, in the reference, J. Chien, et al., "A pulse-position-modulation phase-noise-reduction technique for a 2-to-16 GHz injection-locked ring oscillator in 20 nm CMOS," ISSCC Dig. Tech. Papers, pp. 52-53, February 2014, it uses precisely timed IL which yields extremely low phase noise results at frequencies up to 16 GHz while the another reference, M. Chen et al., "A calibration-free 800 MHz fractional-N digital PLL with embedded TDC," ISSCC Dig. Tech. Papers, pp. 472-473, February 2010, presents a unique symmetrical differential RO which can loosely be classified as IL though the use of passive resistors. In the reference, W. Deng et al., "A 0.0066 mm 2 780 μW fully synthesizable PLL with a current-output DAC and an interpolative phase-coupled oscillator using edge-injection technique," ISSCC Dig. Tech. Papers, pp. 266-267, February 2014, IL techniques are applied to an innovative, highly symmetric ring oscillator structure composed of 3 single-ended logic-based rings. In these examples, IL techniques require extra circuitry which may increase the power and/or area. Additionally, symmetry may require extra design time and area.

Figure 19:
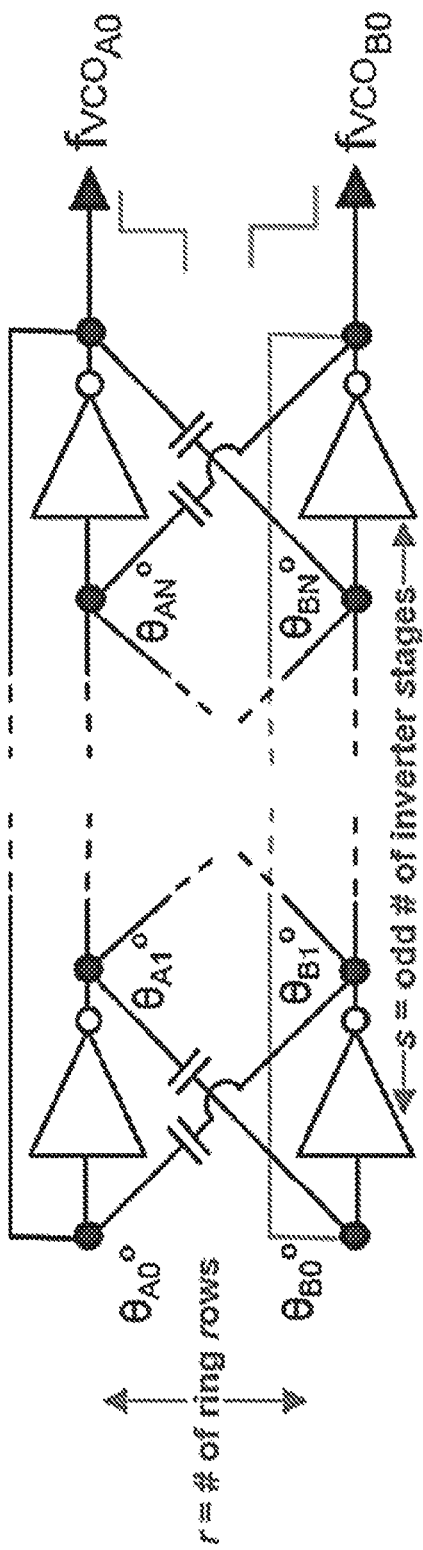
FIG. 19 shows a block diagram of a capacitively phase-coupled ring voltage controlled oscillator of the present invention.

Proposed Expandable, Capacitively Charge-Coupled Ring VCO for PLLs:

The present invention uses phase injection locking via a network of symmetrically placed passive metal interconnect coupling capacitors to reduce the phase noise of an inverter-based ring VCO as shown in FIG. 19. The result of the proposed RO design is a more energy efficient circuit which evenly distributes charge between the various nodes during oscillation. Furthermore, the fundamental basic building blocks of the proposed ring oscillator are discussed in order to provide a straightforward methodology for expanding the design to work for multiple phases and a variety of frequencies in the 0.5-to-30 GHz operating range. Using the aforementioned procedure, a 0.8-to-28.2 GHz quadrature ring VCO was designed, fabricated, and physically tested with a PLL in an all-digital 40 nm TSMC CMOS process.

The ring VCO discussed here is designed using a current-starved inverter-based ring oscillator structure. One advantage of using this type of RO is its simplicity. More importantly, rings of this nature can be built using basic circuit elements readily available in any given IC process. In fact, multiple-staged inverter-based ring oscillators are used extensively on practically all silicon dies for process monitoring. However, traditional ROs suffer from two major disadvantages which have limited their usefulness in PLL designs: 1) poor jitter (noise) characteristics and 2) lack of spectral purity (distortion).

Here a design approach is presented which takes two or more identical inverter-based staged-ROs and uses phase injection-locking via capacitive coupling to provide a VCO with improved phase noise performance and spectral purity properties superior to state-of-the-art RO designs, making the proposed ring VCO design more comparable to those of LC-based ones. Additionally, the application of the proposed ring VCO offers many other desirable properties beyond low noise attributes including: ability to have precise quadrature with many additional phase outputs available, wide range tunability, inductor-like spectral purity quality and stability without using inductors, full scalability to and between ultra-deep sub-μm IC process nodes, compact physical size with minimal sized inverters, and the ability to work at supply voltages at 1V and below with extremely low power operation due to the capacitors not dumping their energy on a cycle by cycle basis as in a ring oscillator.

Figure 20:
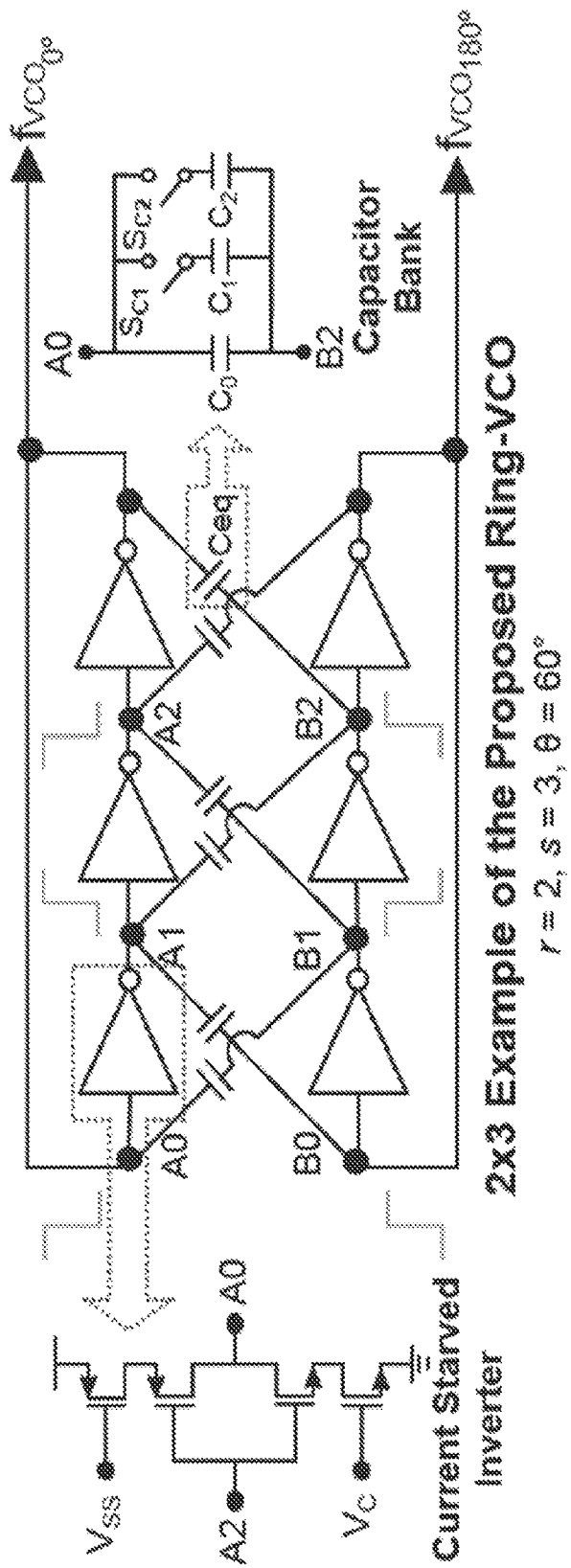
FIG. 20 shows a block diagram of a 2×3 ring voltage controlled oscillator of the present invention.

The building blocks of the proposed ring VCO, shown in FIG. 20 include: 1) current-starved inverters for control voltage, VC, tuning, 2) two or more rings, r, made up of a number of odd current-starved inverter stages, s, and 3) relatively small symmetrically laid-out interconnect capacitors, $C_0 = C_{eq}$, to couple the phases of the neighbouring input and output nodes of the rings, and optionally, 4) a logic-controlled bank of interconnect capacitors, $C_1$-$C_2$, for wider frequency range tuning using transmission gate switches.

Figure 33:
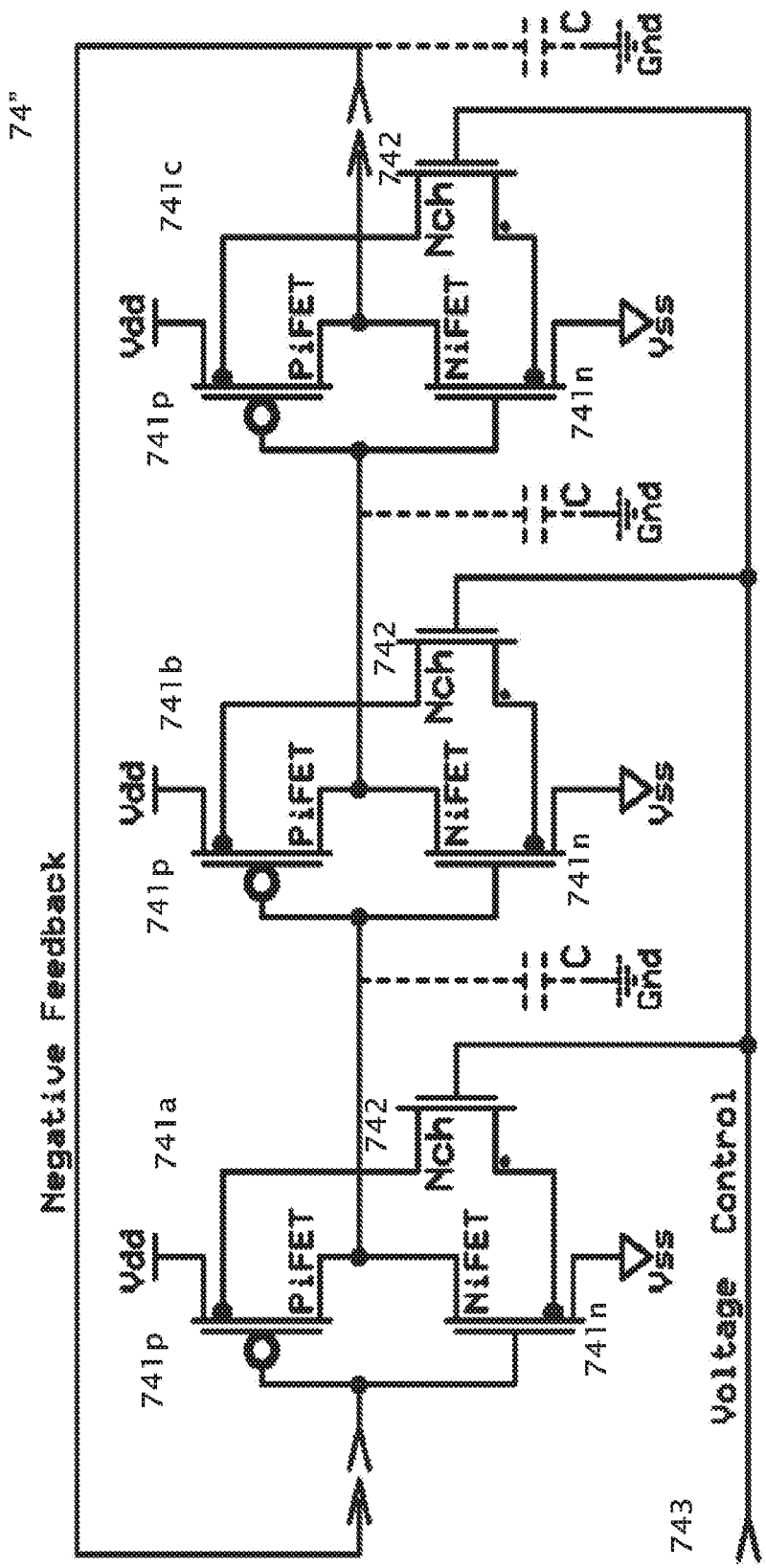
FIG. 33 shows a schematic of a constant amplitude complementary injection field effect transistor (CiFET) based voltage controlled oscillator of the present invention.

In a preferred embodiment of the present invention rail to rail complementary injection field effect transistor (CiFET) based bypass control voltage controlled oscillator 74" shown in FIG. 33 may be used instead of the building block shown in FIG. 20. The voltage controlled oscillator 74" includes three stages of CiFET amplifier pairs 741*a*, 741*b* and 741*c*. While the exemplary figure shows three stages, the number of stages can be any odd number. Each of the CiFET amplifier pairs 741*a*, 741*b* and 741*c* comprises P-type iFET 741*p* and N-type iFET 741*n*, and bypass transistor 742. The bypass transistors 742 provides the alternative path for the current that would otherwise go to the inveter's output terminal and charge the capacitance of the next input. Thus, the operating frequency is at the a maximum with no control voltage and slows down as a control voltage 743 is applied.

Figure 34:
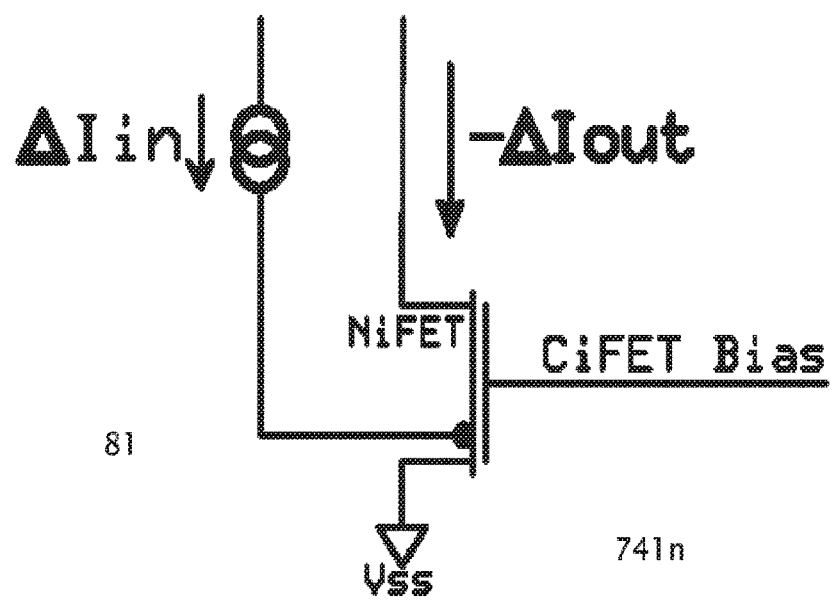
FIG. 34 shows a schematic of an injection field effect transistor of the present invention.

The N-type iFET 741*n* is a current inverter as shown in FIG. 34, which is the dual concept of a normal voltage-inverting FET. The total current through the iFET is fixed by the gate-to-source voltage and when a change in current at the mid-channel current port (or "iPort") 81 node is noted, the inverse of that current change can be seen at the iFET drain output making the iFET a current inverter. The iFET source channel current is fixed by Vqs and thus any current change is steered from the drain to the iPort 81. This type of charge-movement or current-based logic concept originated in bipolars as current-mode logic (CML) where the inputs and outputs are in voltage, but the computation takes place with fast current signal swings in a staged differential BJT circuit. The tradeoff with bipolar CML is that the power dissipation is great and it is only used when extremely fast digital logic is desired with little regard to a battery, and this CML requires a bipolar IC process.

Figure 35:
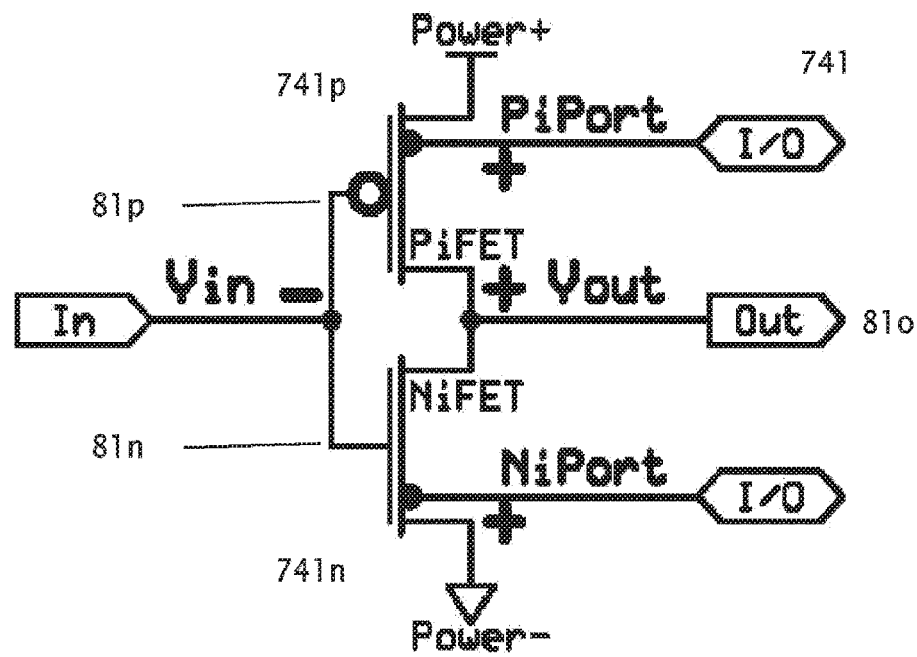
FIG. 35 shows a schematic of a CiFET.

Assembling an N-type 741*n* and P-type iFET 741*p* together yields the seminal CiFET cell 741 as shown in FIG. 35. Both the PiPort 81*p* and the NiPorts 81*n* effect a + change to the output voltage port 81*o* at the common drain connection.

Here though, in the CiFET, its power dissipation is minimal as the current changes involved are in the pico- to nano-Amp range depending on the sizing of the CiFET. On the other hand, the results are similar, as there is a way to build logic gates out of the CiFET based on current, resulting in ultra-fast logic which has essentially no voltage change at both the input and output logic interconnect wires, and the inputs are referenced at the iPort termination resistance instead of the logic voltage transmitter providing very high noise immunity. This makes the logic parasitic insensitive and noise immune yielding very low power and extremely high frequency operation. There are also methods of throttling the speed/power relationship, or turning the circuits off and back on again at logic speed. When a current is injected into the iPort, it substitutes for its portion of the existing source channel current. This is because this total source channel current is controlled by its voltage between the gate and source, which has not been caused to change by the iPort current injection. Thus the origin of source channel current is steered around the drain channel through the iPort.

This would result in an exact subtraction of iPort current from the output drain current as there is no other current path. This introduces an entirely new MOS device: the ultra-fast precision "current inverter." It is built out of digital parts and is process independent. More iPort current, yields less drain current, which is the output current. A current mirror operates the other way and is fragile. Also, the current can go in either direction passing through zero, truly bidirectional as compared to the base current of a bipolar.

The source channel is exceptionally low resistance because it has a high overdrive on the gate while the voltage gradient along this source channel is clamped to near zero by the self-cascode structure of the iFET. This is similar to operating this channel in weak inversion, thus the channel current is driven by carrier diffusion (exponential), and not a voltage gradient (square-law) along this source channel. We have named this channel condition "super-saturation." In contrast, weak inversion has few carriers which pass along the surface where they pick up noise from surface carrier traps. Because this source channel has an abundance of carriers and these carriers do not have to transit the channel length, the source channel operates faster than any other MOS channel known. The carriers only have to push on adjacent carriers (diffusion).

Since both the PiPort 81*p* and NiPort 81*n* are + current inputs, current can be removed from of one port and injected into the other port in effect bypassing the CiFET drain channel current which charges and discharges the delay, or frequency control capacitance of a ring oscillator 74 as shown in FIG. 33.

Figure 36:
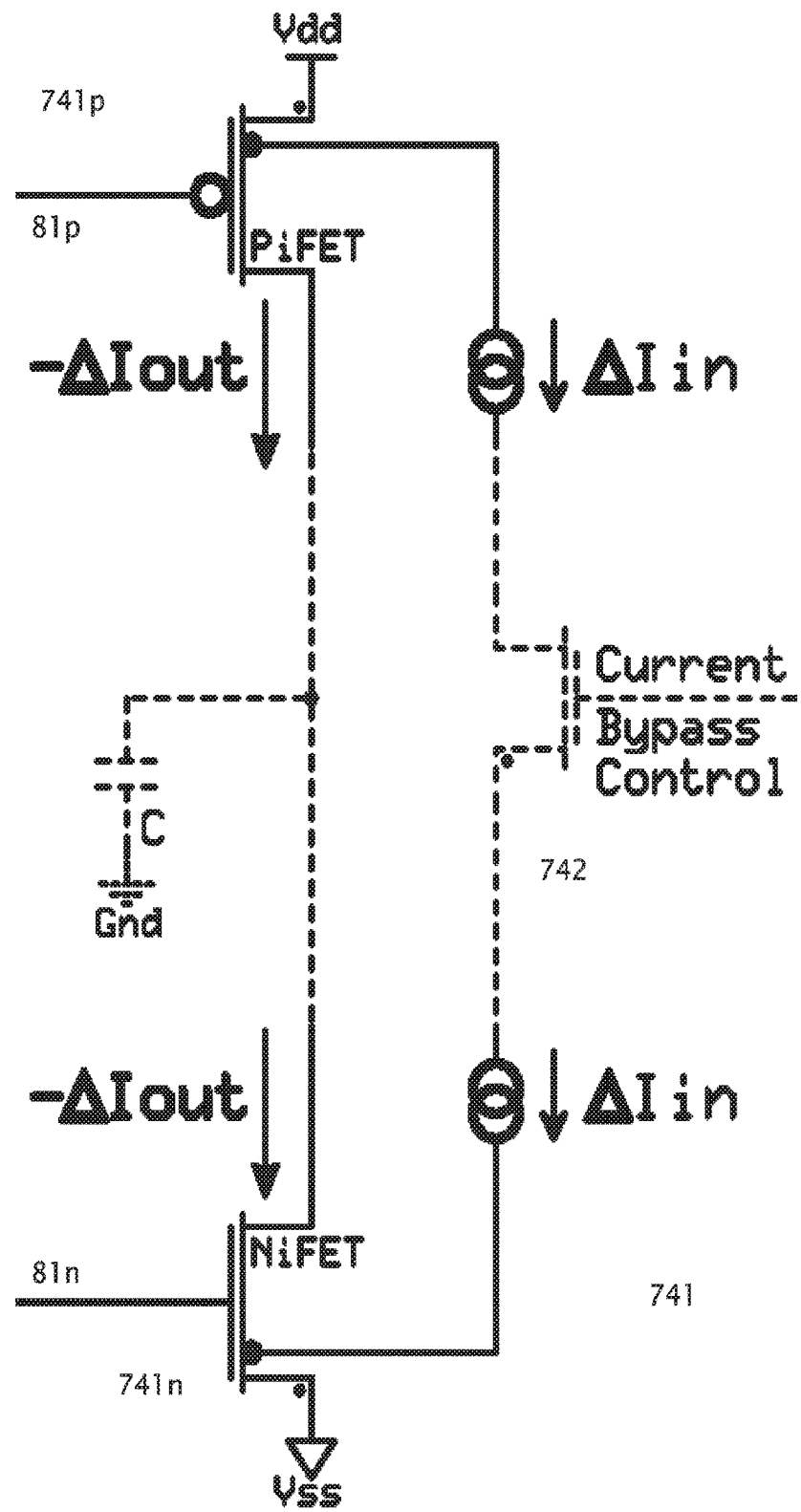
FIG. 36 shows a schematic of a CiFET amplifier pair.

FIG. 36 depicts the joining of an NiFET 741*n* and PiFET 741*p* forming a CiFET 741, but with the addition of a transistor 742 which bypasses current around the CiFET drain output. This additional MOSFET can be either N- or P-channel where its gate control voltage performs the inverted function of the other. This CiFET 741 of FIG. 36 illustrates the CiFET's operation in the VCO of FIG. 33.

This current bypass is controlled by the gate voltage on a MOSFET connecting the two iPorts 81*p* and 81*n*. A major advantage of this delay control is that all the timing nodes maintain a constant amplitude and in the injection-locked VCO the noise critical threshold remains at the zero crossover where the slope is at its maximum.

Figure 21:
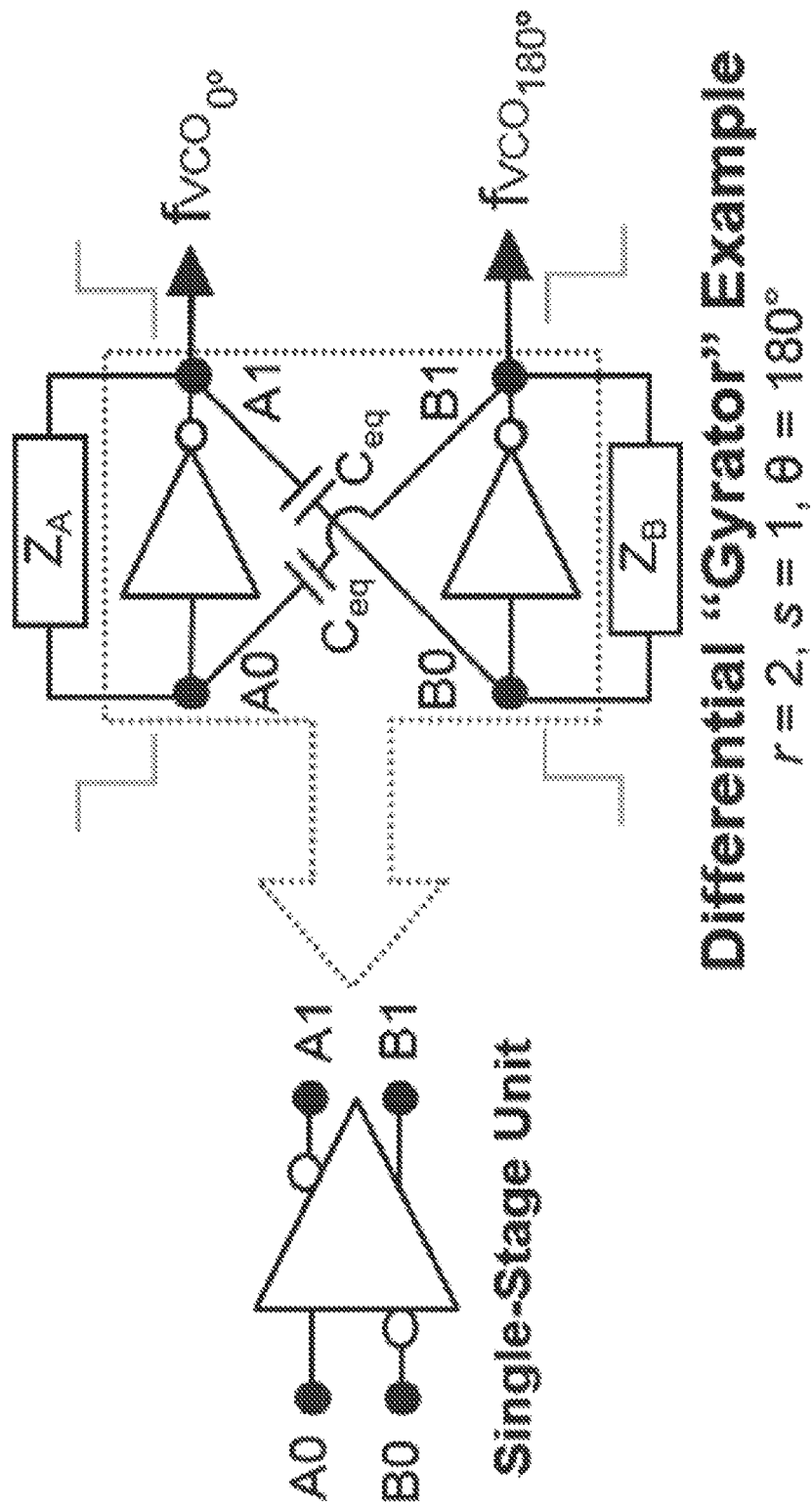
FIG. 21 shows a block diagram of a single stage unit of the voltage controlled oscillator r×s expansion and differential "gyrator" of the present invention.

The simplest unit form of the proposed ring VCO is the single-staged, double-ring differential oscillator FIG. 21. If the input is connected to the output of its respective ring with an appropriate impedance, Z, the 2×1 ring will possess a behavior likened to that of a gyrator in that the capacitive circuit acts inductively due to its structure. This is due to a capacitor in the loop creating a "gyrator" that can masquerade as an inductor which functions as a "dual" circuit element. These capacitors phase-couple the input and output nodes of the stages together forming a distributed spiral virtual inductor. This r=2, s=1 gyrator example is not to be confused with a simple latch where r=1, s=2. In the latter case, the inverters act in series and do not oscillate due to oscillation conditions not being satisfied. The differential gyrator must be strictly cross-coupled in the layout of the circuit and additionally, $Z_A$ and $Z_B$ must be set appropriately. As expected, from its simplicity, this is the highest frequency configuration.

Additionally, the requirements for oscillation can be expedited via sufficient delay through the layout wire parasitics, which are readily found on any chip due to imperfect isolation and slight process variation, and therefore should be used to an advantage in this circuit. Although exploratory examples of this gyrator point to very high frequencies being obtainable up to 75 GHz, the circuit suffers from poorer phase noise performance as compared to multiple stages of s=3 and higher. This is due to the noise being correlated to a minimum number of nodes. Increasing the number of nodes to 3 or 5 significantly improves the performance of the proposed ring VCO. Silicon measurements showing this can be found in the experimental results shown below.

The single-stage unit may be easily expanded to a more useful ring VCO which provides multiple phases. The output phases available for the rxs tuned ring VCO may be found at every θ:

$$\theta = \frac{360°}{\text{\# of phases available}} = \frac{360°}{r*s'} \quad [\text{EQ. 17}]$$

where s is an odd, positive integer representing the number of inverter stages in a single ring; r is a positive integer greater than 1 representing the number of rows. For the ring VCO in FIG. 20, there are s=3 ring inverter stages and r=2 rows connected by neighboring node capacitances. θ for this example is then calculated to be 60°; therefore, there are 6 output phases available at 0°, 60°, 120°, 180°, 240°, and 300° in this ring.

The frequency of a general rxs ring VCO is governed by the propagation delay of the s current starved inverters in a single ring. The finely-tuned VCO output frequency, $f_{VCO}$, is controlled by means of $V_C$, by starving current through either (or both) the top pMOS or bottom nMOS transistors shown FIG. 20; in this work, the bottom nMOS transistors were used as the inverters' current control. The inverters symmetrically self-bias around their midpoint. Additionally, four is also affected by the intentional loading by the tuning capacitor(s) and any switch and wiring path resistance at each node; for instance, increasing the capacitance and/or resistance lowers $f_{OUT}$.

The general output frequency of an rxs VCO may be found by the following equation:

$$f_{VCO} = \frac{1}{\tau_{total}} = \frac{1}{\tau_{ring} + \tau_{interconnect}} = \frac{1}{(2s\tau_{pd}) + (2(r-2)R_{eq}C_{eq})'} \quad [\text{EQ. 18}]$$

where $\tau_{pd}$ is the propagation delay of a single current-starved inverter in the ring; $C_{eq}$ is the parallel combination of the coupling capacitors $C_{0-2}$ that are in-use; and $R_{eq}$ is the equivalent parallel resistance of the wired path and any switch resistance connected to the coupling capacitors in use. Parasitic capacitances, $C_0$, should be factored into this equation for accuracy. This basic rxs ring VCO structure is reconfigurable to allow for a variety of phases (e.g. by adjusting r and s) and frequencies (e.g. by varying the VC for fine tuning and $C_{eq}$ for course), an example of this will be presented in the next section for the quadrature configuration.

Figure 22:
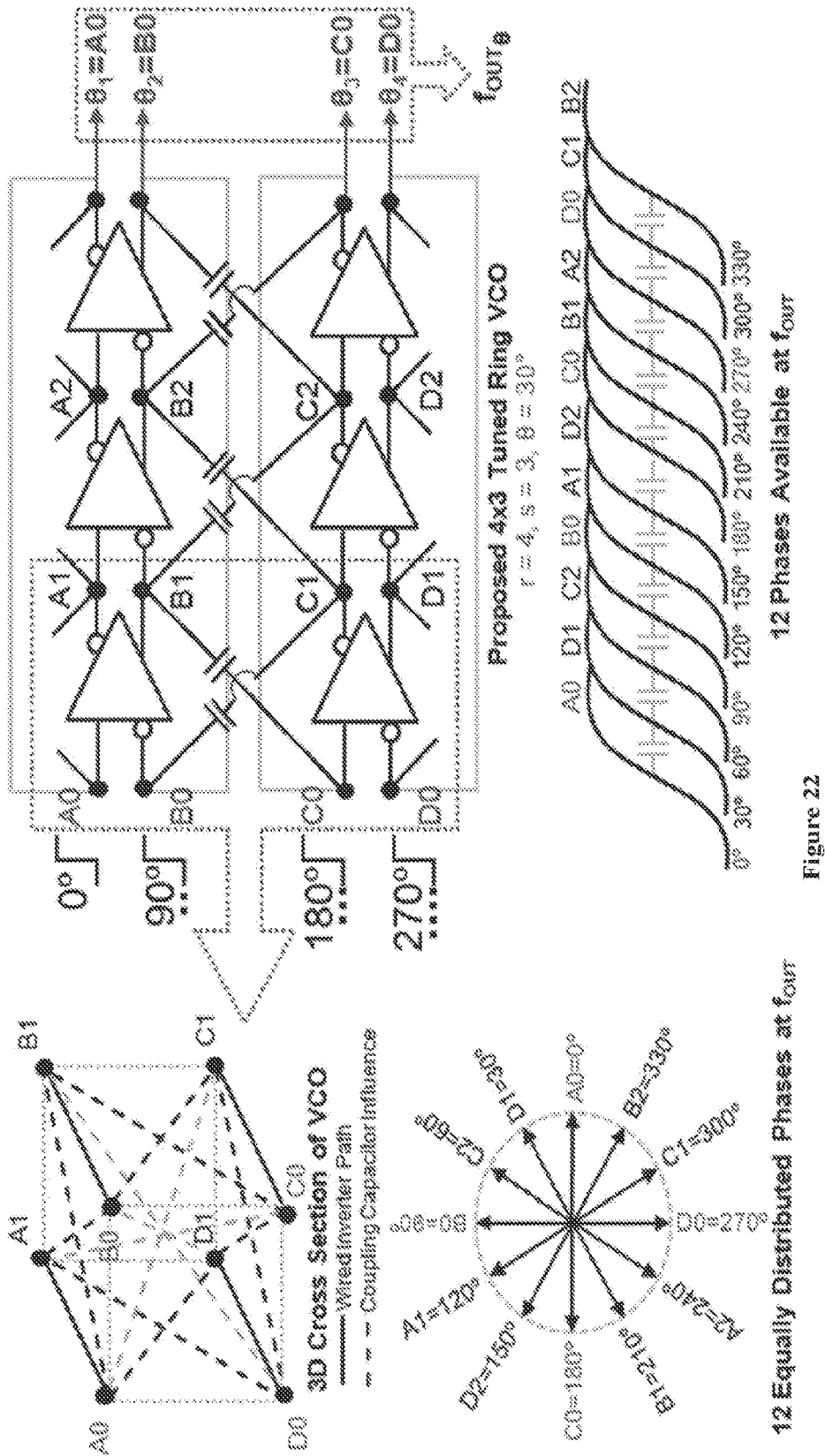
FIG. 22 shows an example of 4×3 quadrature ring voltage controlled oscillator in accordance with the present invention.
Figure 23:
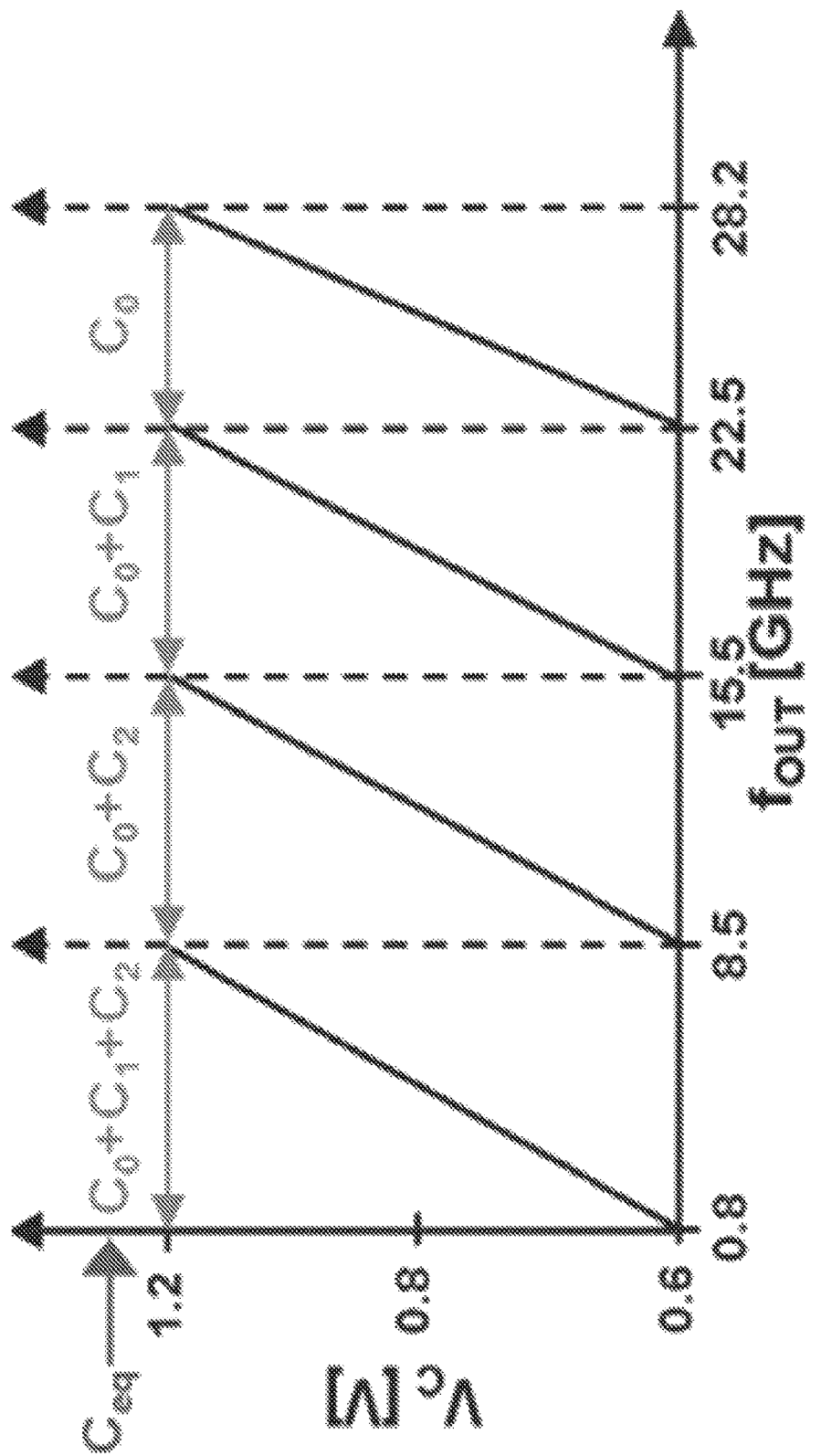
FIG. 23 shows a graph of $V_C$ versus the voltage controlled oscillator output frequency for the $C_{eq}$ tuning bank.

The proposed tuned ring 4×3 VCO in FIG. 22 is one such expansion of the rxs ring oscillator. In this case, 4 of the 12 phases have been used to produce the quadrature outputs for the PLL. The 3D section of the ring in the upper left of FIG. 22 provides a picture of how charge is differentially cross-coupled within the ring through relatively small yet symmetrically laid-out, spirally-linked neighboring interconnect capacitances at every node. The charge coupling path creates a continuous, virtual inductor, adding to the resonance purity of the ring VCO. A capacitor in a feedback path of the oscillator acts much like an inductor allowing the VCO to operate in a linear (i.e. high-quality sine-wave) mode, similar to an LC oscillator as opposed to a RO which operates in a switching mode. As a result of this virtual inductor in the feedback path, spectral purity (odd harmonics) is comparable to that of LC based oscillators, but this ring oscillator is scalable to deep sub-μm processes and has the added feature of a wide frequency tuning range. This provides low distortion which can be seen in the experimental results section. All of the inverters are operating in concert to produce a single sine wave cycle in precisely equal incremental phase steps. The distributed pseudo-inductor causes the energy lost during a cycle to be restored at the phase angle that adds minimal noise (i.e. jitter), which is the exact opposite of a conventional ring oscillator where energy is added at the most jitter sensitive phase angle. Lastly, the wide operating range of the ring VCO of the present invention is due to the digital logic-controlled bank composed of 3 symmetrically laid-out interconnect coupling capacitors, allowing for coarse tuning over 4 overlapping frequency ranges shown in FIG. 23. It is also found that the VCO of the present invention is capable of outputting a sine wave signal comprising a fundamental and harmonics that are separated by at least 50-70 dB.

Figure 24:
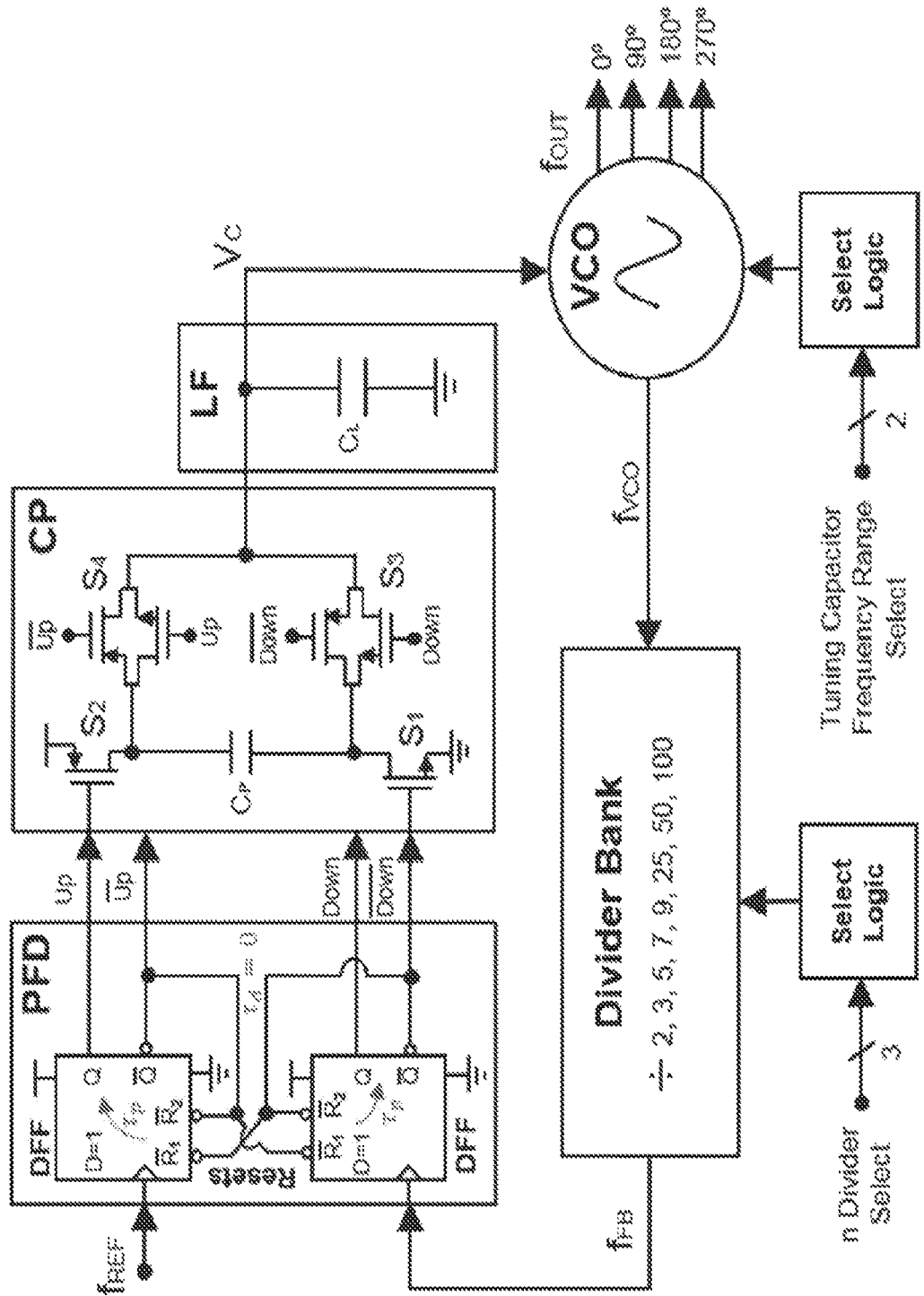
FIG. 24 shows a block diagram of a phase locked loop of the present invention.
Figure 25A:
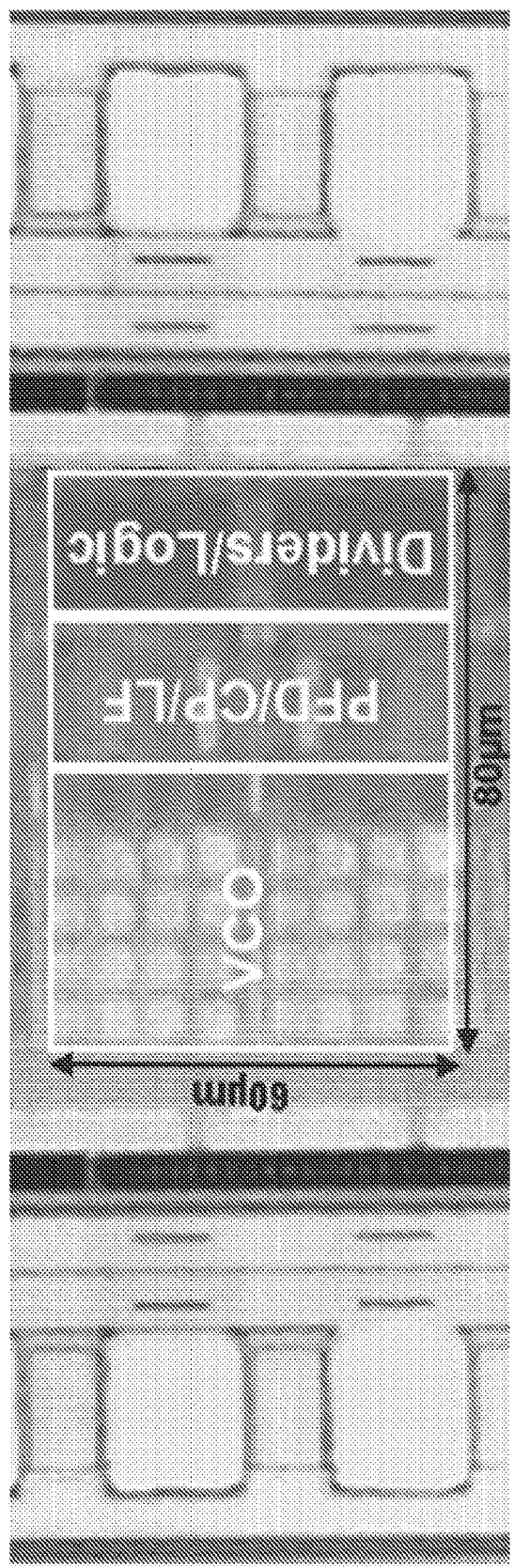
FIG. 25a shows a die micrograph of the 4×3 voltage controlled oscillator in a PLL of the present invention.
Figure 25B:
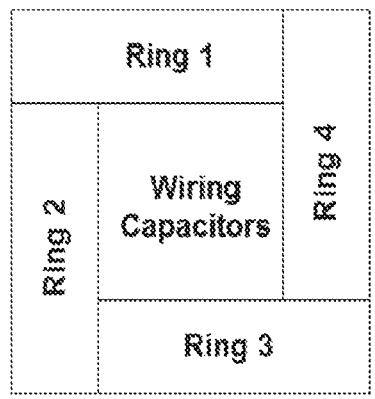
FIG. 25b shows a layout plan example of symmetric 4×3 voltage controlled oscillator.
Figure 26:
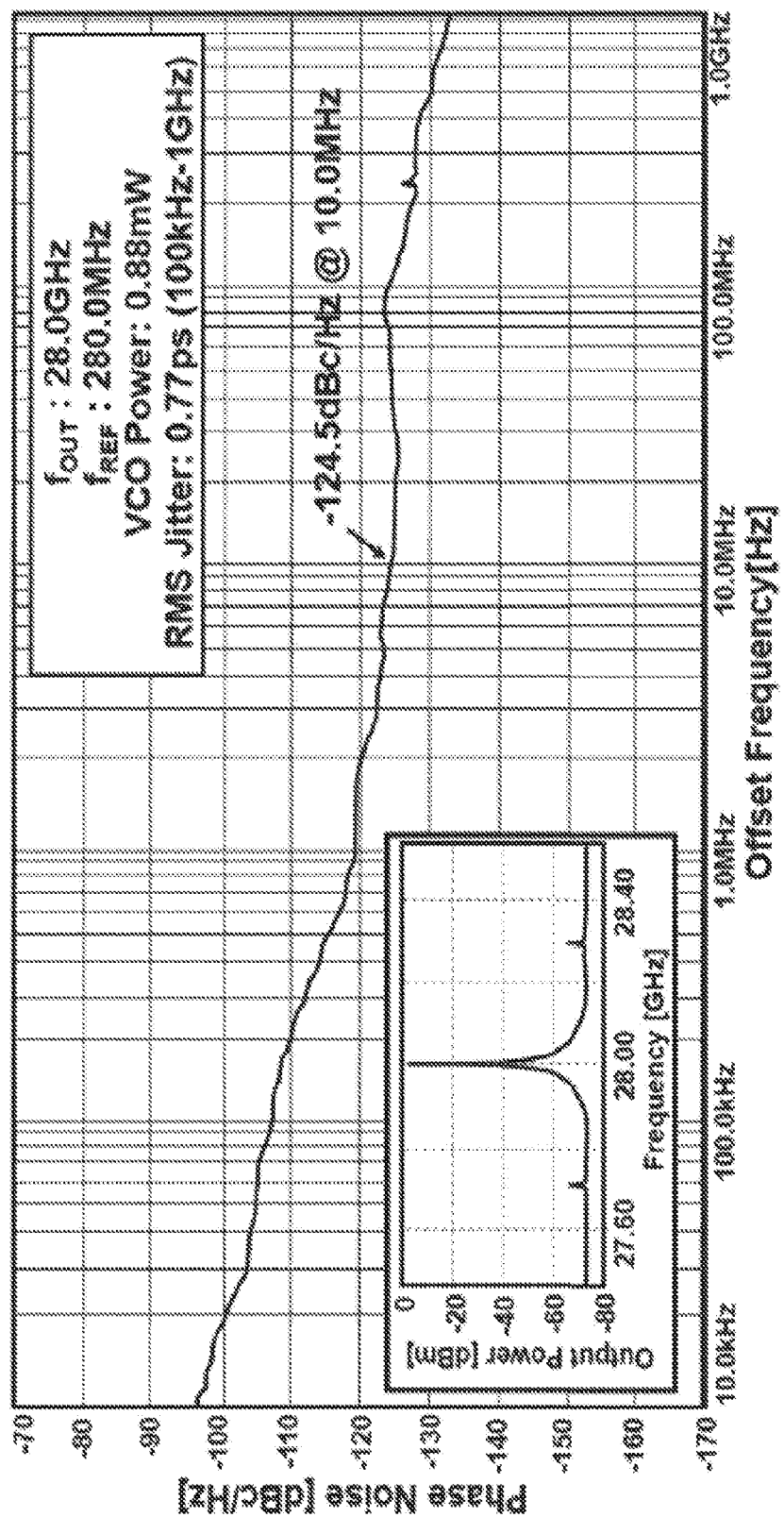
FIG. 26 shows a graph of measured phase noise and output spectrum at 28.0 GHz.

Experimental Results for the Proposed VCO in a PLL with the CP and PFD:

Hereinafter provides overviews of the silicon measurements of a variety of rxs expansions of the proposed ring VCO structure shown in Table 4 and the proposed quadrature 4×3 ring VCO implemented inside a charge pump PLL of the present invention, all of which were fabricated in a 40 nm all-digital CMOS process and tested. The block diagram of the PLL which the VCO—along with the CP and PFD from earlier in this chapter—were places is shown in FIG. 24. A die micrograph of the proposed 4×3 quadrature VCO in the PLL is shown in FIG. 25a. FIG. 25b shows a layout plan example for symmetric 4×3 VCO. It is found that layout symmetry of devices and interconnect in VCO is of utmost importance to ensure constant capacitive charge balance and low noise operation. As it is shown in FIGS. 25a and 25b, to maintain symmetry of devices, wirings and capacitors are strategically placed in the center, and ring oscillators are placed therearound. The phase noise and output spectrum are shown in FIG. 26. Table 5 compares the proposed 4×3 ring VCO results to state-of-the-art examples, while Table 6 compares similar PLLs to the one used for this work as is shown in FIG. 24 which uses the CP from PFD described above.

This work has introduced an expandable structure for a tunable wide-operating range capacitively phase-coupled low noise, low power ring-based VCO for use in multi-GHz PLLs. Using this technique, a quadrature ring-based VCO was implemented in an all-digital 40 nm TSMC CMOS process. Most notably, the proposed 4×3 ring VCO occupies an area of 0.0024 mm², consumes a power of 0.77 mW at a 1.0V supply voltage, and possesses a phase noise of −124.5 dBc/Hz at the 10 MHz offset for a carrier frequency of 28.0 GHz. Furthermore, the present invention has the widest reported operating frequency range of any published VCO from 0.8-to-28.2 GHz. The VCO FOM is also the best reported for ring-based VCOs and is comparable to that of LC oscillators due to the passively-phase coupled IL symmetric ring topology and inherent low power operation.

TABLE 4

| s | r | Inv. Size | $C_{eq}$ [fF] | θ [°] | Phases (rxs) | $f_{MAX}$ [GHz] | Power [mW] | Area [mm$^2$] | Phase Noise [dBc/Hz] |
|---|---|---|---|---|---|---|---|---|---|
| 1 | 2 | 4x | 5.0 | 180 | 2 | 75.6 | 0.55 | 0.0020 | −102.0 |
| 3 | 2 | 4x | 1.0 | 120 | 6 | 27.5 | 0.52 | 0.0015 | −115.3 |
| 3 | 3 | 4x | 2.5 | 40 | 9 | 25.4 | 0.69 | 0.0021 | −120.3 |
| 3 | 4 | 8x | 1.0 | 30 | 12 | 28.2 | 0.88 | 0.0024 | −124.5 |
| 5 | 2 | 4x | 2.5 | 36 | 10 | 13.3 | 0.95 | 0.0050 | −122.8 |
| 5 | 4 | 8x | 1.0 | 18 | 20 | 16.5 | 1.40 | 0.0065 | −121.2 |
| 7 | 2 | 4x | 2.5 | 25.7 | 14 | 10.1 | 1.34 | 0.0110 | −119.6 |
| 9 | 2 | 4x | 5.0 | 20 | 18 | 6.7 | 1.52 | 0.0150 | −114.9 |

TABLE 5

| | Present Invention | Ref. 13 | Ref. 14 | Ref. 15 | Ref. 16 | Ref. 17 | Ref. 18 | Ref. 19 | Ref. 20 |
|---|---|---|---|---|---|---|---|---|---|
| CMOS Technology | 40 nm | 130 nm | 45 nm SOI | 20 nm | 65 nm | 65 nm | 130 nm | 28 nm FDSOI | 90 nm |
| Implementation | Pass. IL-Ring | Ring VCO | Ring VCO | IL-Ring | Ring VCO | Ring VCO | Ring VCO | Ring VCO | LC-IL |
| Frequency Range [GHz] | 0.8-28.2 | 1.0-10.3 | 1.0-8.5 | 2.0-16.0 | 0.6-0.8 | 0.39-1.41 | 0.8-1.8 | 4.0-11.0 | 19.75-20.25 |
| Output Frequency [GHz] | 28.0 | 1.0-10.3 | 2.5 | 15.0 | 0.8 | 0.9 | 1.5 | 8.0 | 20.0 |
| Int. RMS Jitter [ps] | 0.77 | <3.0 | 0.99 | 0.268-0.434 | 21.5 | 1.7 | 0.4 | 0.558-0.642 | 0.085 |
| Phase Noise [dBc/Hz] | −124.5 | N/A | −114.9 | −136.6 | −124.0* | −124.0* | −145.0* | −116.6* | −150.0 |
| Supply Voltage [V] | 0.5-1.2 (1.0) | 1.8 | 1.8/2.5 | 1.1/1.25 | 1.1-1.3 | 0.8 | 1.1 | 1.0 | 1.5 |
| VCO Power (VCO) [mW] | 0.65-1.25 (0.88) | 8.0 | 2.0* | 5.0* | 0.51 | 0.4* | 0.4* | 1.63* | 70.0* |
| VCO Area [mm$^2$] | 0.0024 | 0.714 | 0.006* | 0.0025* | 0.027 | 0.003* | 0.01* | 0.0025* | 0.0325* |
| Figure of Merit[1] [dBc/Hz] | −194.0 | — | −178.9 | −193.1 | −185.0 | −187.1 | −192.5 | −192.5 | −197.5 | where:
Ref. 13: L. Cai and R. Harjani, "1-10 GHz inductorless receiver in 0.13 μm CMOS," IEEE. RFIC'09, 2009, pp. 61-64;
Ref. 14: D. Fischette, D. Michael, A. Loke, M. Oshima, B. Doyle, R. Bakalski, et al., "A 45 nm SOICMOS dual-PLL processor clock system for multi-protocol I/O," ISSCC Dig. Tech. Papers, pp. 246-247, February 2010;
Ref. 15: J. Chien, P. Upadhyaya, H. Jung, S. Chen, W. Fang, A. Niknejad, et al., "A pulse-position-modulation phase-noise-reduction technique for a 2-to-16 GHz injection-locked ring oscillator in 20 nm CMOS," ISSCC Dig. Tech. Papers, pp. 52-53, February 2014;
Ref. 16: M. Chen, D. Su, and S. Mehta, "A calibration-free 800 MHz fractional-N digital PLL with embedded TDC," ISSCC Dig. Tech. Papers, pp. 472-473, February 2010;
Ref. 17: W. Deng, D. Yang, T. Ueno, T. Siriburanon, et al., "A 0.0066 mm$^2$ 780 pW fully synthesizable PLL with a current-output DAC and an interpolative phase-coupled oscillator using edge-injection technique," ISSCC Dig. Tech. Papers, pp. 266-267, February 2014;
Ref. 18: A. Elshazly, R. Inti, B. Young, and P. K. Hanumolu, "A 1.5 GHz 890 μW digital MDLL with 400 fsrms integrated jitter, −55.6 dBc reference spur and 20 fs/mV supply-noise sensitivity using 1b TDC," ISSCC Dig. Tech. Papers, pp. 242-243, February 2012;
Ref. 19: M. Raj, S. Saeedi, and A. Emami, "22.3 A 4-to-11 GHz injection-locked quarter-rate clocking for an adaptive 153 fJ/b optical receiver in 28 nm FDSOI CMOS." ISSCC'15, Proceedings of the 2015 IEEE International Solid State Circuits Conference, February 2015; and
Ref. 20: J. Lee and H. Wang, "Study of subharmonically injection-locked PLLs," IEEE J. Solid-State Circuits, vol. 44, no. 5, pp. 1539-1553, May 2009.

TABLE 6

| | Present Invention | Ref. 14 | Ref. 21 | Ref. 16 | Ref. 17 | Ref. 22 | Ref. 15 |
|---|---|---|---|---|---|---|---|
| PLL Type | Pas. IL Analog | Analog | Analog | Digital | Digital | Hybrid | IL Digital |
| Frequency Range [GHz] | 0.8-28.2 | 1.0-8.5 | 0.5-2.5 | 0.6-0.8 | 0.39-1.41 | 1.4-3.2 | 2.0-16.0 |
| Reference Range [MHz] | 10-400 | 50-450 | 10-100 | 2-40 | 40-350 | 36-108 | — |
| Output Frequency [GHz] | 25.0 | 2.5 | 1.0 | 0.8 | 0.9 | 3.1 | 15.0 |
| Clock Reference [MHz] | 250 | 100 | 100 | 26 | 150 | 108 | — |
| RMS Jitter, $\sigma_1$ [ps] | 0.82 ± 0.0275 | 0.99 | 2.36 | 20-30 | 1.7* | 1.01* | 0.268 |
| Power Dissipated, P [mW] | 0.64-1.25 (1.08) | 70.0 | 25.0 | 2.66 | 0.78 | 27.5 | 46.2 |
| FOM [dB] | −241.4 | −221.6 | −218.6 | −209.7 | −236.5 | −225.5 | −234.8 |
| Supply Voltage [V] | 0.5-1.2 (1.0) | 2.5 | 1.8 | 1.2 | 0.8 | 1.2 | 1.25/1.1 |
| Area [mm$^2$] | 0.0048 | 0.277 | 0.15 | 0.027 | 0.0066 | 0.32 | 0.044 |
| Normalized Area | 1 | 57.7 | 31.2 | 5.6 | 1.3 | 66.7 | 9.17 |
| Technology | 40 nm CMOS | 45 nm SOI | 0.18 μm CMOS | 65 nm CMOS | 65 nm CMOS | 65 nm CMOS | 20 nm CMOS | where:

Ref. 21: M. Brownlee, P. Hanumolu, K. Mayaram, and U. Moon, "A 0.5 to 2.5 GHz PLL with fully differential supply-regulated tuning," IEEE J. Solid State Circuits, vol. 41, pp. 2720-2728, December 2006; and Ref. 22: A. Sai, Y. Kobayashi, S. Saigusa, O. Watanabe, et al., "A digitally stabilized type-III PLL using ring VCO with 1.01 ps rms integrated jitter in 65 nm CMOS," ISSCC Dig. Tech. Papers, pp. 248-250, February 2012.

The procedure for Complementary complex logic (or $C^2L$) is simple and straightforward. In this section, we will give an example of a logic function and demonstrate how to construct the resulting gate for compactness and speed for a desired path. Examples of a normal digital circuit construction and the proposed $C^2L$ optimization of the same function will be demonstrated here for a basic understanding. This method can be applied to any digital or analog-in-digital circuit from which a truth table may be constructed and a function found, such as the PFD DFFs, shown in the next section. It is most useful when there is some complexity in the function as opposed to very basic gates such as the inverter or 2-input AND.

Step 1:

Construct the truth table for the desired function like the example in Table 7.

TABLE 7

| | | Input | | | | |
|---|---|---|---|---|---|---|
| Location | | $2^3$ 8 | $2^2$ 4 | $2^1$ 2 | $2^0$ 1 | Output |
| # | Hex | D | C | B | A | Y |
| 0 | 0 | 0 | 0 | 0 | 0 | 1 |
| 1 | 1 | 0 | 0 | 0 | 1 | 0 |
| 2 | 2 | 0 | 0 | 1 | 0 | 1 |
| 3 | 3 | 0 | 0 | 1 | 1 | 0 |
| 4 | 4 | 0 | 1 | 0 | 0 | 1 |
| 5 | 5 | 0 | 1 | 0 | 1 | 1 |
| 6 | 6 | 0 | 1 | 1 | 0 | 1 |
| 7 | 7 | 0 | 1 | 1 | 1 | 1 |
| 8 | 8 | 1 | 0 | 0 | 0 | 1 |
| 9 | 9 | 1 | 0 | 0 | 1 | 1 |
| 10 | A | 1 | 0 | 1 | 0 | 0 |
| 11 | B | 1 | 0 | 1 | 1 | 0 |
| 12 | C | 1 | 1 | 0 | 0 | 1 |
| 13 | D | 1 | 1 | 0 | 1 | 1 |
| 14 | E | 1 | 1 | 1 | 0 | 0 |
| 15 | F | 1 | 1 | 1 | 1 | 1 |

Figure 27:
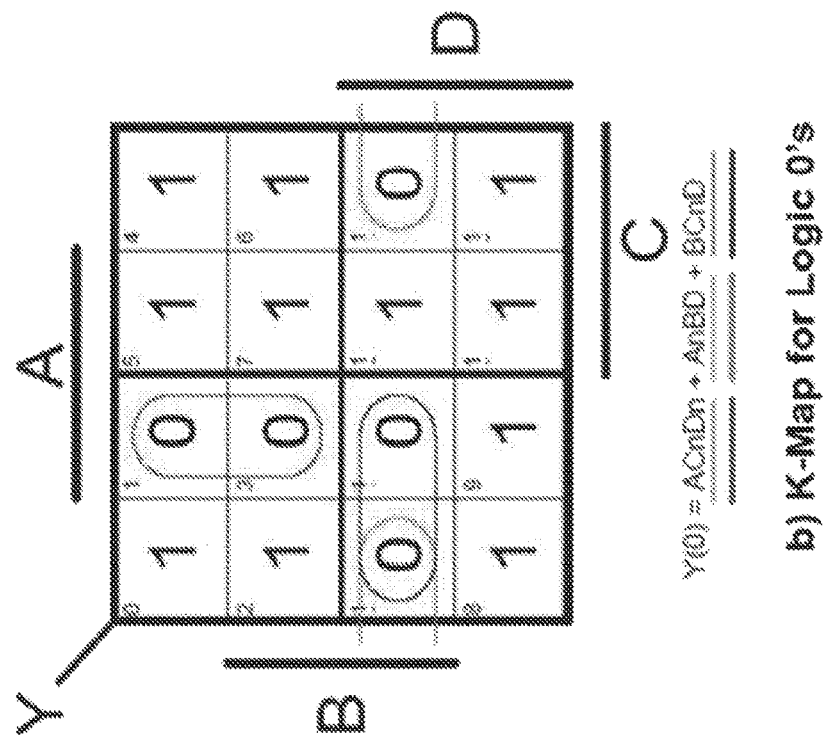
FIG. 27 shows K-Map for logic 1's and 0's.
Figure 27:
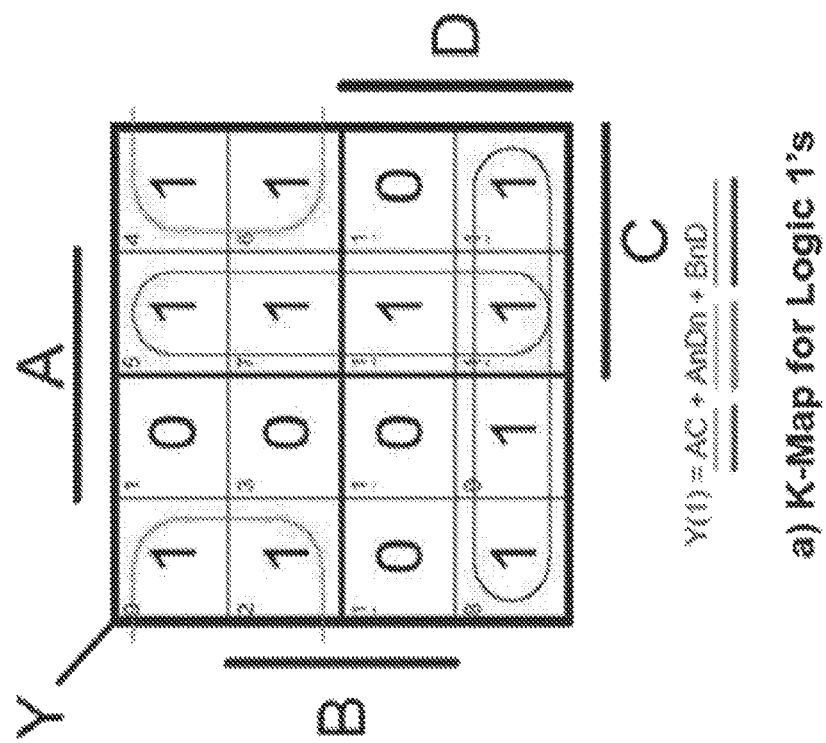

Step 2:

Construct the complementary Karnaugh Map (or K-Map) and resulting function equations for both the grouped Logic 1's and the Logic 0's as shown in FIG. 27 for the truth table in Table 7. Please note that the K-Map is a method to simplify Boolean algebraic expressions invented in 1953. The K-Map takes truth table results and places these on a 2-dimensional grid in order to identify and eliminate race conditions where the output is dependent on other events. From the K-Maps, the resulting function equations are found to be:

$$Y(1)=AC+\overline{AD}+\overline{BD} \qquad [EQ. 19]$$

$$Y(0)=A\overline{CD}+\overline{A}BD+B\overline{C}D \qquad [EQ. 20]$$

By constructing both of the complementary K-Maps and deriving the complement EQs. 19 and 20 from this, we ensure that there is no doubling up or cross-over and that the final Y signal is logically correct.

$$Y(0)=A\overline{CD}+\overline{A}BD+B\overline{C}D \rightarrow A\overline{CD}+BD(\overline{A}+C) \qquad [EQ. 21]$$

The $C^2L$ method does not use EQ. 21 and De-Morgan, nor does it group for minimum numbers of nMOS transistors. Instead $C^2L$ uses the opposite diffusion type of the P-channel transistors to perform the phase inversion which will be covered in the next step.

Step 3:

Construct the pull-down nMOS or "N" network using the ungrouped Logic 0's equation from EQ. 20 which results in Eq. (A.4).

$$Y(N)=A\overline{CD}+\overline{A}BD+B\overline{C}D \qquad [EQ. 22]$$

For the pull-up pMOS or "P" network we must first notice that the P-channel transistors use the opposite diffusion type as compared to the N-channel transistors in order to perform a phase inversion. This is invoked by simply using the opposite phase signals on the P-channel gate, thus all of the terms in EQ. 19 become inverted as shown in EQ. 23 for the pull-up network:

$$Y(P)=\overline{AC}+AD+B\overline{D} \qquad [EQ. 23]$$

It is now safe to wire-OR the P-channel pull-up to the N-channel pull-down "half" complex gates together from Y(P) and Y(N). This is how a CMOS inverter works.

Figure 28:
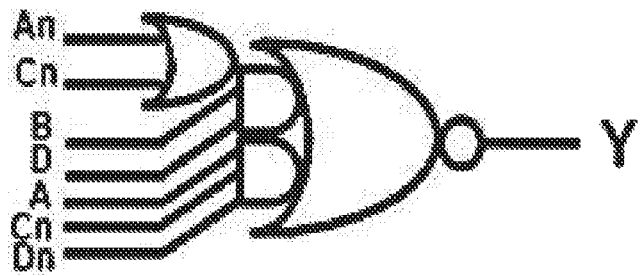
FIG. 28 shows examples of resulting gate constructions.
Figure 28:
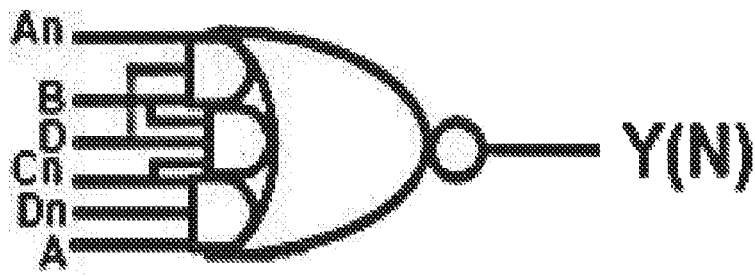
Figure 28:
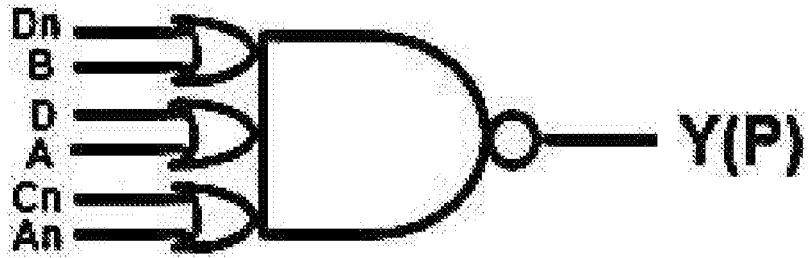
Figure 28:
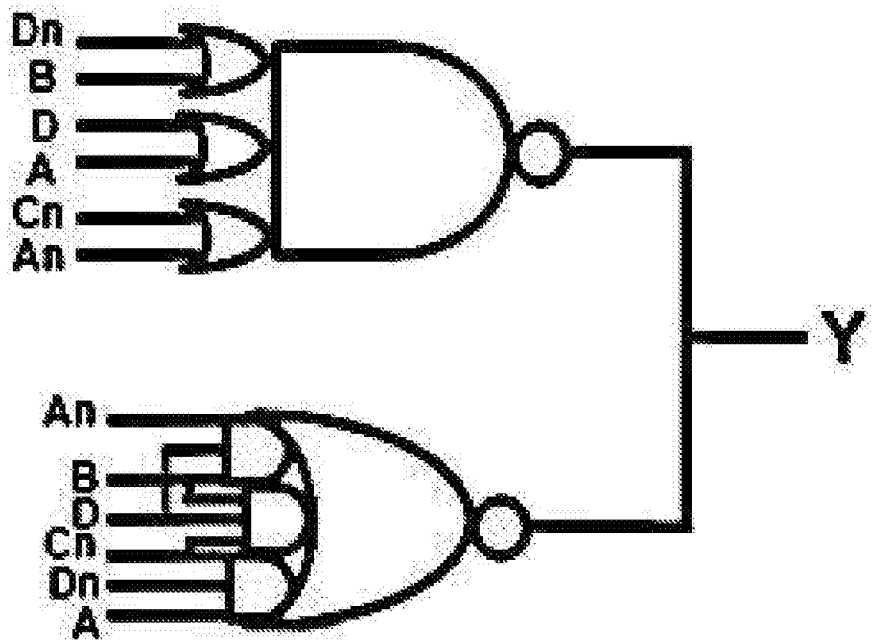

To finish, combine the resulting half logics for the pull-up and pull-down gates from FIGS. 28 b) and c) to form the $C^2L$ logic gate in FIG. 28 d).

Step 4:

From the logic gate in FIG. 28 d), which includes the pull-up and pull-down networks in FIGS. 28 b) and c), respectively, draw the corresponding schematics. This is shown in FIG. 29 b), whereas the traditional method is shown in FIG. 29 a), which is optimized form minimum nMOS transistors due to the original grouping in EQ. 21.

Figure 29:
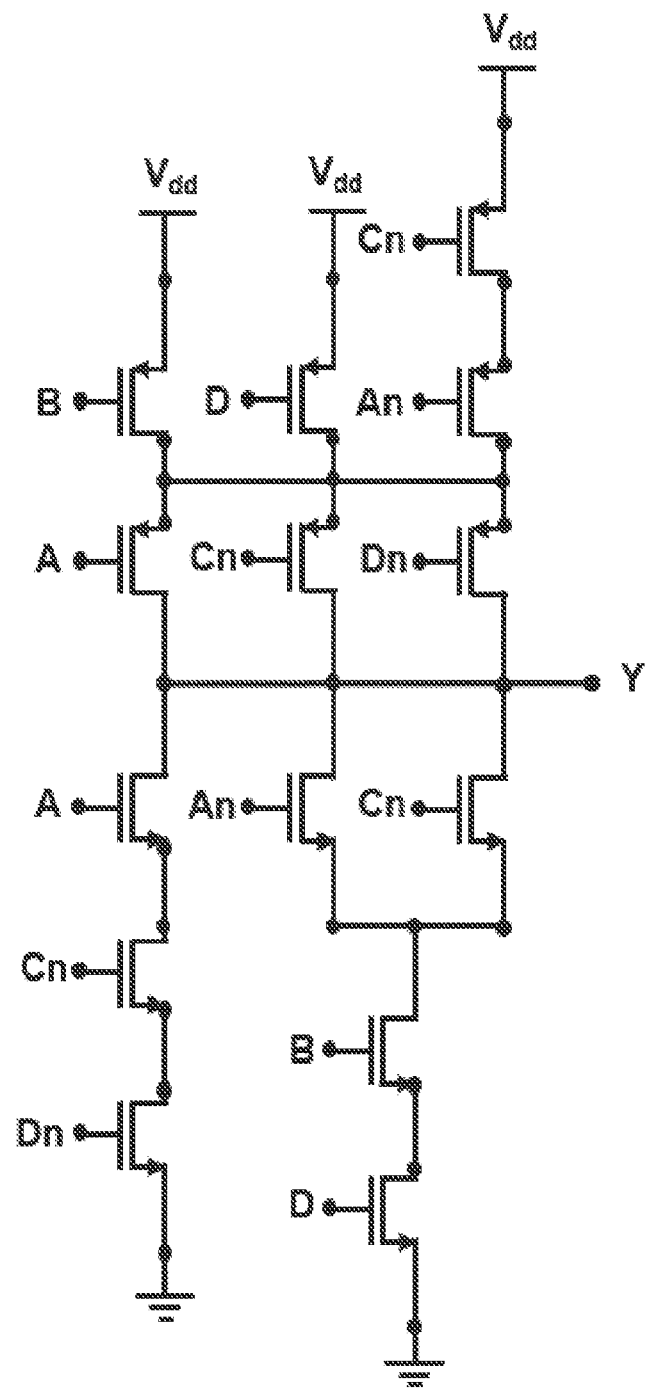
FIG. 29a shows a prior art schematic of logic construction.
FIG. 29b shows a schematic of logic constructions of the present invention.
Figure 29:
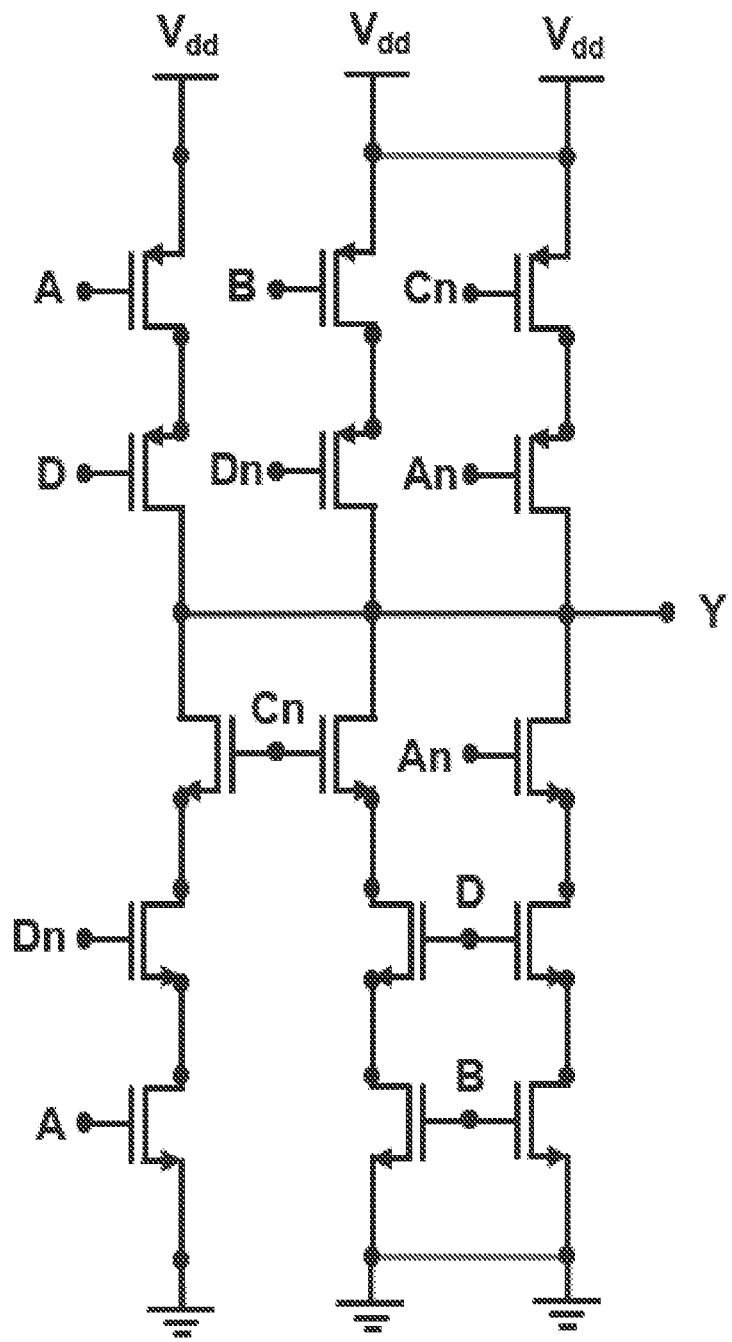
Figure 30:
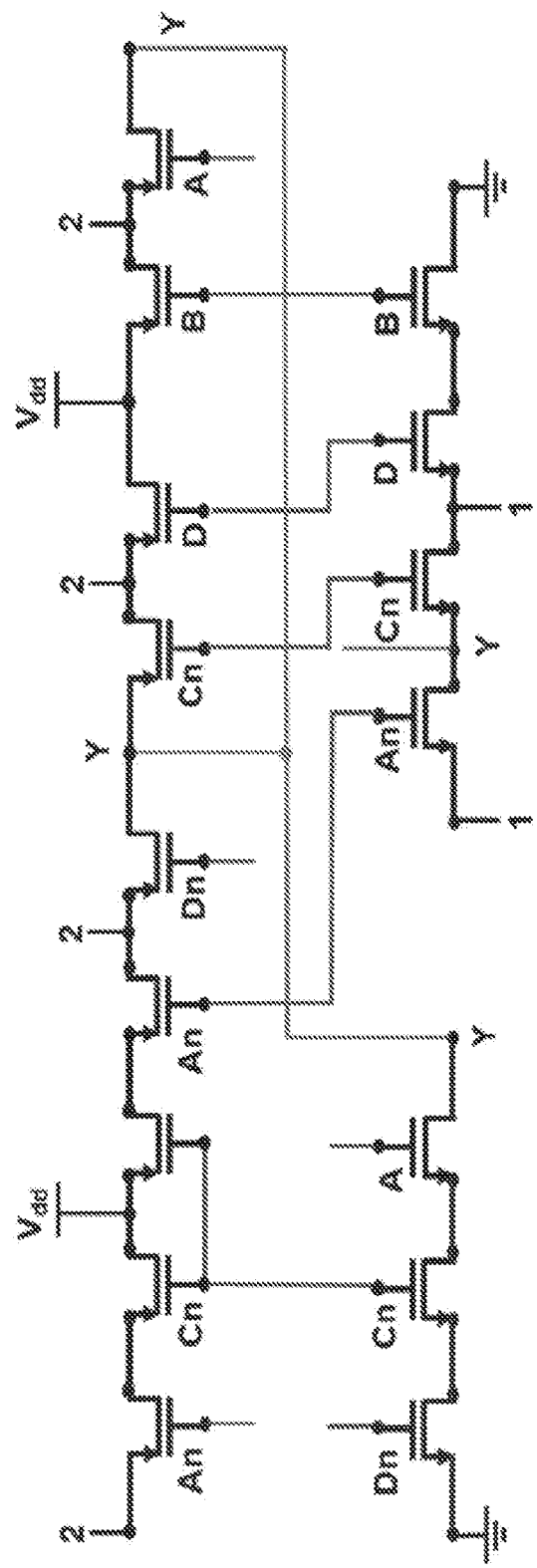
FIG. 30a shows a string diagram of the logic schematic of prior art.
FIG. 30b shows a string diagram of the logic schematic of the present invention
Figure 30:
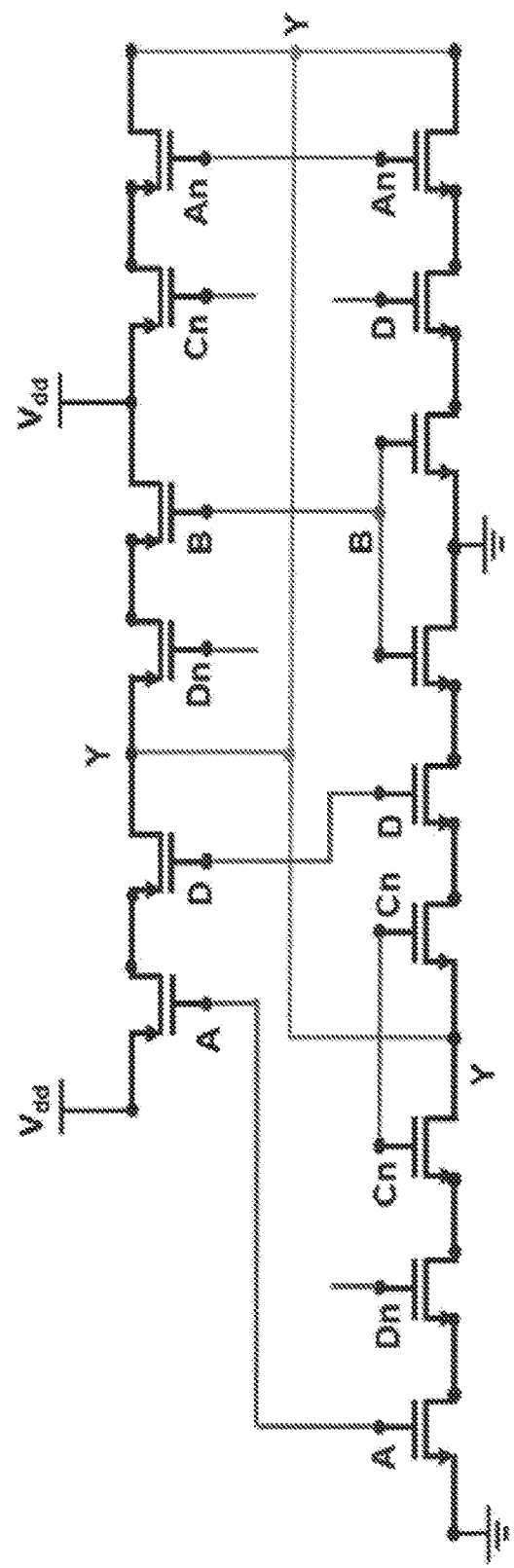

Step 5:

Draw the sideways "string" diagrams from the schematics in FIG. 29, which results in FIG. 30. When doing this for the $C^2L$, make sure have no places where there are breaks in the active area and move transistors around to do so. The idea is that EQs. 22 and 23 produce the right amount of transistors to make sure of this; this is because transistors take up much less space than a gap in active area in the layout, while also producing less parasitics than traditional methods due to more efficient interconnect within the cell.

Figure 31:
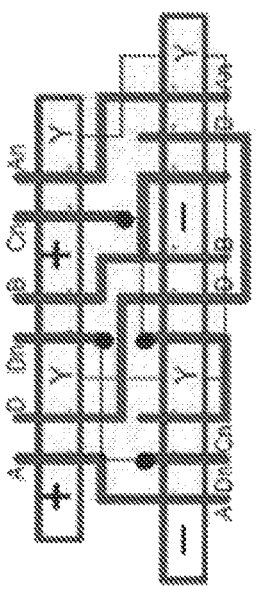
FIG. 31a shows a stick diagram of the logic schematic of prior art.
FIG. 31b shows a stick diagram of the logic schematic of the present invention.
Figure 31:
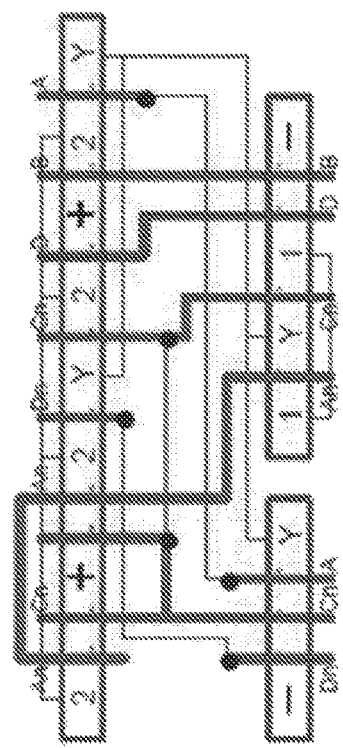

Step 6:

Draw the layout stick diagrams directly from the string diagrams in FIG. 30 which results in FIG. 31.

Figure 32:
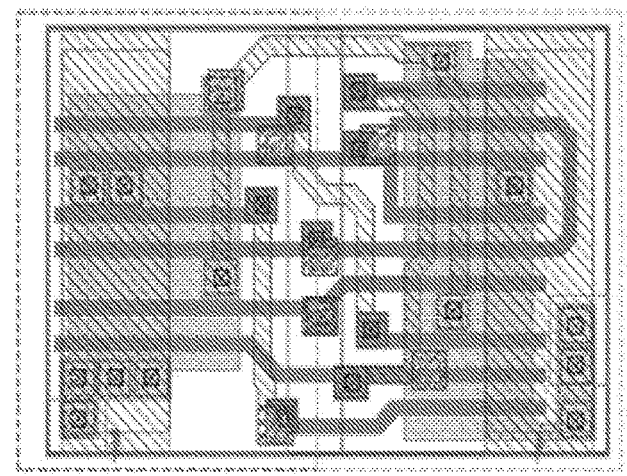
FIG. 32a shows a layout from the stick diagram of prior art.
FIG. 32b shows a layout from the stick diagram of the present invention.
Figure 32:
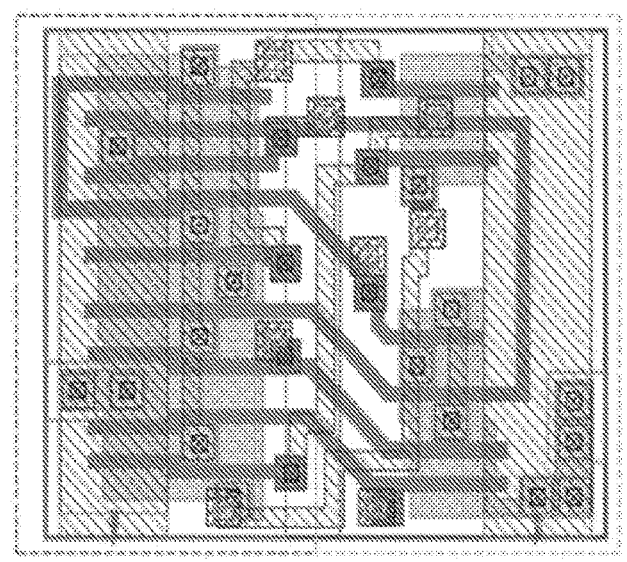

Step 7:

From the layout stick diagrams in FIG. 31, create the layout as shown in FIG. 32 making sure to account for the ~2.5 times in n-channel mobility, $\mu_n$, as compared to the p-channel, $\mu_p$. Please note that making the pMOS 2 to 2.5 (or even 3) times the size of the nMOS is generally sufficient based on the IC process due to the differences in electron and hole mobility for the process being used. (this can be determined by equating rise fall times in an inverter via sizing as covered by most digital CMOS design text books). If the path is extremely critical, a designer may increase the size of the pMOS (and the nMOS) in that path, but it is advisable to do this after a schematic simulation to ensure that the increased speed results are worth the tradeoff in area, as the $C^2L$ method is used to maximize for speed and area together at their peak. Note the difference in area between the traditional minimum nMOS transistor layout FIG. 32 a) as compared to the $C^2L$ method which has more small nMOS transistors and less of the bulky pMOS transistors FIG. 32 b). Also note the active areas in the nMOS region where there is a split in due to the split in active area in FIG. 32 a), whereas the C²L method does not have this break.

The normalized results from the C²L method in this specific example is a reduction of area and power by 25% and an increased speed of 1.5 times that of the traditional method which is due to the reduction of the parasitic capacitances (e.g. less charging and discharging required). This is a direct optimization of the power-delay product (PDP) and energy-delay product (EDP), where the PDP is a measure of energy per cycle or operation, whereas the EDP is a quality metric of the gate, relationships through the reduction of parasitics:

$$PDP = P_{avg}t_p = \frac{(Q_{total})V_{dd}}{2} = \frac{(C_{total}V_{dd})V_{dd}}{2} = \frac{(C_{parasitics} + C_{out})V_{dd}^2}{2}, \quad [\text{EQ. 24}]$$

$$EDP = E_{total}t_p = \frac{Q_{total}V_{dd}t_p}{2} = \frac{(C_{total})V_{dd}^2 t_p}{2} = \frac{(C_{parasitics} + C_{out})V_{dd}^2 t_p}{2}, \quad [\text{EQ. 25}]$$

where $P_{avg}$ is the average dynamic power dissipation, $E_{total}$ is the energy per operation, $Q_{total}$ is the charge which shifts (either charging or discharging) in a single operation, $C_{total}$ is the total of the parasitic and output capacitances of the next gate, $t_p$ is the average of the low-to-high and high-to-low propagation delays of the circuit given by:

$$t_p = \left(\frac{t_{PH-L} + t_{PL-H}}{2}\right). \quad [\text{EQ. 26}]$$

The high-to-low propagation delay may be found by:

$$t_{PH-L} = \left(\frac{Q_{total}}{2I_{avg_{H-L}}}\right) = \left(\frac{C_{total}V_{dd}}{2I_{avg_{H-L}}}\right), \quad [\text{EQ. 27}]$$

with:

$$I_{avg_{H-L}} = \frac{1}{2}(I_{D_{sat}} + I_{D_{lin}}), \quad [\text{EQ. 28}]$$

where the drain current in the saturation and linear regions may be calculated by:
Saturation:
Quadradic when $V_{GS} > V_{th_n}$ and $V_{DS} \geq V_{eff}$, $$I_{D_{sat}} = \frac{1}{2}\mu_n \frac{W}{L} C_{ox}(V_{eff})^2[1 + \lambda(V_{DS} - V_{eff})] \approx \frac{1}{2}\mu_n \frac{W}{L} V_{eff} \times [Q_D],$$

(for finFETs like that in FIG. 2.5b, let W=$W_{eff}$=$n_{fingers}$[$W_{fin}$+ 2(h)])
[EQ. 29];
and:

Triode/Ohmic: Linear when $V_{GS} > V_{th_n}$ and $V_{DS} < V_{eff}$, [EQ. 30]

$$I_{D_{lin}} = \mu_n \frac{W}{L} C_{ox}\left[(V_{eff})V_{DS} - \frac{V_{DS}^2}{2}\right] \approx \mu_n \frac{W}{L} V_{DS} \times \left[Q_D - \frac{Q_L}{2}\right],$$

for the nMOS transistor. EQ. 29 and EQ. 30 are general equations for the nMOS. The pMOS equations are exactly the same, but with the pMOS model values substituted with reversed polarities. These equations also assume that the bulk is separately tied to the source of each nMOS and pMOS device, not accounting for back-biasing bulk effects. finFETS can be related to the basic nMOS and pMOS equations by recognizing the finFET's actual Weff in EQ. 29. Notably, the finFET has 3 charge conduction channels long the 2 sides of height and single width of the fin. For EQ. 29, the channel length modulations, λ, may be ignored for simplicity.

For the average current from low-to-high this same equation in EQ. 28 may be calculated for the pMOS then EQ. 27 calculated for the same transition. Matching the low-to-high and high-to-low delays is of utmost importance and is easily done with the C²L method through normal sizing of transistors based on mobility (from Step 7).

Finally, the C²L method may be applied to any digital or AiD circuit for which a designer can make a truth table. It can also be applied to the phase-frequency detector DFFs in the next section for which a fast Reset-to-Q path must be established.

The invention claimed is:

1. A phase locked loop comprising:
 a. a phase frequency detector for detecting differences in phase and frequency between reference signal and feedback signal, and for outputting error signals for causing a charge pump to be in one of idle mode, pump up mode and pump down mode;
 b. said charge pump comprising
  i. a charge pump capacitor, and
  ii. a plurality of switches operable in response to said error signals from said phase frequency detector for causing said charge pump capacitor to be charged from a supply voltage during said idle mode, to discharge from said charge pump capacitor to raise output voltage of said charge pump during said pump up mode, and discharging from said charge pump capacitor to lower output voltage of said charge pump during said pump down mode; and
 c. a tunable inductor free voltage controlled oscillator, receiving said output voltage from said charge pump as control voltage for increasing or decreasing frequency of said feedback signal of said voltage controlled oscillator,
wherein said voltage controlled oscillator comprises:
 odd number stages of two or more rings, each of said rings comprising a current starved inverter having input terminal and output terminal,
 wherein each stage of said odd number stages comprising first and second capacitors, said first capacitor is capacitively coupling said input terminal of said current starved inverter of a first one of said two or more rings with said output terminal of said current starved inverter of a subsequent one of said two or more rings, and
 said second capacitor is capacitively coupling said output terminal of said current starved inverter of said first one of said two or more rings with said input terminal of said current starved inverter of said subsequent one of said two or more rings.

2. The phase locked loop according to claim 1, wherein said voltage controlled oscillator comprises a phase-injection-locked voltage controlled oscillator.

3. The phase locked loop according to claim 1, wherein said feedback signal is a sine wave signal.

4. The phase locked loop according to claim 1, wherein the layout of said voltage controlled oscillator is symmetric by placing said first and second capacitors in the center of said layout, and placing said odd number of two or more rings symmetrically around the center.

5. The phase locked loop according to claim 1, wherein the phase frequency detector comprises:
   a first and second D-flip flops, each comprising input terminal, first and second reset terminals, and first and second output terminals, wherein said first DFF receives said reference signal and said second DFF receives said feedback signal;
   wherein said first reset terminal of said first DDF and said second reset terminal of said second DFF are in communication with said second output terminal of said second DFF, and
   said second reset terminal of said first DFF and said first reset terminal of said second DFF are in communication with said second output of said first DFF;
   said second output terminal of said first DFF is invert of said first output terminal of said first DFF; and
   said second output terminal of said second DFF is invert of said first output terminal of said second DFF.

6. The phase locked loop according to claim 1 further comprises a loop filter between said charge pump and voltage controlled oscillator.

7. A phase locked loop comprising:
   a. a phase frequency detector for detecting differences in phase and frequency between reference signal and feedback signal, and for outputting error signals for causing a charge pump to be in one of idle mode, pump up mode and pump down mode;
   b. said charge pump comprising
      i. a charge pump capacitor, and
      ii. a plurality of switches operable in response to said error signals from said phase frequency detector for causing said charge pump capacitor to be charged from a supply voltage during said idle mode, to discharge from said charge pump capacitor to raise output voltage of said charge pump during said pump up mode, and discharging from said charge pump capacitor to lower output voltage of said charge pump during said pump down mode; and
   c. a tunable inductor free voltage controlled oscillator, receiving said output voltage from said charge pump as control voltage for increasing or decreasing frequency of said feedback signal of said voltage controlled oscillator;
   wherein the phase frequency detector comprises:
      a first and second D-flip flops, each comprising input terminal, first and second reset terminals, and first and second output terminals,
      wherein said first DFF receives said reference signal and said second DFF receives said feedback signal,
      wherein said first reset terminal of said first DDF and said second reset terminal of said second DFF are in communication with said second output terminal of said second DFF,
      said second reset terminal of said first DFF and said first reset terminal of said second DFF are in communication with said second output of said first DFF,
      said second output terminal of said first DFF is invert of said first output terminal of said first DFF, and
      said second output terminal of said second DFF is invert of said first output terminal of said second DFF.

8. The phase locked loop according to claim 7, wherein said voltage controlled oscillator comprises a phase-injection-locked voltage controlled oscillator.

9. The phase locked loop according to claim 7, wherein said feedback signal is a sine wave signal.

10. The phase locked loop according to claim 7, wherein said voltage controlled oscillator comprises:
    odd number stages of two or more rings, each of said rings comprising a current starved inverter having input terminal and output terminal,
    wherein each stage of said odd number stages comprising first and second capacitors, said first capacitor is capacitively coupling said input terminal of said current starved inverter of a first one of said two or more rings with said output terminal of said current starved inverter of a subsequent one of said two or more rings, and
    said second capacitor is capacitively coupling said output terminal of said current starved inverter of said first one of said two or more rings with said input terminal of said current starved inverter of said subsequent one of said two or more rings.

11. The phase locked loop according to claim 7, wherein the layout of said voltage controlled oscillator is symmetric by placing said first and second capacitors in the center of said layout, and placing said odd number of two or more rings symmetrically around the center.

12. The phase locked loop according to claim 7 further comprises a loop filter between said charge pump and voltage controlled oscillator.

* * * * *